United States Patent
Yoshitomi et al.

[11] Patent Number: 5,903,027
[45] Date of Patent: May 11, 1999

[54] MOSFET WITH SOLID PHASE DIFFUSION SOURCE

[75] Inventors: Takashi Yoshitomi, Yokohama; Masanobu Saito, Chiba; Hisayo Momose, Tokyo-to; Hiroshi Iwai, Kawasaki; Yukihiro Ushiku, Yokohama; Mizuki Ono, Yokohama; Yasushi Akasaka, Yokohama; Hideaki Nii, Yokohama; Satoshi Matsuda, Yokohama; Yasuhiro Katsumata, Chigasaki; Tatsuya Ooguro, Yokohama, all of Japan; Claudio Fiegna, Bologna, Italy

[73] Assignee: Kabushiki Kaisha Toshiba, Kawasaki, Japan

[*] Notice: This patent is subject to a terminal disclaimer.

[21] Appl. No.: 08/910,222

[22] Filed: Aug. 13, 1997

Related U.S. Application Data

[60] Division of application No. 08/353,240, Dec. 2, 1994, Pat. No. 5,698,881, which is a continuation-in-part of application No. 08/068,529, May 28, 1993, Pat. No. 5,434,440.

[30] Foreign Application Priority Data

| May 29, 1992 | [JP] | Japan | 4-139335 |
| Dec. 11, 1992 | [JP] | Japan | 4-352324 |
| Mar. 25, 1994 | [JP] | Japan | 6-56115 |
| Nov. 25, 1994 | [JP] | Japan | 6-291757 |

[51] Int. Cl.$^6$ .................................................. H01L 29/76
[52] U.S. Cl. ........................................ 257/327; 257/336
[58] Field of Search ....................... 257/327, 335, 257/336, 337, 344, 346; 438/558, 230

[56] References Cited

U.S. PATENT DOCUMENTS

| 4,356,623 | 11/1982 | Hunter | 257/344 |
| 4,992,388 | 2/1991 | Pfiester | 257/327 |
| 5,061,649 | 10/1991 | Takenouchi et al. | 257/408 |
| 5,283,449 | 2/1994 | Ooka | 257/200 |
| 5,434,440 | 7/1995 | Yoshitomi et al. | 257/344 |

FOREIGN PATENT DOCUMENTS

| 60-134469 | 7/1985 | Japan . |
| 61-43477 | 3/1986 | Japan . |
| 61-154172 | 7/1986 | Japan . |
| 61-156858 | 7/1986 | Japan . |

*Primary Examiner*—Donald L. Monin, Jr.
*Assistant Examiner*—Nathan K. Kelley
*Attorney, Agent, or Firm*—Foley & Lardner

[57] ABSTRACT

A MOS type semiconductor device has a gate whose length is 170 nm (0.17 $\mu$m) or less, a junction depth of source and drain diffusion layers in the vicinity of a channel is 22 nm or less, and a concentration of impurities at the surface in the source and drain diffusion layers is made to $10^{20}$cm$^{-3}$ or more. Such structure is obtained using solid phase diffusion using heat range from 950° C. to 1050° C. and/or narrowing gate width by ashing or etching. The other MOS type semiconductor device is characterized in that the relationship between the junction depth $x_j$ [nm] in the source and drain diffusion layer regions and the effective channel length $L_{eff}$ [nm] is determined by $L_{eff} > 0.69$ $x_j - 6.17$.

9 Claims, 48 Drawing Sheets

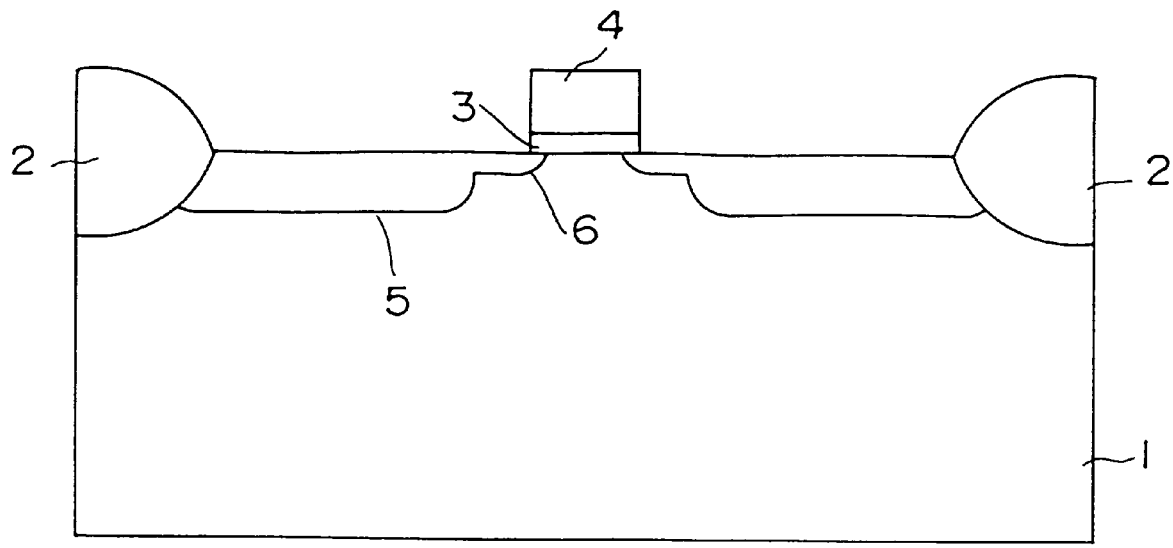
F I G. 2
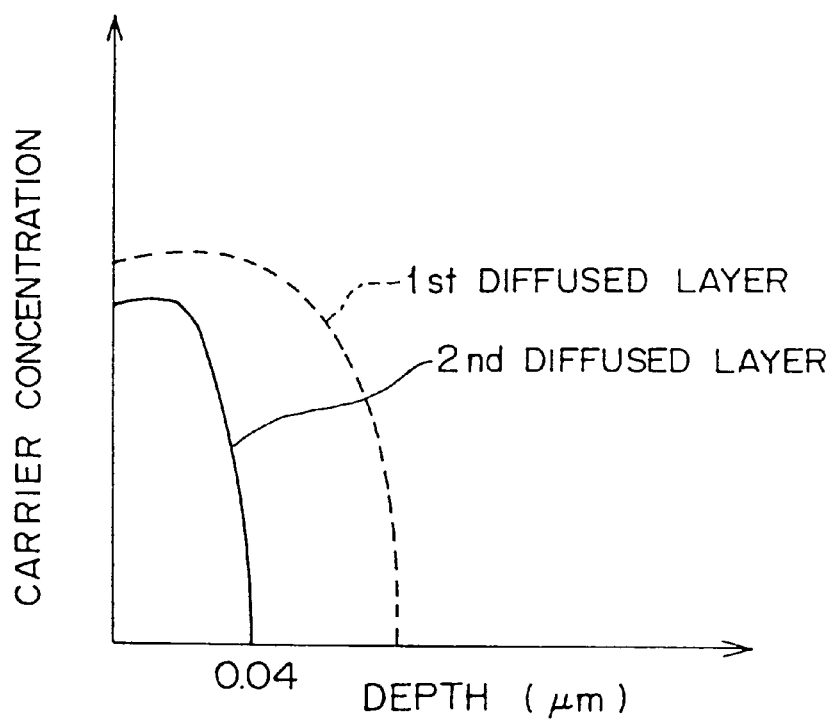
F I G. 3

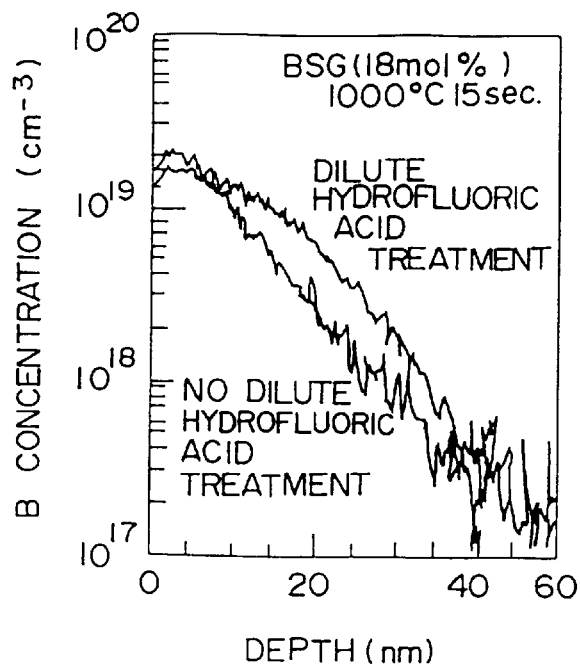
F I G. 13
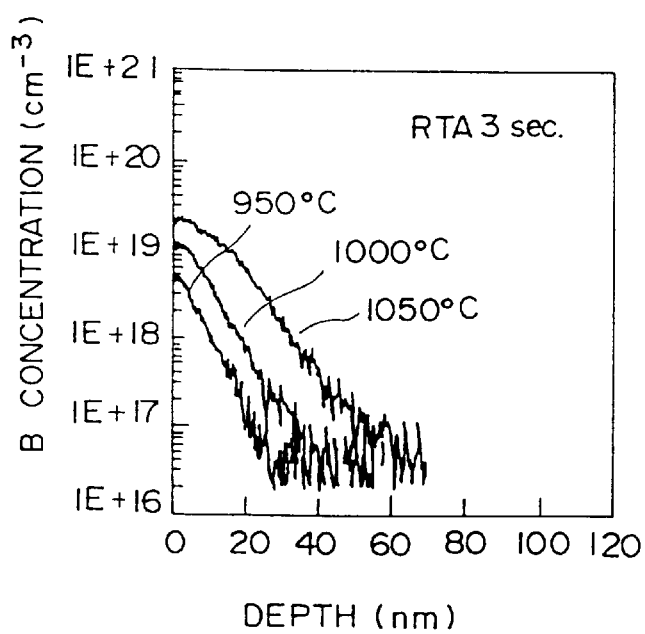
F I G. 14

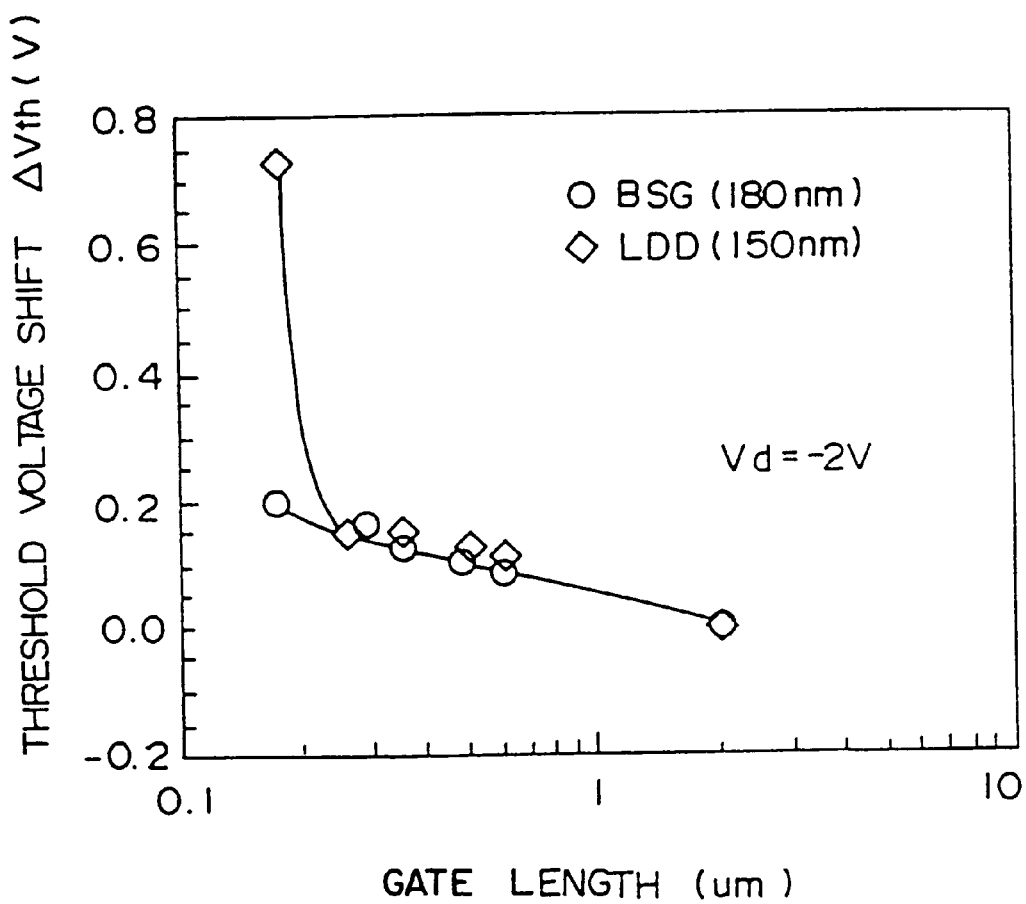
F I G. 23

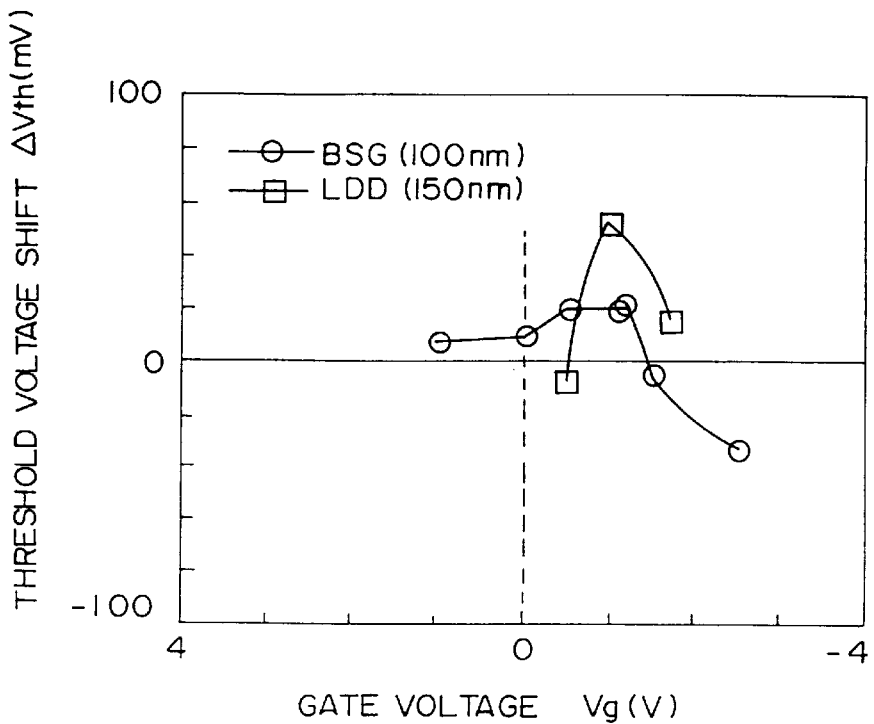
F I G. 26
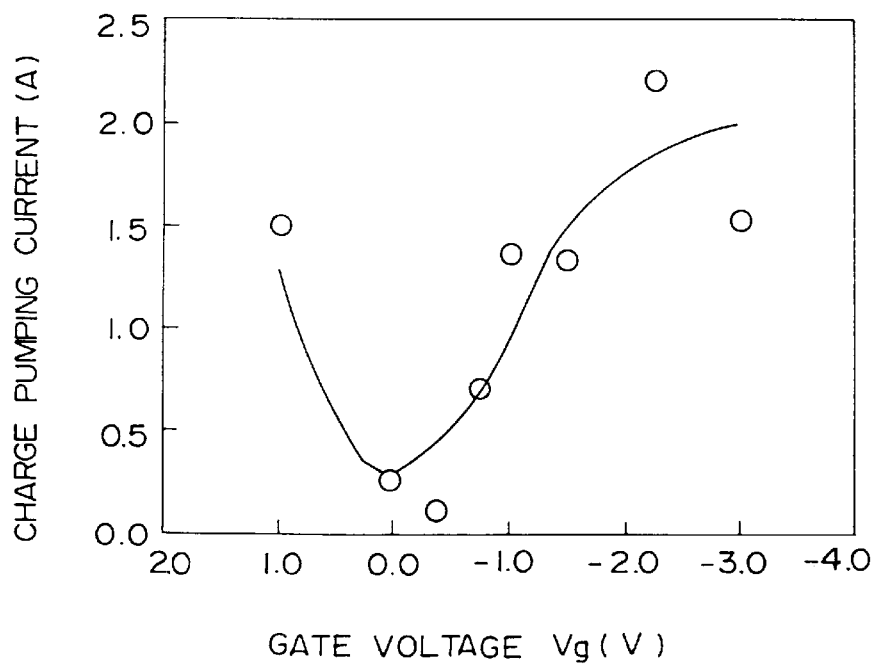
F I G. 27

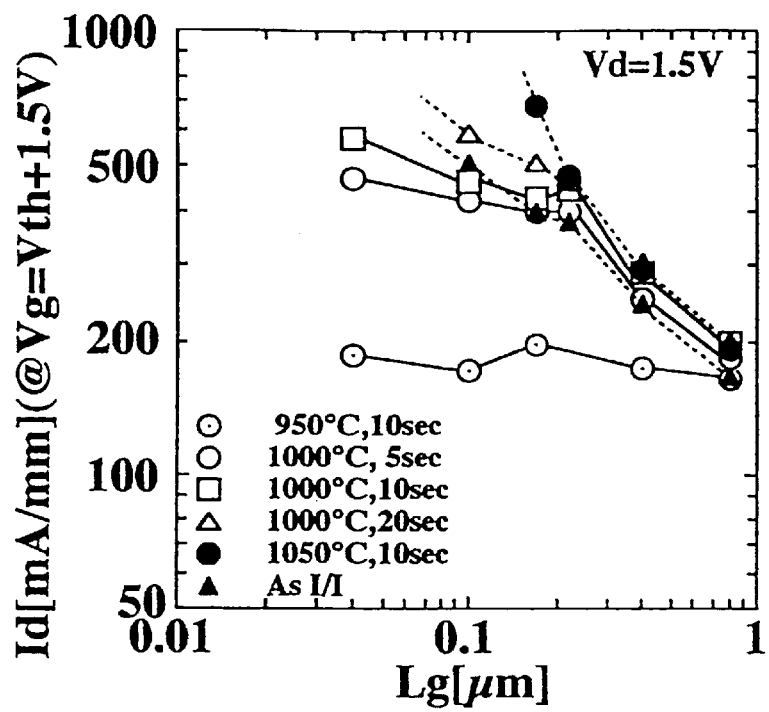
F I G. 44
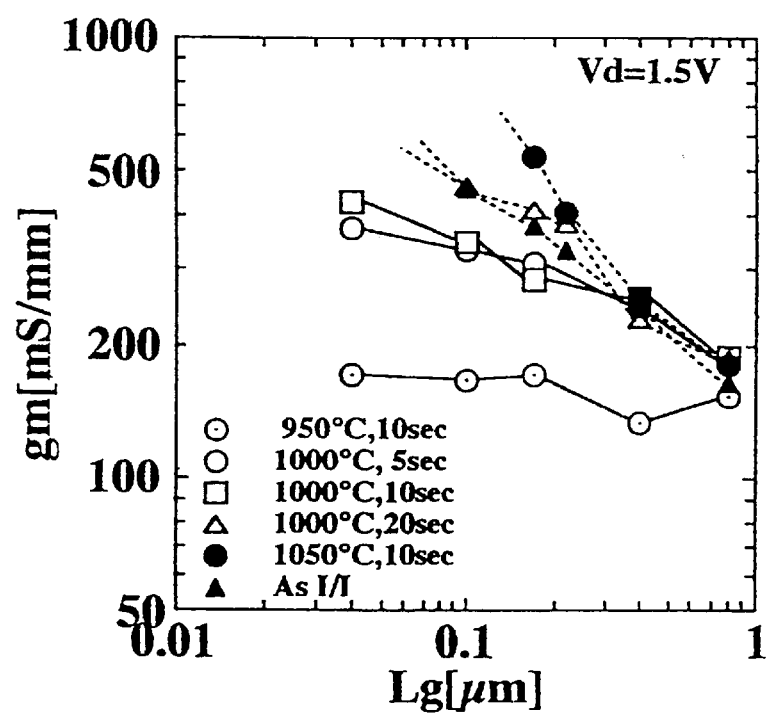
F I G. 45

F I G. 48 A
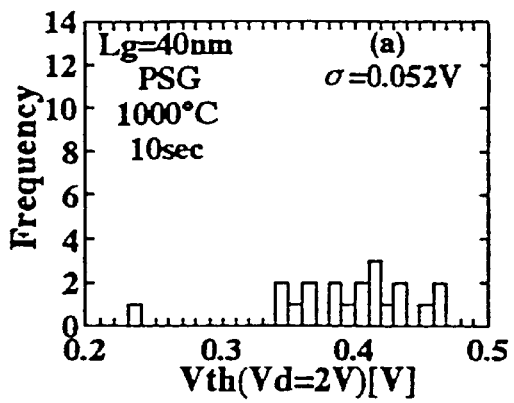
F I G. 48 B
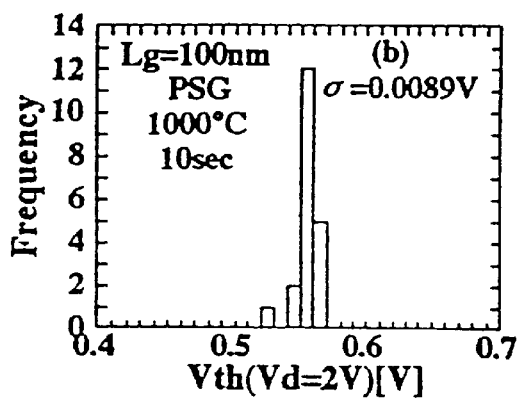
F I G. 48 C
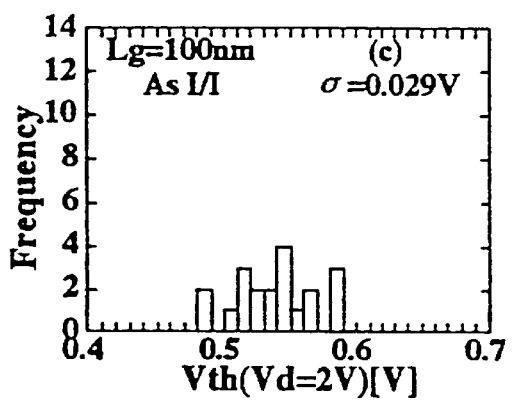
F I G. 48 D
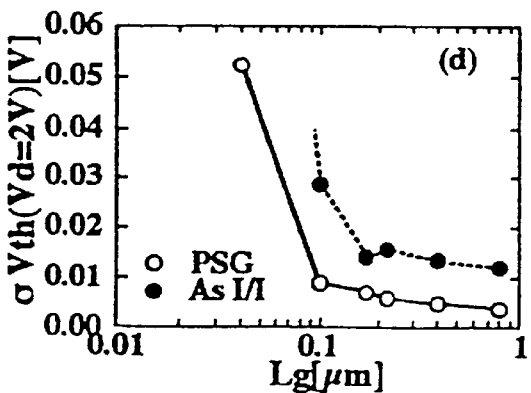

| RTA | xj | Leff | |
|---|---|---|---|
| | | Lg = 40 nm | Lg = 100 nm |
| 1000°C 5sec | 10 nm | 25 nm | 85 nm |
| 1000°C 10sec | 12 nm | 23 nm | 83 nm |
| 1000°C 20sec | 22 nm | 9 nm | 69 nm |
| 1050°C 10sec | 51 nm | 0 nm | 29 nm |
| As I/I | 45 nm | 0 nm | 37 nm |

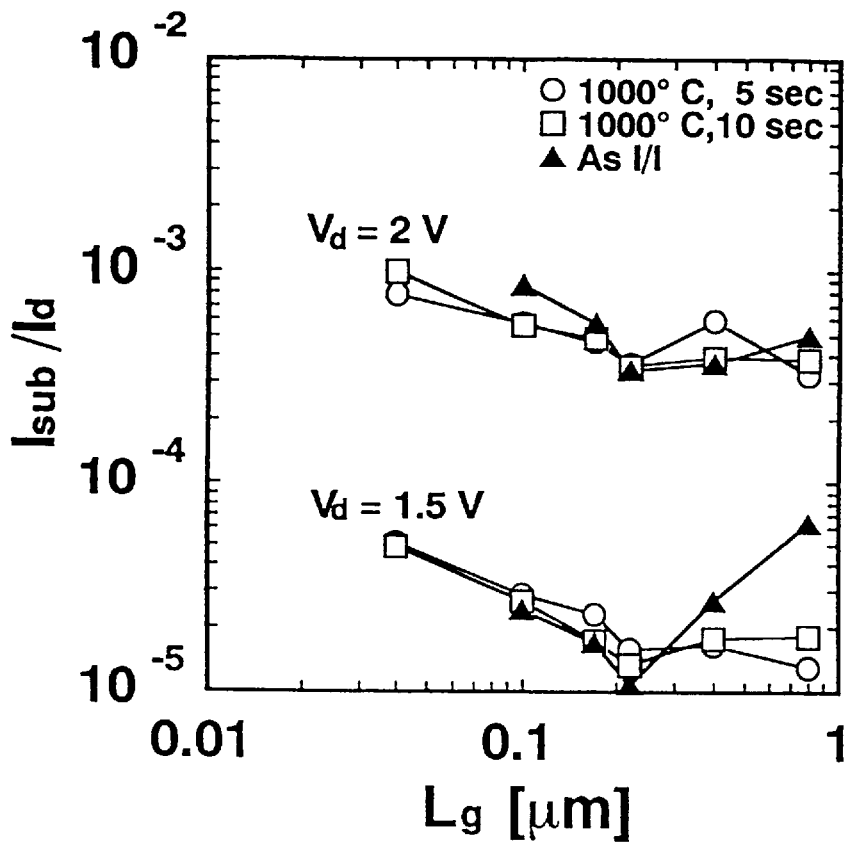
F I G. 52
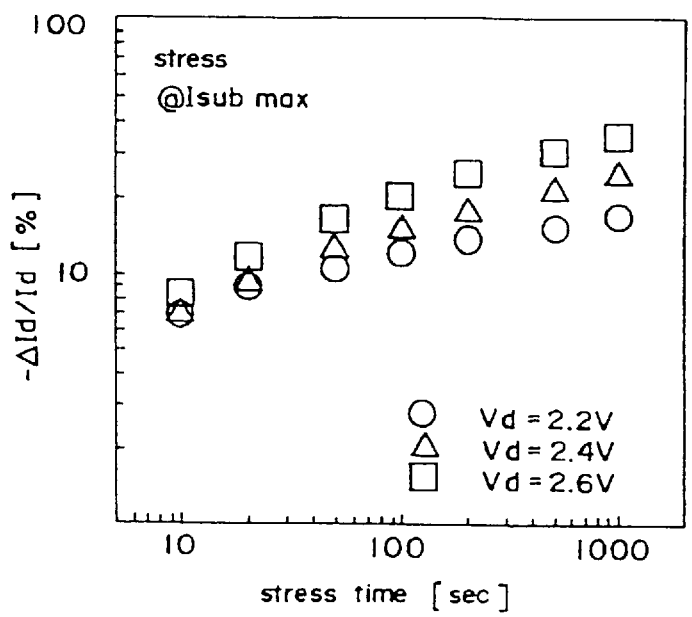
F I G. 53

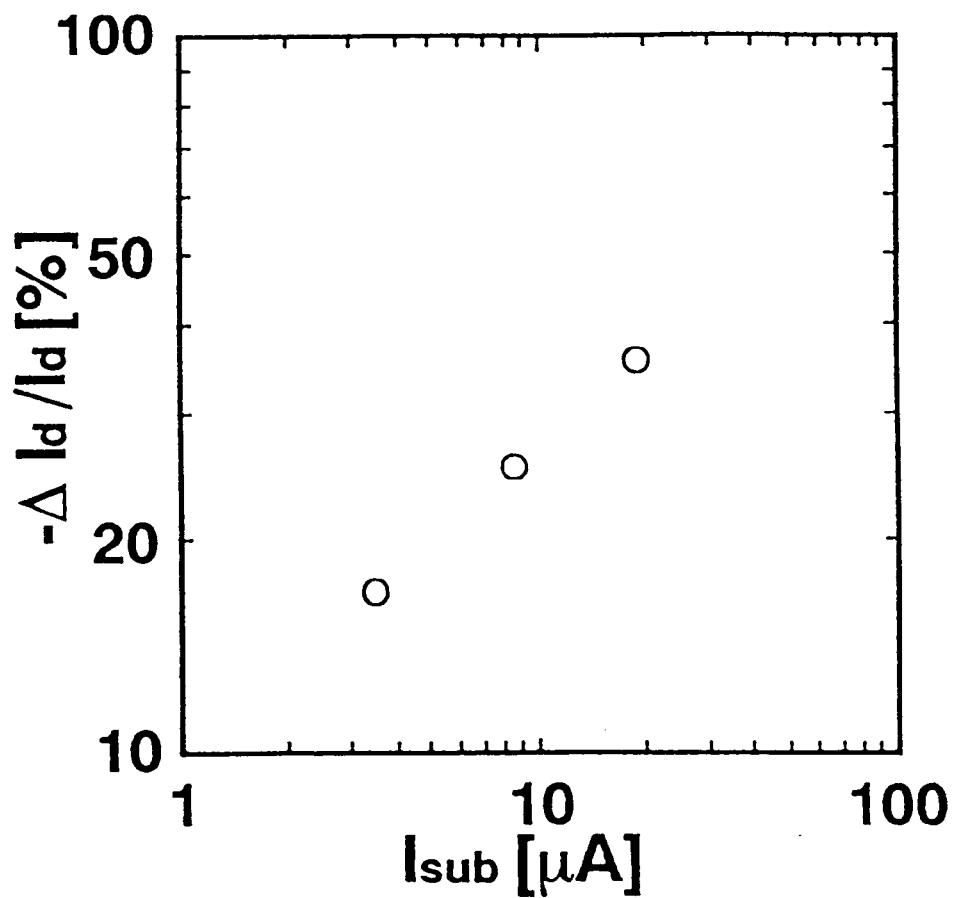
F I G. 54

MOSFET WITH SOLID PHASE DIFFUSION SOURCE

This application is a divisional of application Ser. No. 08/353,240, filed Dec. 2, 1994, now U.S Pat. No. 5,698,881, which is a continuation-in-part of Ser. No. 08/068,529, filed May 28, 1993, now U.S. Pat. No. 5,434,440.

BACKGROUND OF THE INVENTION

1. Field of the Invention

This invention relates to a semiconductor device advantageous to miniaturization and a method of manufacturing the same.

2. Description of the Prior Art

There occurs the problem that, with development of miniaturization of MISFET (Metal Insulation Silicon Field Effect Transistor), the punch-through is apt to take place between the drain and source by the short-channel effect. With a view to solving this problem, a LDD (lightly doped drain) structure has been conventionally devised. Namely, this LDD structure is a structure having a lightly doped drain-source. When attention is drawn to, e.g., an n-channel MOSFET, the field oxide film sides of the drain region and the source region are caused to be an $n^+$ layer and the channel formation layer sides thereof are caused to be an $n^-$ layer to set the impurity concentration at the channel side end portions of the drain and the source to a relatively lower value to thereby relax the drain electric field, to improve the withstand voltage, and to prevent the punch-through (penetration) between the drain and the source by the short-channel effect.

FIGS. 1A–1D show particularly a method of forming diffused layers serving as source and drain regions of a typical manufacturing process of a MOSFET having such LDD structure and its LDD elemental device structure.

In these figures, ion implantation for well is first implemented into a silicon substrate 701 thereafter to carry out extending diffusion of the implanted impurity to thereby form a well to subsequently carry out an ion implantation for prevention of parasitic channel. Thereafter, selective oxidation is implemented onto the substrate 701 surface to form field oxide film 702 to carry out isolation of the elemental device region (hereinafter simply referred to as the device region) from others. Then, a gate electrode material oxide film by thermal oxidation is formed on the entire surface of the region surrounded by the oxide film 702 on the substrate 701 to subsequently form a gate electrode material polycrystalline silicon (hereinafter polysilicon) film on the entire surface of the oxide film by using the LPCVD process so that its thickness reaches 2,000 angstroms. Thereafter, a mask of photoresist is formed on the polysilicon film serving as a gate electrode material by the optical lithography to implement patterning to the gate electrode material oxide film and the gate electrode material polysilicon film by using the RIE process thus to form a gate electrode comprised of a gate oxide film 703 and a polysilicon film 704 (FIG. 1A).

In the case where the MOSFET to be manufactured is a p-channel MOSFET, implantation of ions 705 of impurity $BF_2^+$ is then carried out under the condition of a low dose (about $1\times10^{13} cm^{-2}$) and an acceleration voltage of about 30 KeV (FIG. 1B). In the figure, reference numeral 706 represents a low concentration ion implanted region which is to serve as a source formed by that ion implantation, and reference numeral 707 represents a low concentration ion implanted region which is to serve as a drain formed by that ion implantation.

Thereafter, a silicon oxide film is deposited on the substrate 701 entire surface by the LPCVD process so that its thickness reaches about 1000 angstroms to subsequently carry out the RIE process, thereby allowing oxide film portions 708, 709 in a side wall form to be left on the side surfaces of the gate electrode. Further, implantation of ions 705 of impurity $BF_2^+$ is in turn carried out ordinarily under the condition of a higher dose more than $1\times10^{15} cm^{-2}$ and an acceleration voltage of about 30 KeV (FIG. 1C). Thus, a high concentration ion implanted region 710 is formed at the portion which is to serve as the source on the substrate 701, and a high concentration ion implanted region 711 is formed at the portion which is to serve as the drain on the substrate 701.

Then, the RTA (Rapid Thermal Annealing) process is carried out for 20 seconds at 1000° C. Then, after activation of ion implanted impurity has been conducted, metal silicide films 714, 715 are formed on the surface portions of the respective ion implanted regions 710, 711 by the SALICIDE (Self Align Silicide) process to thereby carry out activation of impurity to form the source region comprised of a high concentration diffused layer 716 and a low concentration diffused layer 717 and the drain region comprised of a high concentration diffused layer 718 and a low concentration diffused layer 719. Thus, LDD structures (low concentration diffused layers 717, 719) shallow in depth which have a low carrier concentration in correspondence with a carrier concentration of the substrate 701 are formed on the both sides of the channel formation region below the gate oxide film 703 (FIG. 1D).

Meanwhile, although such LDD structure has an advantage of suppression of the short-channel effect as previously described, it has the problem that since the channel side portions of the drain and source are caused to have a low concentration, the resistance between the source and the drain increases by lowering of concentration, resulting in a lowered current drivability. For this reason, in the case where the short-channel effect is not so problem in relation to the power supply voltage specification, there were instances where such a LDD structure is not employed.

However, it is considered that the action of suppression of the short-channel effect by the LDD structure is very useful for miniaturization of MOSFET. In view of this, inventors conducted a simulation to study an optimum mode (structure, impurity profile, etc.) of this LDD structure. As a result, it is found that from the both points of view of suppression of the short-channel effect and assuring of a drivability, the construction in which a shallow diffused layer having high concentration which cannot be realized by optimizing the conventional method and a diffused layer required to have a certain depth when the salicide process is taken into consideration are provided is required.

To form the LDD structure as described above in practice, after a gate electrode has been formed on a silicon substrate via a gate oxide film, impurity ions are implanted at a low dose rate. Further, after an insulating film has been formed on a gate side wall, impurity ions such as arsenic are implanted at a high dose rate. By the above-mentioned process, a shallow diffusion layer of a low concentration can be formed near the gate, and a deep diffusion layer of a high concentration can be formed outside the shallow diffusion layer. Further, a saliside film is formed on the deep diffusion layer of a high concentration.

However, this method involves various problems as follows: In the LDD structure, although there exists such an effect as to suppress a short channel effect, since the channel side of the drain and source is low in concentration, the resistance between the source and the drain increases by that extent, so that a problem arises in that the current drive capability is lowered. Accordingly, there exists such a case that the LDD structure is not adopted, when the short channel effect is not important from the point of view of element reliability in relation to the supply voltage specifications.

In addition, in the prior art NMOS transistors, although the diffusion layer of the source and drain is formed by ion (e.g., arsenic) implantation, the maximum junction depth is 40 nm at its minimum, and it has been difficult to obtain the junction depth less than 40 nm. Furthermore, when the gate length is less than 0.17 $\mu$m, since the short channel effect becomes prominent and further the threshold voltage Vth disperses, with the result that a serious problem arises in that the LSI characteristics fluctuate extremely large.

On the other hand, it is possible to form a shallow area of high concentration carriers, without forming the side wall insulating film on both sides of the gate. In this method, however, since the scaling rule cannot be applied to the contact resistance, in the indispensable saliside process, silicon is consumed at a composition ratio of silicon to metal contained in the metallic film formed on the substrate. Therefore, when the diffusion layer is formed shallow, the carrier concentration decreases at an interface between the metal siliside film and the substrate, so that the contact resistance increases and further the distance decreases from the electrode, through the interface of the source and drain diffusion layer regions and the source and drain diffusion layer regions, to the pn junction of the substrate. Consequently, leak current increases and further the depth of the diffusion layer (the degree of shallowness) is limited.

Further, in the conventional MOS transistors operative at room temperature, the minimum gate length obtainable was 70 nm (T. Hashimoto et al. "3V operation of 70 nm gate length MOSFET with new double punch through stopper structure", in Ext. Abs. of Ing. Conf. on Solid State Devices and Materials. pp 490 to 492, August 1992). In other words, it has been so far difficult from the technical point of view to from the MOSFET having a gate length less than 70 nm.

As described above, when MOSFET is miniaturized, although the LDD structure is suitable for suppression of the short channel effect, since the resistance between the source and the drain increases, there exists a problem in that the current drive capability deteriorates.

SUMMARY OF THE INVENTION

With the above in view, an object of this invention is to provide a semiconductor device and a method of manufacturing the same device, which can suppress the short channel effect in MOSFET, while improving the current drive capability.

Another object of the present invention is to provide a method for manufacturing the MOSFET having the novel structure.

Further object of the present invention is to provide a semiconductor device and a method of manufacturing the same device having source and drain regions with a high concentration and a shallow junction depth.

The gist of the present invention described hereinbelow is to utilize solid phase diffusion to form the source and drain diffusion regions of the MOSFET, and phosphorus is used as a diffusion source, for instance.

Further, the MOS type semiconductor device according to the present invention is characterized in that the concentration in the substrate surface is $10^{20}$cm$^{-3}$ or more, and the junction depth from the substrate surface is determined 22 nm or less.

In the MOS type semiconductor device according to the present invention, the relationship between the junction depth $x_j$ [nm] in the source and drain diffusion layer regions and the effective channel length $L_{eff}$ [nm] is determined as follows:

$$L_{eff} > 0.69 \, x_j - 6.17$$

Further, the method of manufacturing the MOS type semiconductor device according to the present invention is characterized in that the heat treatment in the solid phase diffusion process uses a heat range from 950° C. to 1050° C.

Further, the MOS type semiconductor device according to the present invention is characterized in that the gate length is determined less than 70 nm; the gate insulating film thickness is determined 2.5 nm or more; and the junction depth of the source and drain diffusion layer in the vicinity of the channel is determined 22 nm or less.

Further, the MOS type semiconductor device according to the present invention is characterized in that the gate length is determined less than 70 nm, and further means for supplying a voltage of 1.5 V or less between the source and the drain is provided.

Further, the method of manufacturing the MOS type semiconductor device according to the present invention comprises a process of forming a resist pattern on the gate to form the gate, and a process of reducing the width of the formed resist pattern 70 nm or less by ashing or etching.

According to the present invention, it has been confirmed by measurement that a MOS type semiconductor device of miniaturized gate structure can be obtained, which can reduce the short channel effect and the threshold voltage dispersion. The MOS type semiconductor device as described above is so far not at all obtained. In the structure of the present invention, a part of each of shallow source and drain diffusion layer regions each having a junction depth 22 nm or less from the substrate surface in the vicinity of the channel and a concentration less than $10^{20}$cm$^{-3}$ in the substrate surface can be obtained by forming a silicate glass containing phosphorus (P) as impurities on the gate side wall and further by effecting the solid phase diffusion beginning therefrom. As described above, since phosphorus is solid phase diffused in the substrate, in comparison with the case where boron (B) for instance is solid phase diffused in the substrate, it is possible to obtain a diffusion layer high in concentration and low in junction depth. Therefore, it is possible to form a miniaturized MOSFET of high drive capability.

The reason why the above-mentioned difference can be explained on the basis of the segregation coefficient of impurities at the interface between silicon and silicon oxide film. In more detail, the segregation coefficient of phosphorus at the interface between the silicon and silicon oxide film is larger than 1, and that of boron is smaller than 1. Therefore, as described later with reference to FIGS. 42A to 42C, the concentration of phosphorus becomes high on the silicon side in the interface between the silicon and the silicon oxide film. On the other hand, the concentration of boron becomes high on the silicon oxide film side in the same interface. As a result, in the case where the source and drain diffusion layer regions are formed by solid phase diffusion, when phosphorus is used as the impurities, it is possible to form a shallow diffusion layer of extremely high concentration, so that a miniaturized MOSFET of high current drive capability can be formed.

In particular, when the phosphorus concentration is determined $10^{20}$ cm$^{-3}$ or more in the surface of the substrate and $10^{18}$ cm$^{-3}$ or less at the depth of 22 nm from the surface of the substrate, it is possible to reduce the sheet resistance of the diffusion layer region less than 10 kohm/□, which is low enough to obtain a high current drive capability. Further, it is possible to reduce the diffusion layer depth sufficiently shallow to suppress the short channel effect. Further, when the phosphorus concentration is determined $10^{21}$ cm$^{-3}$ or more in the surface of the substrate and $10^{18}$ cm$^{-3}$ or less at the depth of 12 nm from the surface of the substrate, it is possible to obtain more desirable results, because a more shallower diffusion layer of more higher concentration can be formed. Further, when the sheet resistance of the diffusion layer region is determined less than 10 kohm/□, as described later with reference to FIG. 44, it is possible to obtain the current drive capability equal to or more than that of the element of the LDD structure.

Further, according to the present invention, since the effective channel length $L_{eff}$ and the junction depth $x_j$ are determined so that the relationship between the two can be established as: $L_{eff} > 0.69 x_j - 6.17$, it is possible to reduce $L_{eff}$ sufficiently small within the transistor operating range, so that the transistor can be further miniaturized. In other words, it is possible to prevent the punch through, while securing a sufficiently high current drive capability of the transistor.

Here, although the effective channel length $L_{eff}$ can be reduced with the advance of the microminiaturization, it is impossible to reduce this length $L_{eff}$ indiscreetly in relation to the junction depth $x_j$. This is because when $L_{eff}$ is reduced excessively, the transistor will not operate. Therefore, the inventors have manufactured various MOSFETs of different junction depths $x_j$ and the different effective channel lengths $L_{eff}$ and have confirmed that the transistors can be operative under excellent conditions as far as the effective channel length $L_{eff}$ and the junction depth $x_j$ satisfy a predetermined relationship. The above-mentioned relationship has been obtained as described above.

Further, when the junction depth $x_j$ is determined 22 nm or less, even if the gate length is reduced down to about 0.1 μm, it is possible to suppress the deviation of the threshold value (offset value from the threshold voltage of the long gate element) due to the short channel effect down to about 50 mV. In other words, the short channel effect can be suppressed effectively. Further, in the case of the transistors having a gate length less than 0.1 μm, when the source and drain thereof are formed in accordance with the solid phase diffusion method, it is possible to satisfy the above-mentioned relationship easily, as compared with when the ordinary ion implantation is adopted.

Further, according to the present invention, it is possible to obtain a MOSFET having a gate length less than 70 nm (which have been so far difficult to form from the technical standpoint, as already explained). The reason why the MOSFET of this type cannot be obtained is that the depth of the source and drain diffusion layer regions are as deep as 40 nm.

In the present invention, since the junction depth is reduced less than 22 nm, the gate length can be reduced down to 40 nm at once. Where the thickness of the gate insulating film is reduced less than 2.5 nm, a tunnel leak current starts to flow through the insulating film. In general, since it is not preferable to further reduce the thickness of the gate insulating film, it is important to decide the thickness of the diffusion layer 22 nm or less.

Further, according to the present invention, in the solid phase diffusion process, when the heat treatment is effected at temperature in the range from 850° C. to 1050° C., it is possible to form a miniaturized N-channel MOSFET having a gate length less than 0.1 μm and a high current drive capability.

Further, in the case where the source and drain diffusion layer regions of the MOSFET are formed by solid phase diffusion, when the device is heat-treated at temperature lower than 950° C., as described later with reference to FIGS. 44 and 45, the current drive capability of the MOSFET cannot be increased. Further, if the device is heat-treated at temperature higher than 1050° C., as described later with reference to FIGS. 46 and 47, in the case of the miniaturized MOSFET having a gate length 0.1 μm or less, the transistor operation cannot be obtained due to punch through. Accordingly, it is necessary to effect the solid phase diffusion within the above-mentioned temperature range.

Further, in the solid phase diffusion process, when the heat treatment temperature is determined between 970° C. and 1020° C., since the current drive capability of the MOSFET is sufficiently large, the transistor operation can be secured. Further, in the above-mentioned heat treatment for the solid phase diffusion, when the heat treatment time is determined 20 sec or shorter in particular, an N-channel MOSFET excellent in both the short channel effect suppression and the high current drive capability can be obtained.

BRIEF DESCRIPTION OF THE DRAWINGS

In the accompanying drawings;

FIG. 2 is a device cross section showing the structure in a MIS type semiconductor device of this invention.

FIG. 3 is a graph showing an impurity profile of diffused layers in FIG. 2.

FIG. 13 is a graph showing comparison between a profile of boron in the substrate when pre-treatment is conducted and that when no pre-treatment is conducted, FIG. 14 is a graph showing a profile of solid phase diffusion when temperature is changed under the condition where time is constant, FIG. 23 is a graph showing a gate length dependency of the threshold shift quantity ΔVth, FIG. 26 is a graph showing a shift of the threshold voltage Vth after stress is continuously applied under the condition where the drain voltage is fixed, FIG. 27 is a graph showing a gate voltage dependency of a change of a charge pumping current.

FIG. 44 is a characteristic graph showing the dependency of the saturated current value upon the gate length;

FIG. 45 is a characteristic graph showing the dependency of the mutual conductance upon the gate length;

FIGS. 48A to 48D are characteristic graphs showing the distribution of the threshold voltage Vth;

FIG. 52 is a characteristic graph showing the relationship between the hot carrier generation rate (substrate current/drain current) and the gate length;

FIG. 53 is a characteristic graph showing the dependency of the deterioration rate of the drain current upon the stress time; and FIG. 54 is a characteristic graph showing the dependency of the deterioration rate of the drain current upon the substrate current.

DESCRIPTION OF THE PREFERRED EMBODIMENTS

[First Embodiment]

Figure 1A:
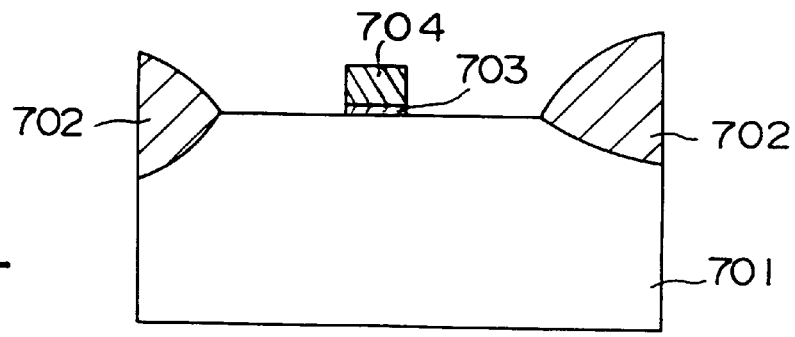
FIGS. 1A–1D are cross sectional views every respective process steps showing the structure of a conventional semiconductor device of the LDD structure and its manufacturing process.
Figure 1B:
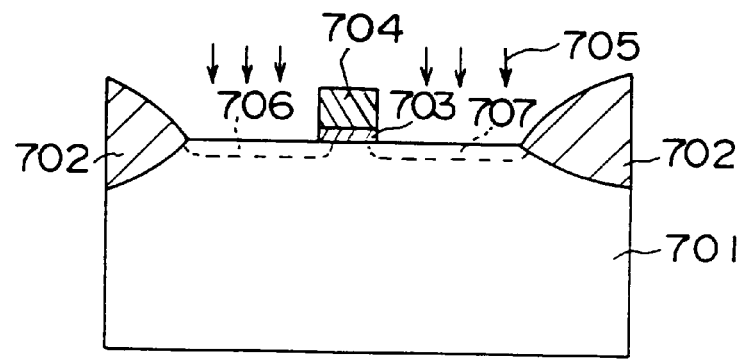
Figure 1C:
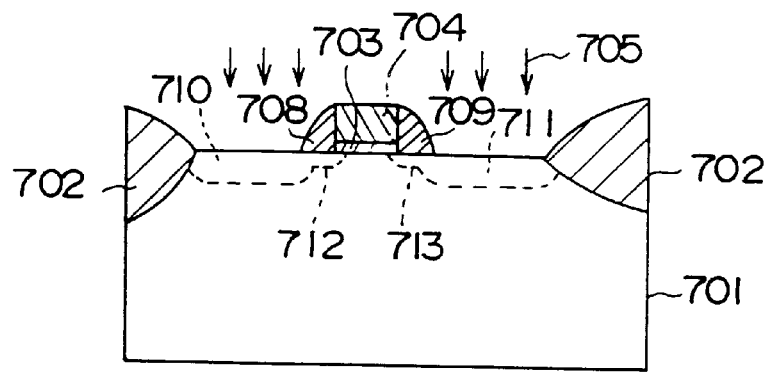
Figure 1D:
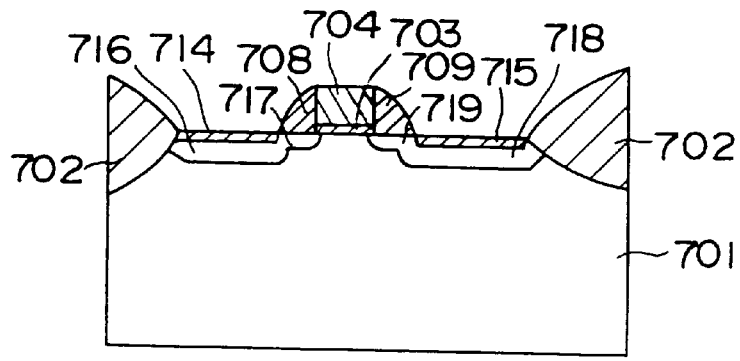

A first embodiment of this invention will now be described with reference to the attached drawings.

FIG. 2 is a device cross sectional view showing the structure in a MIS type semiconductor device of this invention. As seen from this figure, a region of a semiconductor substrate 1 surrounded by an element isolation region 2 is defined as an element region and on the surface in this element region, a gate insulation film 3 and a gate electrode 4 are formed on the substrate. Impurity diffused layers are formed in the substrate outside of the gate electrode. The impurity diffused layers serving as a source and a drain each have such a diffused layer (first diffused layer) to satisfy the limit of a leakage current and a resistance in source and drain regions in carrying out salicide process, and a shallow diffused layer (second diffused layer) where high concentration carriers are caused to exist in order to allow the high resistance region below the side walls to be a low resistance region. In this instance, the distribution profile in a depth direction of the second diffused layer is a profile, as shown in FIG. 3, in which the second diffused layer has a depth shallower than the first diffused layer and has a carrier concentration more than $5 \times 10^{18} cm^{-3}$ at its peak and in correspondence with a carrier concentration of the semiconductor substrate at the depth below 0.04 μm.

FIG. 4A–4D are cross sectional views every respective process steps for explaining a manufacturing process for obtaining the structure of FIG. 2.

Figure 4A:
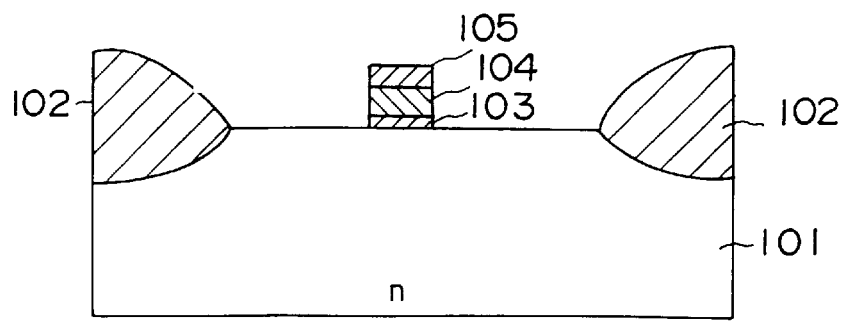
FIGS. 4A–4D are device cross sectional views every respective process steps explaining a manufacturing process for obtaining the structure of FIG. 2.

First, ion implantation for well is implemented into a silicon substrate 101 thereafter to carry out extending diffusion to form a well to subsequently carry out ion implantation for prevention of the parasitic channel. Thereafter, selective oxidation is implemented onto the substrate 101 surface to form field oxide film portions 102 to isolate the device region from others. Then, a gate electrode oxide film 103 is formed by thermal oxidation on the entire surface of the region surrounded by the oxide film portions 102 on the substrate 101 to subsequently form a polysilicon film 104 which is a gate electrode material on the entire surface thereof by using the LPCVD (Low Pressure CVD) process so that its thickness reaches 2000 angstroms. Further, a silicon oxide film 105 is formed by the APCVD (Atmospheric Pressure CVD) process on the polysilicon film 104. A mask of photoresist is then formed by the optical lithography on the silicon film 105 electrode to apply patterning, at a time, to the double layers of the oxide films 103 and 105 and the intermediate polysilicon film 104 by using the RIE process thus to form a gate electrode comprised of the gate oxide film 103, the polysilicon film 104 and the silicon oxide film 105 (FIG. 4A).

Figure 4B:
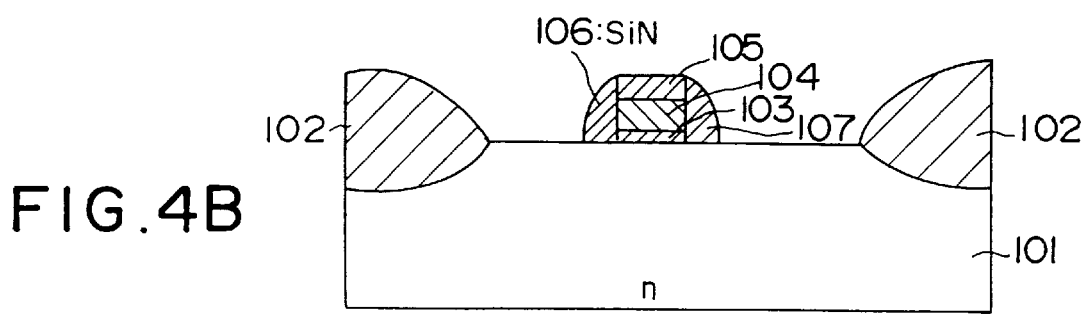

Then, a silicon nitride film is formed on the entire surface of the substrate 101 by using the APCVD process to subsequently carry out the RIE process to thereby form nitride film side walls 106, 107 on the side surfaces of the gate electrode (FIG. 4B).

Thereafter, ions of impurity $BF_2^+$ are implanted into the substrate 101 under the condition of a dose of $3 \times 10^{15} cm^{-2}$ and an acceleration energy of 30 KeV to carry out activation of the implanted ions by using the RTA process (1000° C., 20 seconds). In the figure, reference numeral 108 represents a diffused layer serving as a source, and reference numeral 109 represents a diffused layer serving as a drain. By this formation process, diffused layers 108, 109 are caused to have a carrier profile having a peak concentration of $2.4 \times 10^{20} cm^{-3}$ and a junction depth of 0.14 μm when the concentration of the substrate is $1 \times 10^{18} cm^{-3}$.

Figure 4C:
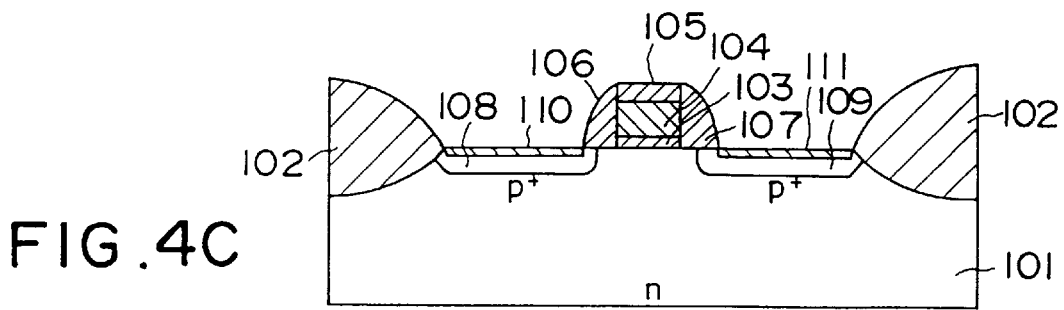

Thereafter, a titanium film is formed on the entire surface of the substrate 101 by the sputtering process so that its thickness reaches 300 angstroms to carry out the RTA process under the condition of 750° C. and 30 seconds to thereby selectively form titanium-silicide films 110, 111 only on the diffused layers 108, 109 respectively serving as the source and the drain. Then, titanium which has not reacted is etched by a mixed liquid of ammonia, hydrogen peroxide solution and water or a mixed liquid of sulfuric acid and hydrogen peroxide solution. By this process step, electrodes connecting to the source and drain regions can be formed in a self-alignment manner. Further, since the carrier concentration at the interface is the order of $1 \times 10^{20} cm^{-3}$, the contact resistance is sufficiently lowered (FIG. 4C).

Figure 5A:
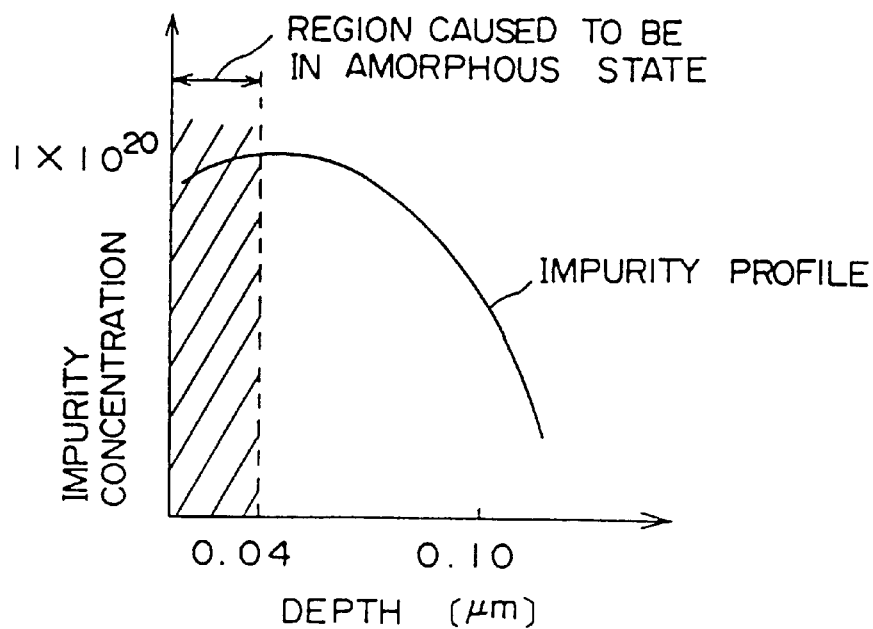
FIGS. 5A and 5B graphs showing an impurity profile of the diffused layers.

Thereafter, the silicon nitride film side walls 106, 107 are removed by the hot phosphoric acid treatment to implement ion implantation of $BF_2^+$ into the substrate 101 under the condition of an acceleration voltage of 30 KeV and a dose of $3 \times 10^{15} cm^{-2}$. Namely, by implanting ions of $BF_2^+$ in the atmosphere of nitrogen under the condition of a dose more than $1 \times 10^{15} cm^{-2}$ as shown in FIG. 5A, only the region shallower than the profile of impurity from the semiconductor substrate 101 surface is caused to be in an amorphous state.

As well known, the frequency P of moving of an impurity existing at the interstitial position to an adjacent vacancy is expressed as follows:

$$P = X_v \cdot Z \cdot v \cdot \exp(-\Delta Gm/kT)$$

where $X_v$ is a vacancy density, Z is the number of nearest neighbor lattice points, v is a frequency of impurity atom, and ΔGm is an energy barrier. Further, the density of vacancy existing in a thermodynamically stable state is expressed as follows:

$$X_v = \exp(S_v/k) \cdot \exp(-Ef/kT)$$

where $S_v$ is an increment in entropy by formation of vacancy, Ef is a vacancy formation energy, k is Boltzman factor, and T is an absolute temperature with elevation of temperature. As seen from this formula, the vacancy density exponentially increases. Therefore, in the annealing by low temperature, since a larger number of vacancies exist in the layer caused to be in an amorphous state in the vicinity of the substrate surface as compared to vacancies at the portion deeper than the region caused to be in an amorphous state of the substrate, impurity atoms are apt to enter the interstitial position, viz., the activation rate becomes high.

Here, the width of the region caused to be in an amorphous state and the number of lattice points in that region, i.e., the width of the region having a high carrier concentration and the peak concentration are determined by the ion implantation condition. For example, in the case of ion implantation of $BF_2^+$, the region having a depth of 0.04 μm from the surface is allowed to serve as a region caused to be in an amorphous state under the condition of a dose of $3 \times 10^{15} cm^{-2}$ and an acceleration voltage of 30 KeV.

This depth is obtained by the measured result by RBS (Ratherford Back Scattering) method.

Further, a difference between a carrier concentration of the substrate and a carrier concentration of the region caused to be in an amorphous state is determined by the annealing temperature. By an annealing of one hour and a temperature from 500° C. to 750° C., the peak concentration of the region caused to be in an amorphous state could be more than $5 \times 10^{20} cm^{-3}$ and the activation rate could be equal to substantially 100%. In addition, the depth where the carrier concentration of the substrate reaches $1 \times 10^{18} \text{cm}^{-3}$ could be less than 0.04 µm.

Figure 4D:
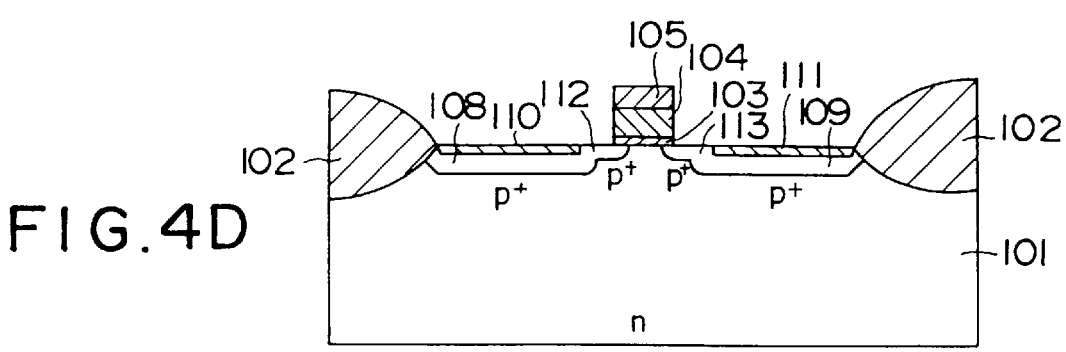
Figure 5B:
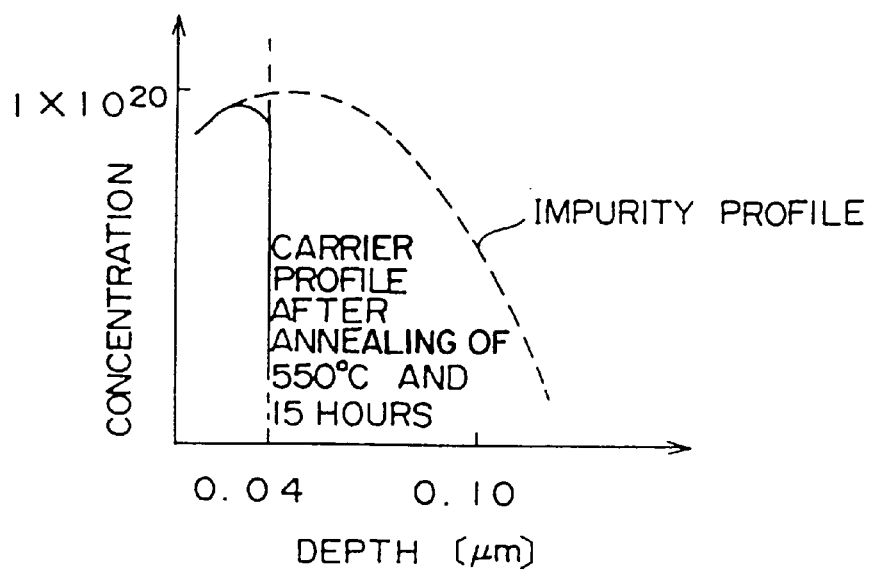

Subsequently, annealing is conducted in the atmosphere of nitrogen under the condition of 550° C. and 15 hours. Thus, there is provided, as shown in FIG. 5B, a shallow and high concentration carrier profile such that the peak concentration is more than $1 \times 10^{20} \text{cm}^{-3}$ and the junction depth is 0.032 µm (FIG. 4D).

Namely, by carrying out the heat treatment for a time determined by the relationship between crystallization by the solid phase growth in the region caused to be in an amorphous state and the influence on the carrier profile by diffusion of impurity, there are formed, on the respective channel formation regions of the diffused layers 108, 109 within the semiconductor substrate 101, diffused layers shallower than those regions, and having a profile such that a carrier concentration is more than $5 \times 10^{18} \text{cm}^{-3}$ at the peak, and is in correspondence with the carrier concentration of the semiconductor substrate 101 at a depth less than 0.04 µm. It is to be noted that any temperature in a range from 500° C. to 750° C. may be employed.

In accordance with the MOSFET of such a structure obtained by the above-mentioned method, the source and the drain respectively have diffused layers 108, 109 positioned on the field oxide film 102 side and diffused layers 112, 113 positioned on the channel formation region side in such a manner that they are relative to each other. These diffused layers 112, 113 are formed so that they are shallow and have high concentration as described above, whereby the parasitic resistance can be reduced while suppressing the short-channel effect in a miniaturized MOS device. As a result, a large drain current can be obtained. In addition, in carrying out formation of electrodes 110, 111 by the salicide process into the diffused layers 108, 109, the resistance value of the contact resistance can be reduced and the leakage current can be suppressed. Moreover, the source and drain regions can be of low resistivity.

Figure 6:
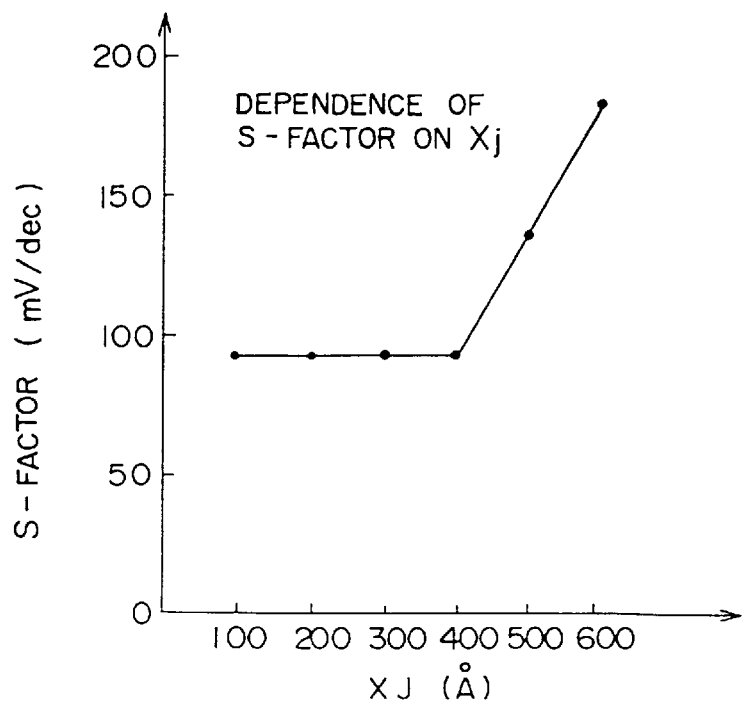
FIG. 6 is a graph showing a simulated result of to what extent a depth Xj that the concentration reaches the peak concentration of the second diffused layer contribute to the S-factor which is an inverse of an inclination in a subthreshold region.
Figure 7:
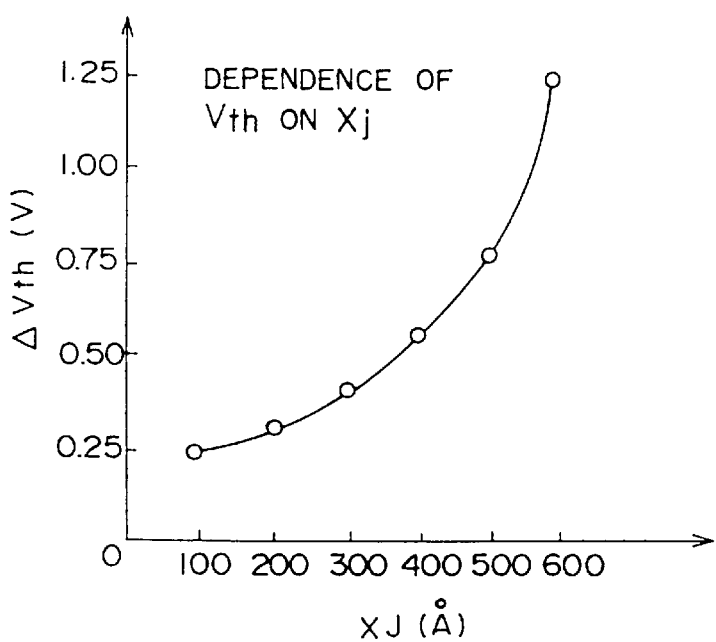
FIG. 7 is a graph showing a simulated result of to what extent a depth Xj that the concentration reaches the peak concentration of the second diffused layer contribute to the threshold voltage shift Vth.

FIGS. 6 and 7 show the result obtained by carrying out simulation in connection with a MOSFET having a structure according to this invention. Specifically, FIG. 6 shows to what degree the depth Xj when the concentration reaches the peak concentration of the second diffused layer contributes to S-factor (indicating inverse of maximum inclination in subthreshold region), and FIG. 7 similarly shows to what degree the depth Xj contributes to the threshold voltage Vth.

First referring to FIG. 6, it is seen that the S-factor becomes large when the depth Xj is above 400 angstroms (i.e., 0.04 µm), and it is thus desirable that the depth Xj is less than 400 angstroms. Further, as shown in FIG. 7, it is seen that the elevation rate of the threshold voltage Vth becomes high when the depth Xj is above 400 angstroms. Accordingly, it is similarly apparent that it is desirable that the depth Xj is less than 400 angstroms.

FIGS. 8A–8D show a second manufacturing process according to this invention and a device structure of a p-channel MOSFET obtained by that manufacturing process.

Figure 8A:
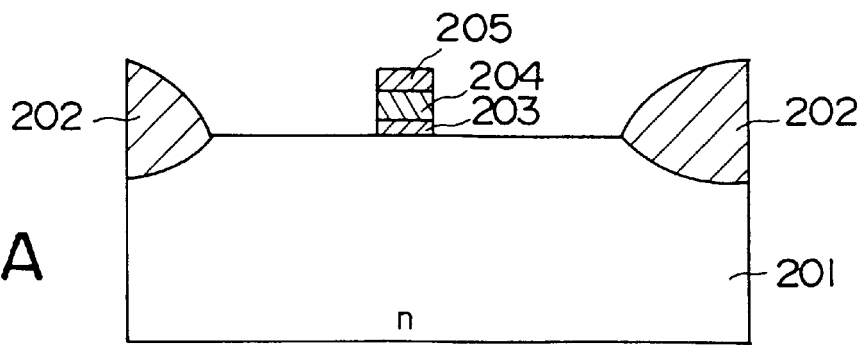
FIGS. 8A–8D are device cross sectional views every respective process steps showing a second manufacturing process of a p-channel MOSFET according to this invention and a device structure obtained by that manufacturing process.

In this figure, by a process similar to that in FIGS. 4A–4D, a field oxide film 202, and a gate electrode comprised of a gate oxide film 203, a polysilicon film 204 and a silicon oxide film 205 are formed on a silicon substrate 201 (FIG. 8A).

Figure 8B:
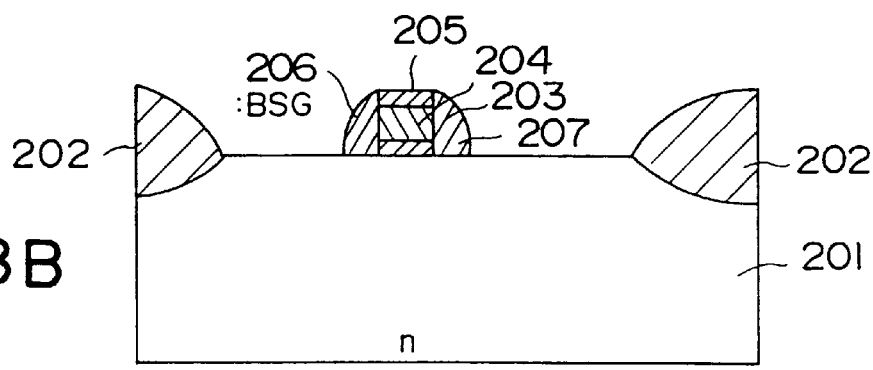

Thereafter, a BSG film (B concentration is 18 mol %) is formed by the LPCVD process on the entire surface of the substrate 201 to form BSG film side walls 206, 207 on the both side surfaces of the gate electrode by the RIE process (FIG. 8B).

Figure 8C:
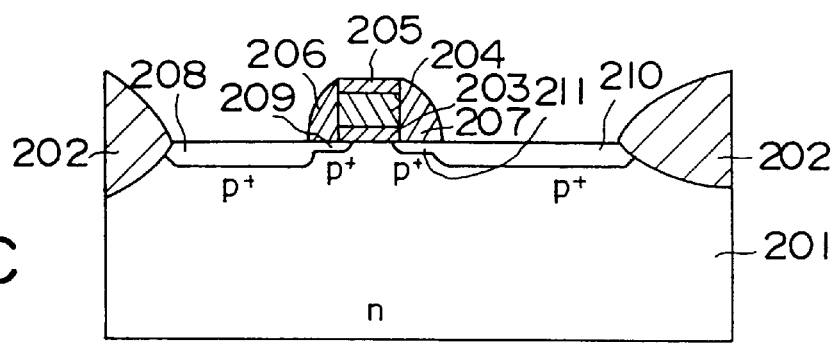

Then, impurity $BF_2^+$ is ion-implanted into the entire surface of the substrate 201 under the condition of a dose of $3 \times 10^{15} \text{cm}^{-2}$ and an acceleration energy of 30 KeV. Further, RTA is carried out under the condition of 1000° C. and 15 seconds to carry out activation of impurity. By heat in RTA, impurity in the BSG film side walls 206, 207 is diffused into the substrate 201, so shallow diffused layers are formed below the BSG film side walls 206, 207. Thus, deep diffused layers 208, 210 serving as source and drain regions are formed, and shallow diffused layers 209, 211 are formed on the channel formation region sides of the both diffused layers 208, 210. In these shallow diffused layers 209, 211, a distribution in a depth direction of the carrier concentration of $1 \times 10^{18} \text{cm}^{-3}$ at the depth of 0.04 µm from the substrate 201 surface and a peak carrier concentration of $5 \times 10^{19} \text{cm}^{-3}$ at the surface of the substrate is obtained (FIG. 8C).

Figure 8D:
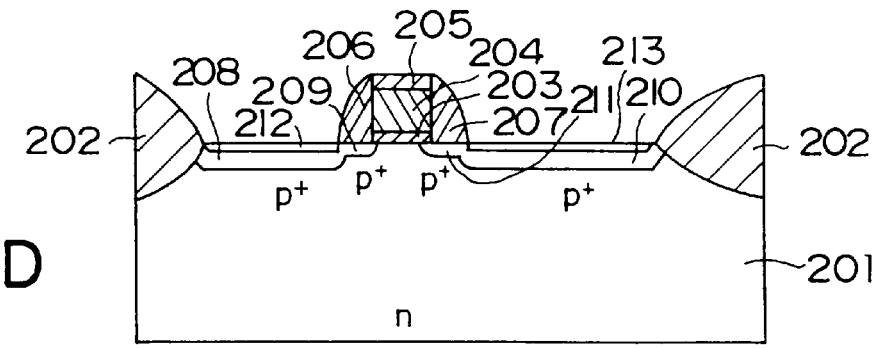

Thereafter, by carrying out a salicide process similar to that in the above-described embodiment, metal silicide films 212, 213 are formed on the source and the drain (FIG. 8D).

By the above-mentioned process, a device structure according to this invention can be provided.

It is to be noted that, in the above-mentioned process, in forming polysilicon film 204, it is desirable to use the doped polysilicon which can be deposited by the LPCVD process and simultaneously impurity doping is conducted. It is also desirable to allow the gate oxide film 203 to be formed as a nitride oxide film.

Figure 9:
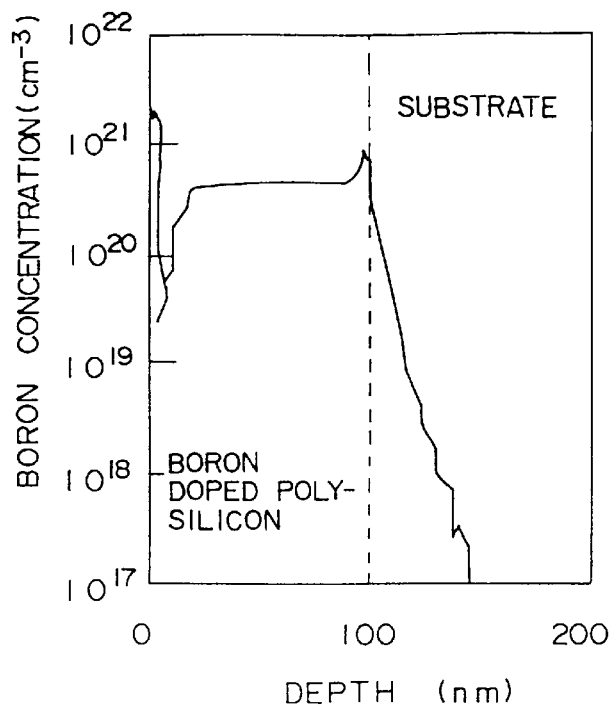
FIG. 9 is a graph showing a profile of boron after heat treatment of boron doped polysilicon deposited on a nitride oxide film.

The profile of boron when B (boron) doped polysilicon is deposited on a nitride oxide film by the LPCVD process thereafter to allow it to undergo high temperature and short time heat treatment of 1000° C. and 15 seconds is shown in FIG. 9. By using the B (boron) doped polysilicon, the boron concentration in the gate is caused to be uniformly $4 \times 10^{20} \text{cm}^{-3}$. At this concentration, Fermi level is in a valence band at an ordinary temperature, and represents a degenerate level. Further, because the gate oxide film is formed as a nitride oxide film although it is an extremely thin thickness of 32 angstroms, penetration of boron into the substrate is substantially suppressed. From this fact, it is seen that it is extremely useful to use B (boron) doped polysilicon and nitride oxide film as the gate and the gate insulator for the purpose of suppressing depletion of the gate and penetration of boron.

Figure 10:
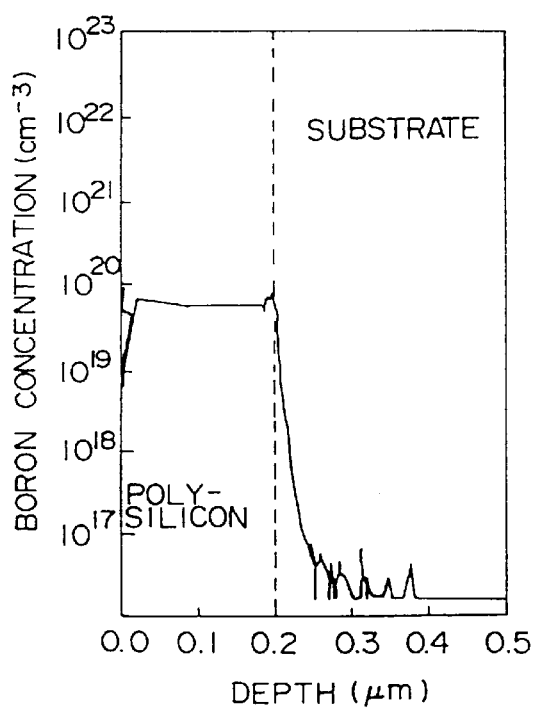
FIG. 10 is a graph showing a profile of boron after heat treatment of boron doped polysilicon.

Further, in a P-channel MOSFET having a gate length of 0.5 µm, comparison between a drivability in the case of a gate formed by ion implantation of $BF_2$ and a drivability in the case of a gate formed by B (boron) doped polysilicon was conducted. In both cases, a nitride oxide film is used as the gate insulator. The profile of boron when the film thickness of polysilicon is caused to be 2000 angstroms to implant $BF_2$ under the condition of an acceleration voltage of 35 KeV and a dose of $1 \times 10^{15} \text{cm}^{-2}$ to carry out an activation high temperature short time heat treatment of 1000° C. and 15 seconds is shown in FIG. 10. From this figure, it is seen that while penetration of boron is suppressed by the nitride oxide film, Fermi level of polysilicon exists in an energy gap at an ordinary temperature because the boron concentration in polysilicon is $6 \times 10^{19} \text{cm}^{-3}$, and therefore does not reach a degenerate level.

Figure 11:
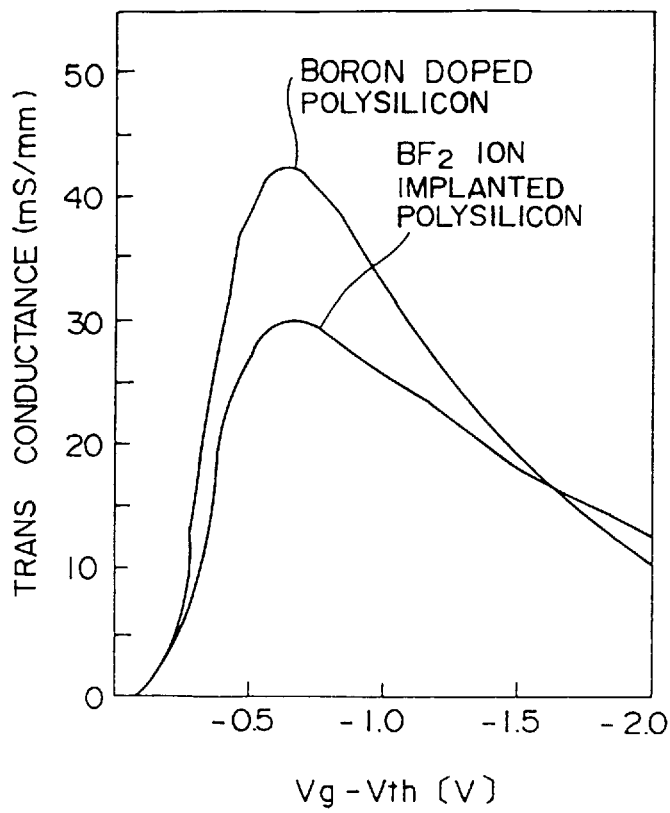
FIG. 11 is a graph showing a Vg-Vth dependency of transconductance.

Dependence of transconductance on Vg-Vth when the drain voltage is caused to be −2 volts is shown in FIG. 11. Although there is no difference between gate voltages giving respective peaks, in the case of the gate by ion implantation, deterioration by depletion of the gate appears with respect to a gate by the B (boron) doped polysilicon by about 25% in terms of the peak value.

Further, in a p-channel MOSFET having a gate length Lg of 0.15 µm, comparison between a drivability in the case of a gate film using $SiO_2$ film and a drivability in the case of a gate film using a nitride oxide film, i.e., comparison of the gate voltage dependency of the drain current in both cases was conducted. In both cases, B doped polysilicon is used for the gate.

Figure 12:
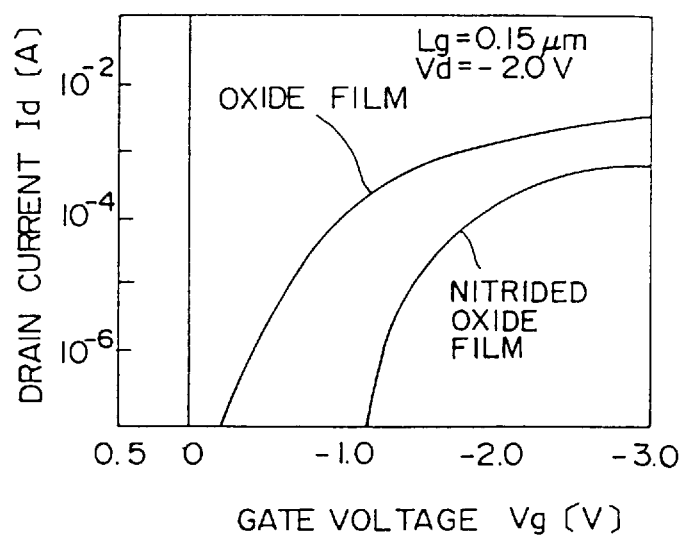
FIG. 12 is a graph showing the result obtained by comparison between a gate voltage dependency of a drain current using a SiO2 film as a gate film and that using a nitride oxide film as the gate film.

From FIG. 12, it is seen that, in the case of the gate film using the $SiO_2$ film, the threshold voltage Vth is lowered because the substrate surface concentration is lowered by penetration of boron, and depletion takes place resulting from lowering of the concentration at the gate film interface of B doped polysilicon, resulting in an increased S-factor.

In forming source and drain regions according to this invention, solid phase diffusion from boron silicate glass having a boron concentration of $4 \times 10^{21} cm^{-3}$ (18 mol %) into the substrate is carried out. The examined result of the temperature/time dependency of the pre-treatment and the high temperature and short time heat treatment of the solid phase diffusion is indicated below.

First, the evaluated result of the pre-treatment dependency is shown.

The profile of boron in the substrate in the cases where the treatment of hydrochloric peraqueous system is carried out and dilute hydrofluoric acid (0.5%) treatment is carried out as the pre-treatment for two minutes is shown in FIG. 13. In both cases, diffusion is conducted under the condition of the high temperature and short time heat treatment of 1000° C. and 15 seconds. Only a slight difference between a depth where the surface concentration reaches $1 \times 10^{18} cm^{-3}$ and a depth where the boron concentration reaches $1 \times 10^{18} cm^{-3}$ can be observed. However, when attention is drawn to the total implanted amount, there results a higher concentration in the case where the dilute hydrofluoric acid treatment is conducted. One can understand the reason if attention is drawn to the fact that an oxide film is not removed on the substrate surface by the hydrochloric peraqueous system treatment. The diffusion process of boron when an oxide film exists at the interface between the substrate and a boron-silicate glass is considered as follows. Namely, at the initial time of the heat treatment, boron is diffused into the substrate through the oxide film, so such boron is not so implanted thereinto. When the concentration of boron in the oxide film increases to become equal to that of boron in the boron-silicate glass, the implanted amount becomes large.

After the dilute hydrofluoric acid treatment, even if the treated substrate is rinsed with pure water of dissolved oxygen of 5 ppb for 30 minutes, any change of the profile of boron is not observed as compared to that in the case of the treated substrate which does not undergo rinsing with water. The reason why such a phenomenon occurs is considered as follows. Namely, with respect to the fact that there is no natural oxide film because dissolved oxygen is sufficiently less, so no oxide film is formed during rinsing, there is no difference between the treatment using rinsing and the treatment using no rinsing. In the case where no rinsing is carried out, boron terminates on the surface, thus preventing the surface from being oxidized at a substrate temperature of 450° C. at the time of an APCVD process. In contrast, even in the case where rinsing is carried out with pure water including less dissolved oxygen quantity, oxygen terminates on the surface, thus obtaining similar effects.

The heat process condition dependency of the solid phase diffusion as described above will be indicated below.

Figure 15A:
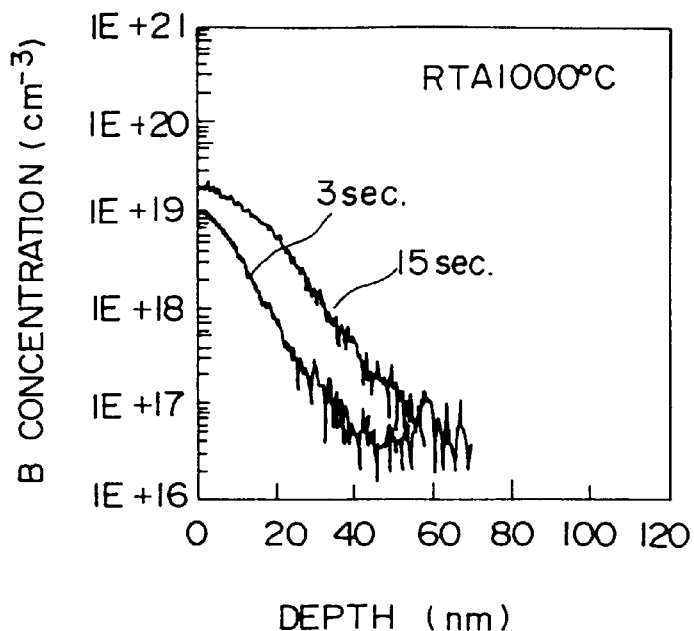
FIGS. 15A and 15B are graphs each showing a profile when time is changed under the condition where temperature is constant.
Figure 15B:
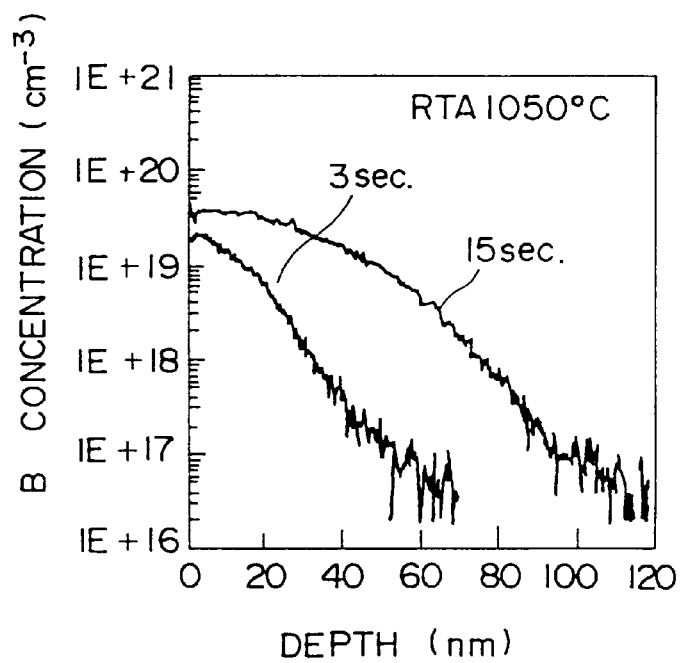
Figure 16:
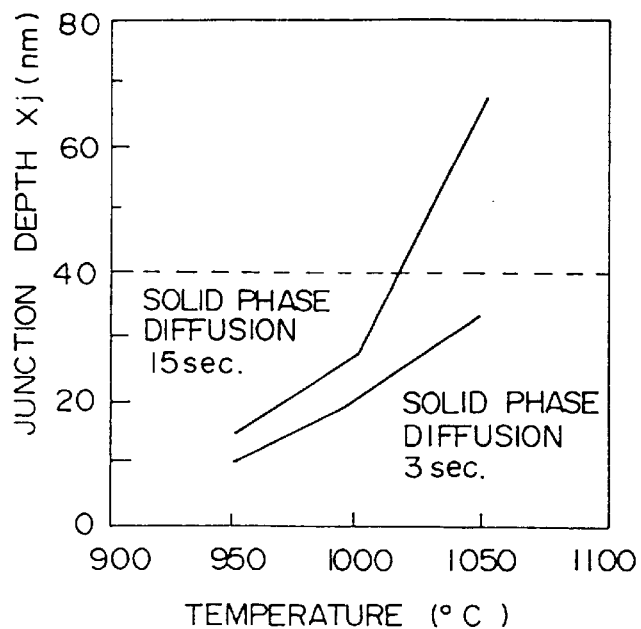
FIG. 16 is a graph showing a heat process condition dependency of the junction depth Xj.
Figure 17:
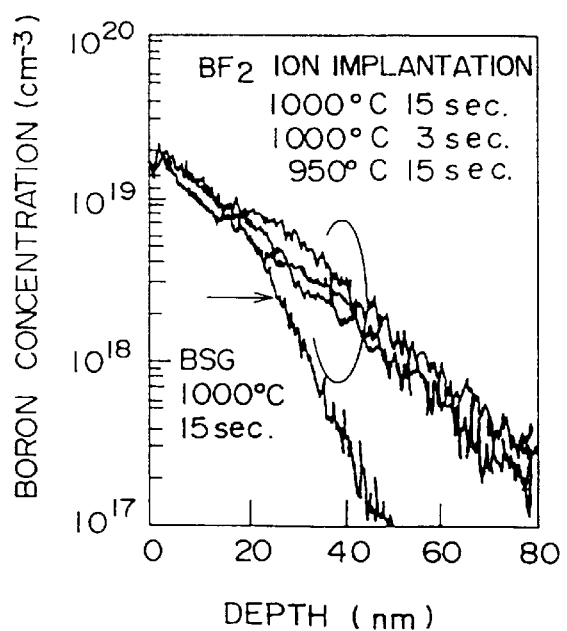
FIG. 17 is a graph showing a profile in the case where a high temperature and short time heat treatment has been conducted after ion implantation.

The heat process condition dependency of the high temperature and short time heat treatment of the profile of boron in the substrate after the solid phase diffusion from boron-silicate glass is shown in FIGS. 14, 15A–B, and 16. FIG. 14 shows a profile of temperatures of 950° C., 1000° C. and 1050° C. when the time is set to 3 seconds. FIG. 15A shows a profile of times of 3 and 15 seconds when the temperature is set to 1000° C. FIG. 15B shows a profile of times of 3 and 15 seconds when the temperature is set to 1050° C. The heat process condition dependency of the junction depth Xj is shown in FIG. 16. By taking into consideration the above-mentioned results and the heat process required for which ion-implanted impurity for forming the first diffused layer on the outside of the side wall is activated, the heat process condition of the solid phase diffusion from boron-silicate glass in the trial manufacture of the device was such that the temperature is 1000° C. and the time is 15 seconds. Further, the profile where high temperature and short time heat treatment is carried out after implementation of ion implantation ($BF_2$, 15 KeV, $4 \times 10^{13} cm^{-2}$) is shown in FIG. 17. In the activation by ion implantation and high temperature and the short time heat treatment, it is seen that it is difficult to form a diffused layer shallower than that by the solid-phase diffusion from boron-silicate glass.

FIGS. 18A–18D show a third manufacturing process and a device structure of an n-channel MOSFET obtained by that manufacturing process.

Figure 18A:
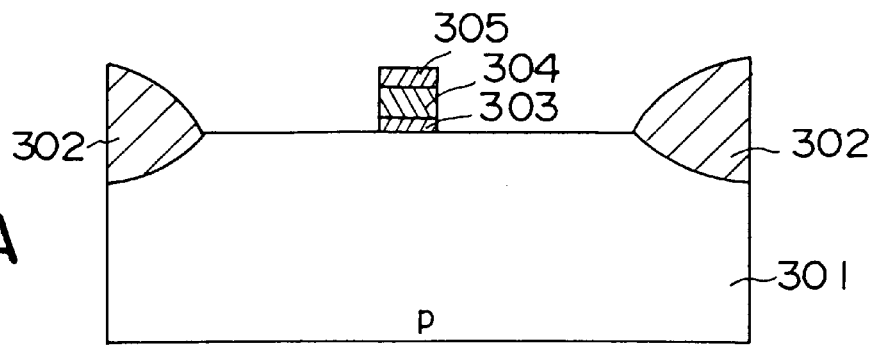
FIGS. 18A–18D are device cross sectional views every respective process steps showing a third manufacturing process according to this invention and a device structure of an n-channel MOSFET obtained by that manufacturing process.

First, by a process similar to the above, a field oxide film 302 and a gate electrode comprised of a gate oxide film 303, a polysilicon film 304 and a silicon oxide film 305 are formed on a silicon substrate 301 (FIG. 18A).

Figure 18B:
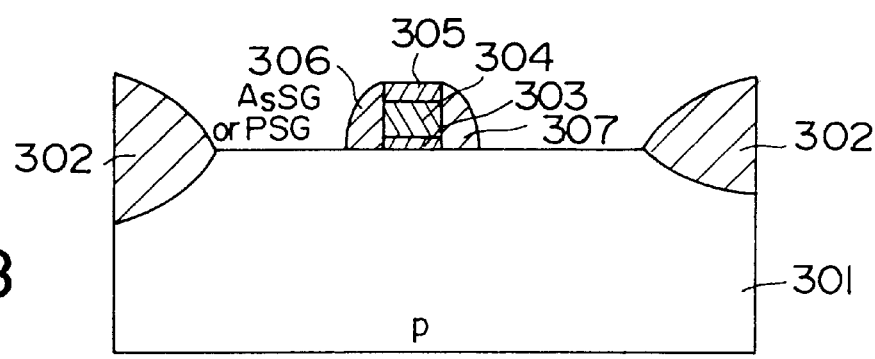

Thereafter, an AsSG film (As concentration 10%) is formed on the entire surface of the substrate 301 by using the LPCVD process to form AsSG film side walls 306, 307 on the both side surfaces of the gate electrode by the RIE process (FIG. 18B).

Figure 18C:
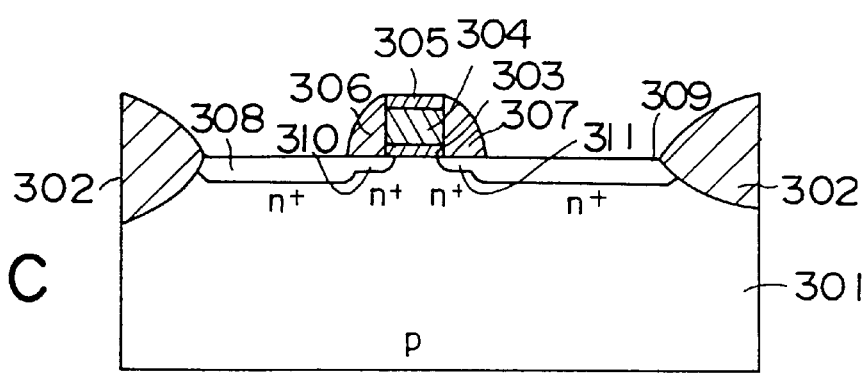

Then, impurity As is ion-implanted into the entire surface of the substrate 301 under the condition of a dose of $3 \times 10^{15} cm^{-2}$ and an acceleration energy of 30 KeV. Further, RTA process is carried out under the condition of 1050° C. and 1 minute to carry out activation of impurity. By heat in RTA, impurity in the AsSG film side walls 306, 307 is diffused into the substrate 301. As a result, shallow diffused layers are formed below the AsSG film side walls 306, 307. Thus, deep diffused layers 308, 309 serving as source and drain regions are formed, and shallow diffused layers 310, 311 are formed on the channel formation region sides of the both diffused layers 308, 309. With respect to these shallow diffused layers 310, 311, a distribution in a depth direction having a carrier concentration of $1 \times 10^{18} cm^{-3}$ at the depth of 0.04 μm from the substrate 301 surface and a carrier concentration of $5 \times 10^{18} cm^{-3}$ at the peak position is obtained (FIG. 18C).

Figure 18D:
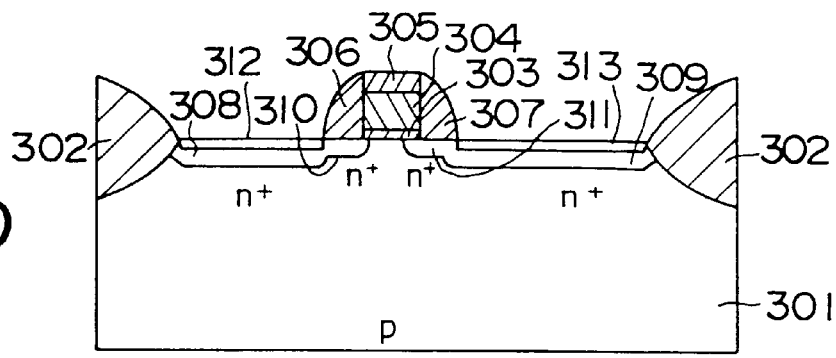

Thereafter, by carrying out a salicide process similar to that of the above-mentioned embodiments, metal silicide films 312, 313 are formed on the source and drain regions (FIG. 18D).

It is to be noted that it is needless to say that a PSG film may be used in place of the AsSG film.

FIGS. 19A–19D show a manufacturing process and a device structure in the case where the third method is similarly applied to a p-channel MOSFET.

Figure 19A:
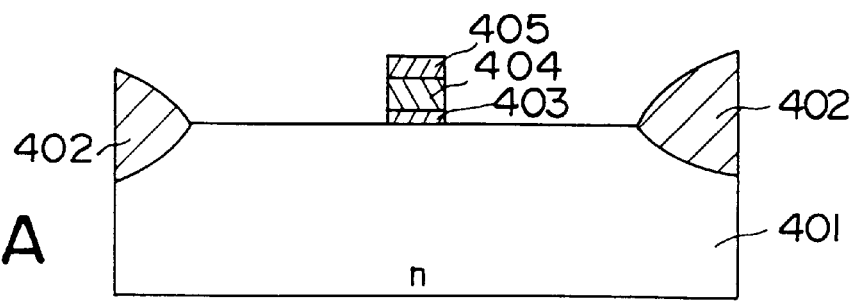
FIGS. 19A–19D are device cross sectional views every respective process steps showing a manufacturing process in the case where the third manufacturing process is applied to a p-channel MOSFET and a device structure obtained by that manufacturing process.

First, in this figure, by a process similar to that of the above-described embodiment, a field oxide film 402 and a gate electrode comprised of a gate oxide film 403, a polysilicon film 404 and a silicon oxide film 405 are formed on a silicon substrate 401 (FIG. 19A).

Figure 19B:
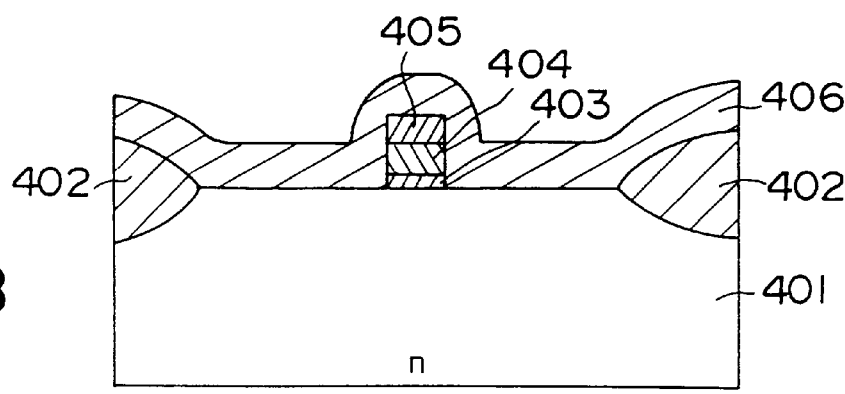

Thereafter, a BSG film 406 is deposited on the entire surface of the substrate by the CVD process in the case of the p-channel MOSFET (FIG. 19B).

Figure 19C:
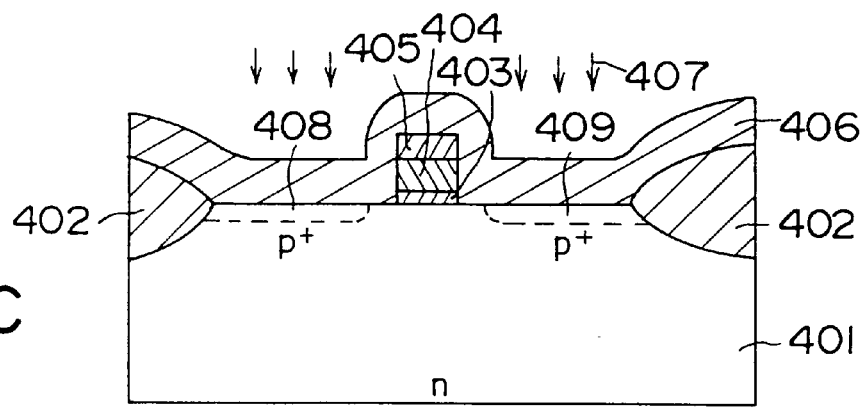

Subsequently, in the case where the film thickness of the BSG film is assumed to be 1000 angstroms, $B^+$ ions 407 are implanted at an acceleration voltage of 35 KeV. Thus, ions which have been penetrated through the BSG film 406 are implanted into the substrate 401. As a result, an ion implanted region 408 serving as a source region and a ion implanted region 409 serving as a drain region are formed. At this time, the regions having a width of 0.09 μm on the both sides of the gate electrode are masked because the BSG film 406 is thickened with respect to the ion implantation direction, and do not undergo ion implantation (FIG. 19C).

Figure 19D:
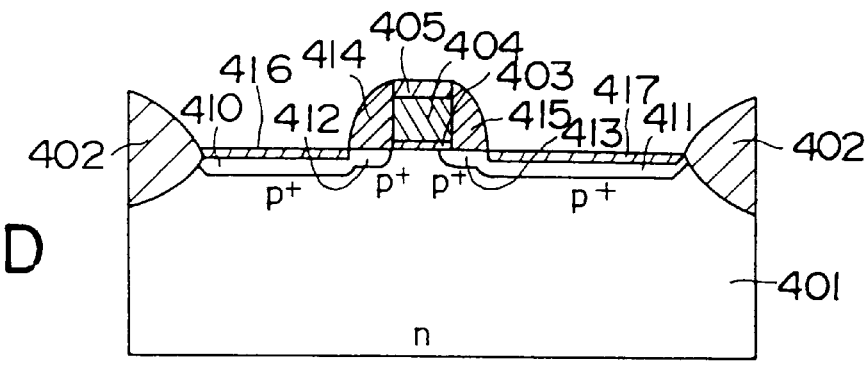

Thereafter, heat treatment of high temperature and short time (1000° C., 15 seconds) by the RTA process is applied to thereby form diffused layers 410, 411 of the source and drain regions. By this RTA process, on the both surfaces of the gate electrode, the peak concentration becomes equal to $5 \times 10^{18} cm^{-3}$ and the depth becomes equal to 0.04 μm. On the other hand, in the region away from the both surfaces of the gate by more than 0.09 μm, the peak concentration becomes equal to $3 \times 10^{20} cm^{-3}$ and the depth becomes equal to 0.1 μm. Thereafter, BSG film side walls 414, 415 are caused to be left by the RIE process to carry out the salicide process to thereby form metal silicide films 416, 417 on the source and drain diffused layers 410, 411 (FIG. 19D).

FIG. 20A–20D are device cross sectional views every respective process steps showing a fourth manufacturing process according to this invention and a device structure of a P-channel MOSFET obtained by that manufacturing process.

Figure 20A:
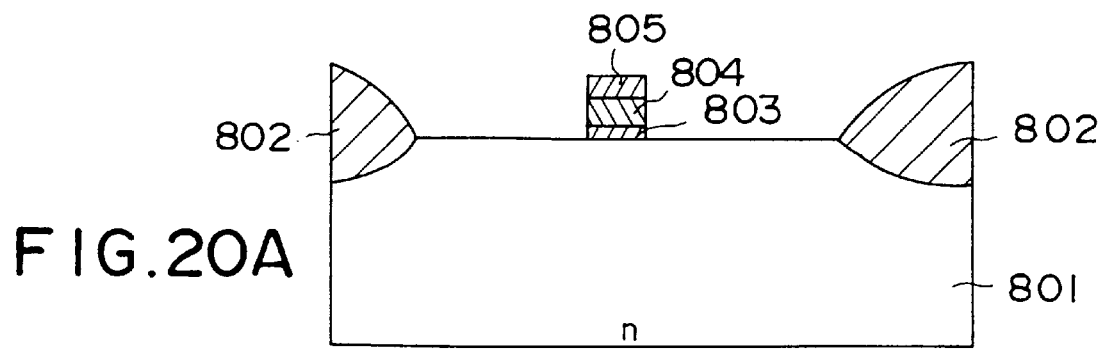
FIGS. 20A–20D are device cross sectional views every respective process steps showing a fourth manufacturing process according to this invention and a device structure of a P-channel MOSFET obtained by that manufacturing process.

First, in this figure, by a process similar to that of the above-mentioned embodiment, a field oxide film 802, and a gate electrode comprised of a gate oxide film 803, a polysilicon film 804 and an oxide film 805 are formed on a silicon substrate 801 (FIG. 20A).

Figure 20B:
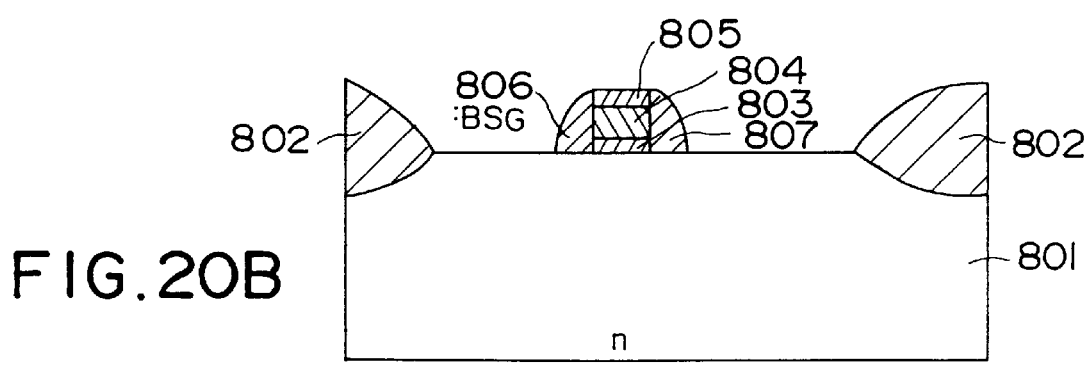

In the subsequent process step, because the device to be manufactured is a P-channel MOSFET, side walls 806, 807 by BSG film are formed on the side portions of the gate electrode (FIG. 20B).

Figure 20C:
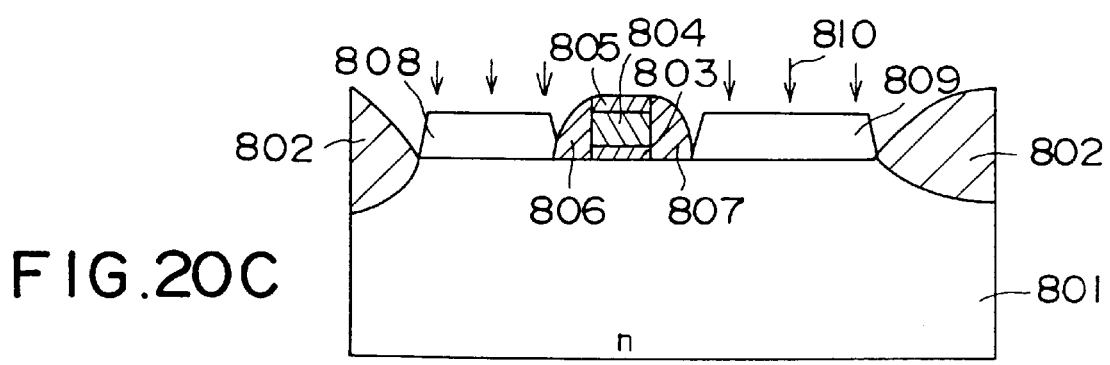

Subsequently, silicon is selectively epitaxially grown on the exposed portion where field oxide film 802, gate oxide film 803, polysilicon film 804 and oxide film 805, and side walls 806, 807 on the substrate 801 do not exist to form epitaxially grown films 808, 809 (FIG. 20C).

Figure 20D:
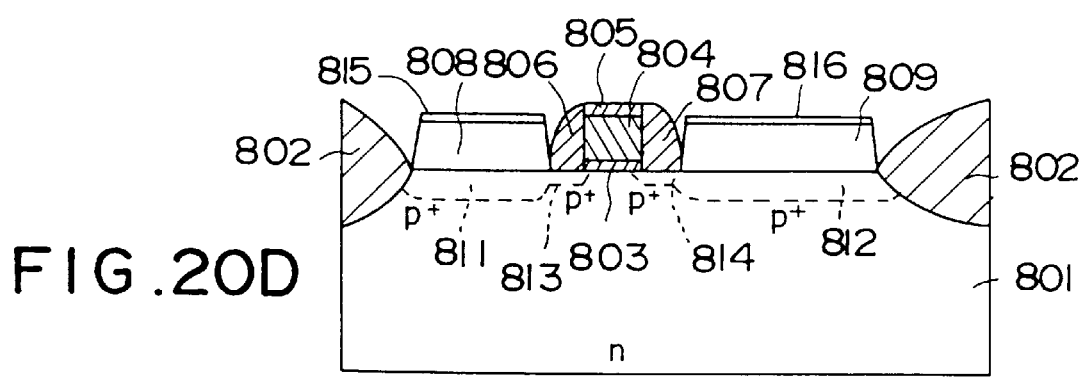
Figure 21:
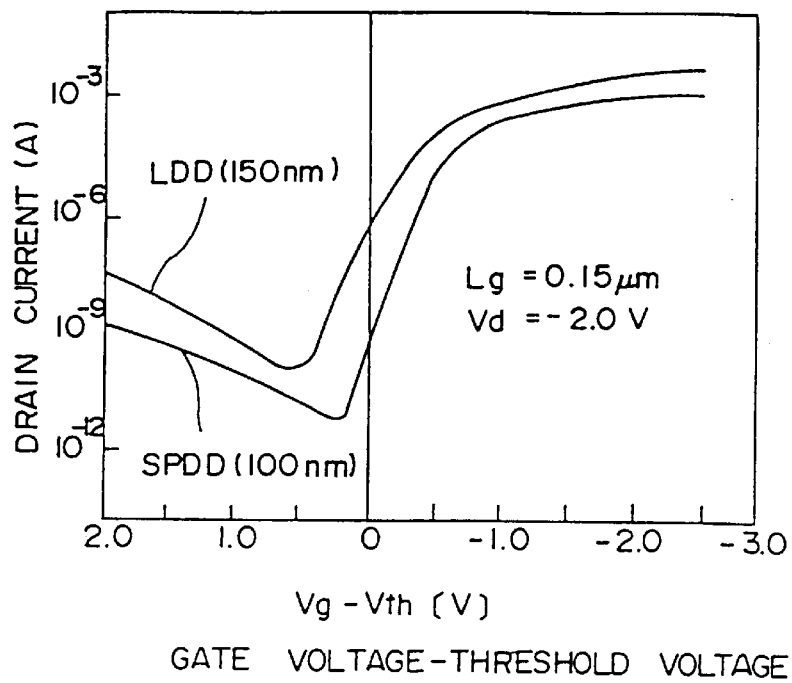
FIG. 21 is a graph showing comparison between a sub-threshold characteristic in the SPDD structure of this invention and that in the LDD structure of this invention.

Thereafter, impurity ions 801 are implanted to carry out the treatment by the RTA process to thereby form, at the same time, diffused layers 811, 812 by ion implantation and diffused layers 813, 814 by solid phase diffusion from the side walls 806, 807. The diffused layers 811–814 thus formed satisfy the requirement of this invention. Namely, the diffused layers 813, 814 serve as a second diffused layer, and are formed as a shallow diffused layer which can avoid the short-channel effect. On the other hand, the diffused layers 811, 812 serve as a first diffused layer, and are formed as a relatively deep diffused layer which can avoid an increase of a leakage current followed by current consumption of the substrate 801. Thereafter, by carrying out a salicide process, metal silicide films 815, 816 serving as source and drain electrodes are formed on the surface portions of the epitaxially grown films 808, 809 (FIG. 20D).

It is to be noted that introduction of impurity into the epitaxially grown film to form the first diffused layer may be carried out by any other method except for ion implantation. For example, impurity may be doped at the same time in carrying out epitaxial growth.

While explanation has been given in connection with the p-channel MOSFET, it is needless to say that the process applied thereto may be employed for the n-channel MOSFET. In that case, it is required to use an AsSG film or a PSG film in place of the BSG film.

It is to be noted that, in the case of the n-channel MOSFET, as apparent from the fact described in the above-mentioned third embodiment, an AsSG film or a PSG film is used, and an n-type impurity such as As or P, etc. is used as an ion species of ion implantation. In addition, it should be noted that the fine condition such as temperature or time, etc. is not limited to the above.

The structure and the manufacturing process of the p-channel MOSFET and the n-channel MOSFET according to this invention have been described above. The evaluated results of these performances are shown below.

The following result was obtained in connection with the short-channel effect which greatly affects the performance of a semiconductor element.

The sub-threshold characteristic when the drain voltage Vd is −2 volts in the SPDD structure and the LDD structure of this invention having a gate length Lg of 0.15 μm is shown in FIG. 15. The threshold voltage Vth is defined as a gate voltage when a drain current of 1 μA flows, and the abscissa represents a value obtained by subtracting the threshold voltage Vth in the long channel from the gate voltage. With respect to the LDD structure, an increase of the S-factor and an increase of Vth shift (ΔVth) by the short-channel effect appear. In contrast, with the structure of this invention, it is seen that the short-channel effect hardly appears. Further, since post-oxidation process is not carried out, a large leakage current on the OFF side (in the region where the gate voltage is positive) can be observed. In this case, however, a larger leakage current flows in the case of the LDD structure. This is because the overlap length of the gate, source and drain diffused layers in the case of the LDD structure is longer than that in the case of the SPDD structure, so the interband tunneling current increases.

Figure 22:
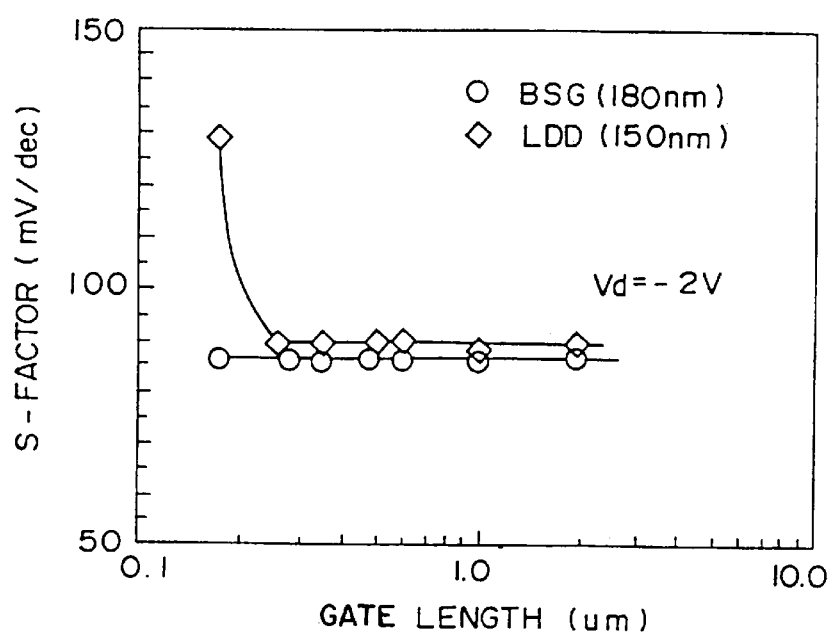
FIG. 22 is a graph showing a gate length dependency of the S-factor.

The gate length dependency of S-factor is shown in FIG. 22, and the gate length dependency of the threshold voltage shift quantity ΔVth when the drain voltage is −2 volts is shown in FIG. 23. With respect to the LDD structure, ΔVth and S-factor increase at the gate length of 0.15 μm. In contrast, it is seen that an employment of the structure (BSG) of this invention can substantially completely suppress the short-channel effect. From this fact, it is considered that Xj of the low concentration diffused layer by the solid phase diffusion from the boron silicate glass side wall is formed considerably shallow.

The evaluated result relating to the hot carrier characteristic is now indicated below.

Figure 24A:
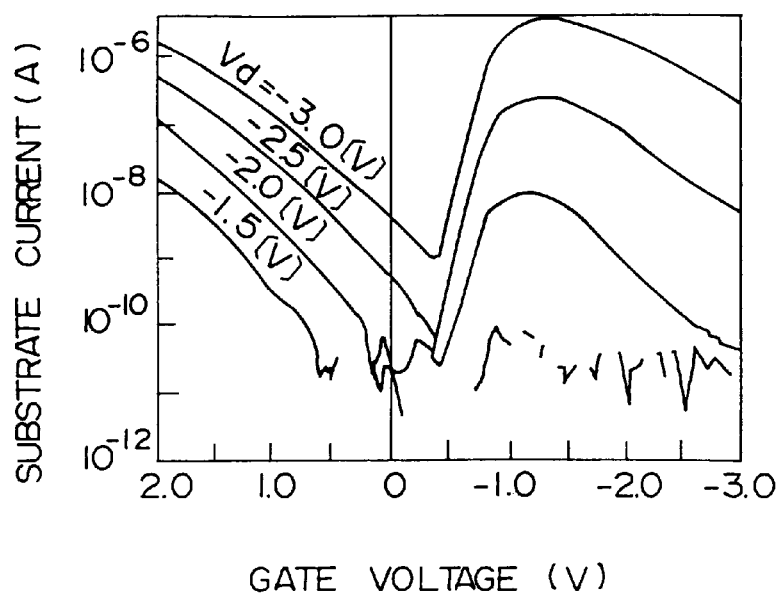
FIGS. 24A and 24B are graphs each showing a gate voltage dependency of a substrate current.
Figure 24B:
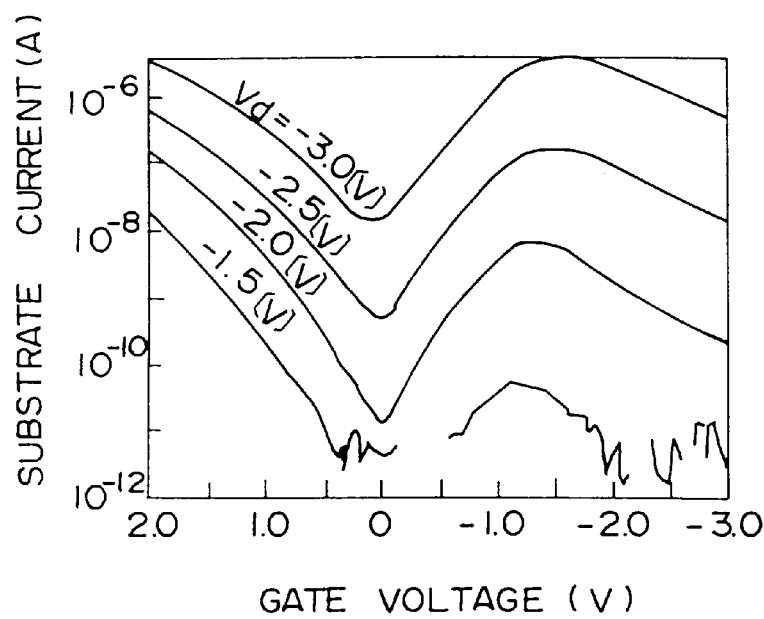

The gate voltage dependency of a substrate current with respect to the structure of this invention in which the boron silicate glass side walls having a width of 1000 angstroms are formed is shown in FIG. 24A, and the gate voltage dependency of a substrate current with respect to an ordinary LDD structure is shown in FIG. 24B. Here, the substrate current is defined as a flow into the substrate of electrons occurring at the time of impact ionization in a high electric field region in the vicinity of the drain. The LDD structure has a substrate current greater by one order than that of the structure of this invention, and has a relatively small gate voltage dependency.

Figure 25A:
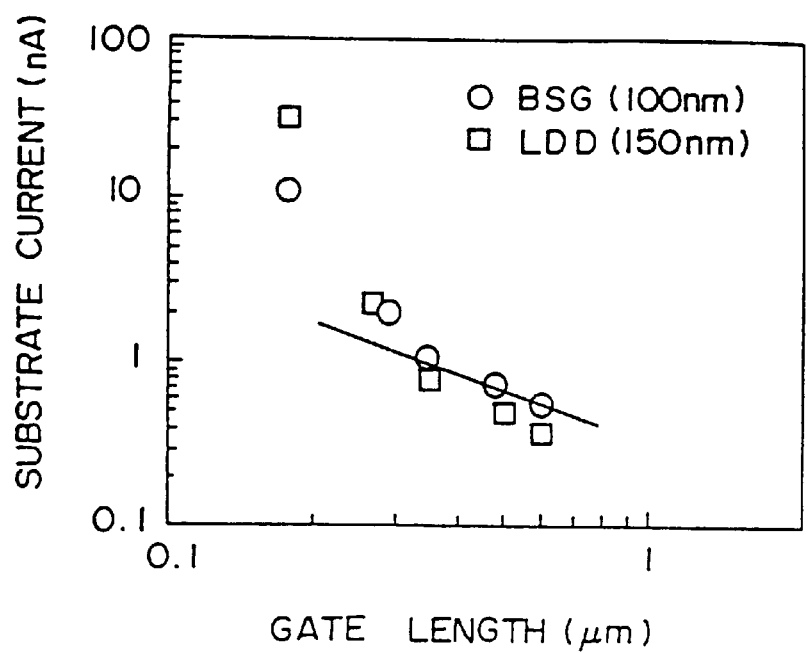
FIG. 25A is a graph showing a gate length dependency of a substrate current when the drain voltage current is fixed.
Figure 25B:
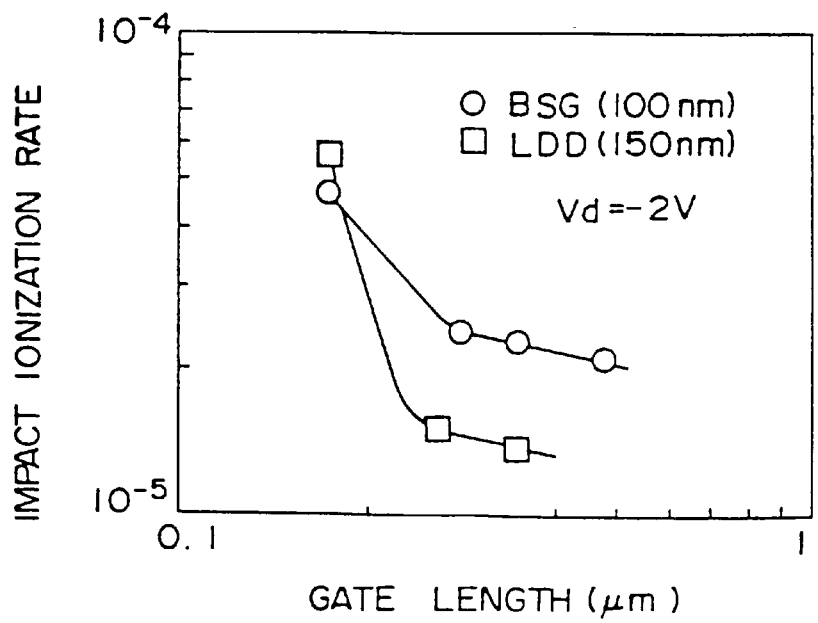
FIG. 25B is a graph showing a gate length dependency of an ion impact ionization rate.

The gate length dependency of a substrate current when the drain voltage is set to −2 volts is shown in FIG. 25A, and the gate length dependency of the impact ionization factor is shown in FIG. 25B. It is seen from these figures that according as the gate length becomes shorter, the impact ionization factor and the substrate current abruptly increase by an increase in the electric field strength at the drain end. When comparison between a substrate current in the case of a gate length of 0.25 μm and a substrate current in the case of a gate length of 0.15 μm is made, a substrate current increases about five times in the case of the structure of this invention and a substrate current increases about twenty times in the case of the LDD structure.

An example of a shift of the threshold voltage Vth after undergoing application of a stress for 100 seconds at a drain voltage of −3.5 volts is shown in FIG. 26. In the structure of this invention (BSG (100 nm)), the shift of the threshold voltage Vth indicates a positive broad peak in a range from the gate voltage of −0.5 volts to the gate voltage where the gate current takes a maximum value, i.e., electrons are injected into the gate. Further, it is seen that, in the region where the gate voltage is more than −1.3 volts, i.e., the gate current indicates flow into the gate of positive holes, the shift of the threshold voltage Vth indicates a negative value. If an interpretation is employed such that Vth is shifted as the result of the fact that carries are trapped into the gate film at the same time of injection of carriers into the gate, the above-mentioned phenomenon can be understood. A shift of Vth in the LDD structure is greater than that in the structure of this invention in a measurement range. Further, it is seen that even if the gate voltage is positive, i.e., the MOSFET is in an OFF state, any shift of Vth takes place, resulting in a deteriorated threshold voltage. It is considered that such a phenomenon takes place resulting from an off-leakage current, i.e., injection of electrons into the gate produced in the overlap region of the drain.

The gate voltage dependency of a change in a charge pumping current is shown in FIG. 27. The stress condition is the same as the measurement condition of FIG. 26. As apparent from FIG. 27, a charge pumping current varies to much degree at a gate voltage more than −1.2 volts, i.e., at a gate voltage where the gate current takes a negative value (injection of positive holes into the gate takes place), and the shift of Vth indicates a negative value. This indicates that many traps are formed at the interface between the substrate and the gate film under the condition where positive holes generated by impact ionization are injected into the gate, i.e., traps are formed by injection into the gate of positive holes. Further, the negative shift of Vth suggests the effect by trapping of positive holes into the gate film and the surface potential. In addition, it is observed that the surface potential increases in the OFF region. It is considered that such a phenomenon takes place by a mode (injection of electrons into the gate) similar to that of deterioration of Vth.

Figure 28A:
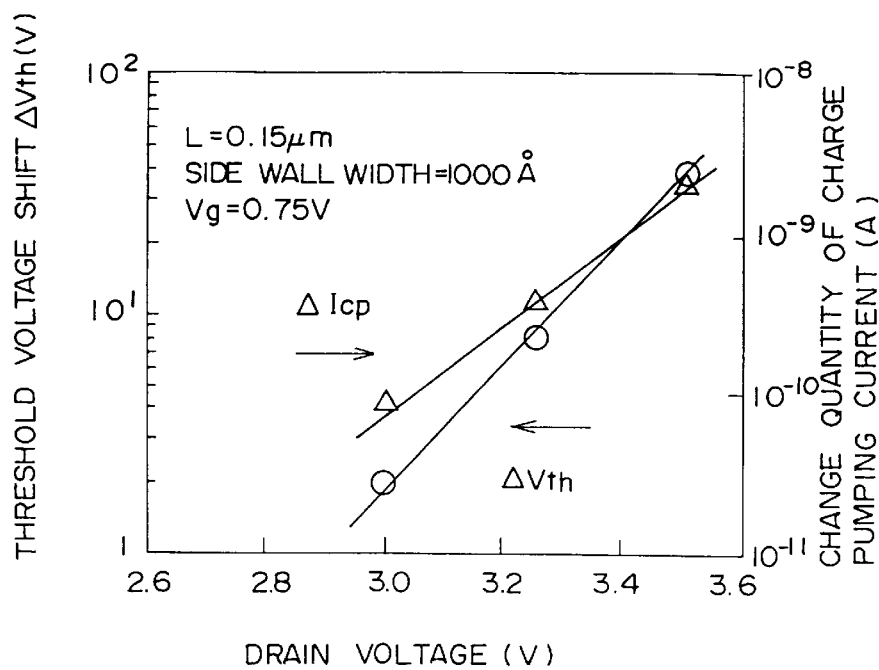
FIG. 28A is a graph showing a drain voltage dependency at stress application of a shift of the threshold voltage Vth and a change of a charge pumping current.
Figure 28B:
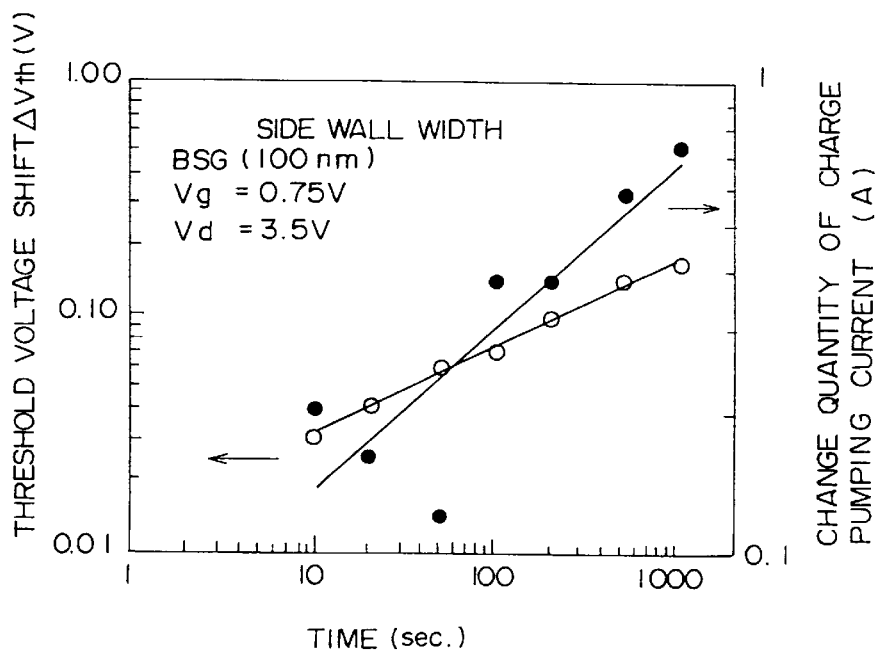
FIG. 28B is a graph showing a stress time dependency of the threshold voltage Vth.

In actual device characteristic, the condition where the shift of Vth is negative is considered to be important. Under this recognition, prediction of the life time of the device was conducted. The drain voltage dependency of a shift of Vth and a change of a charge pumping current are shown in FIG. 28A, and the stress time dependency is shown in FIG. 28B. In these figures, the gate voltage is a voltage when the shift of Vth indicates the peak. The stress time in FIG. 28A is 1000 seconds, and the drain voltage in FIG. 28B is −3.5 volts. Both characteristics indicate a dependency of power as fitted. It is observed that the shift of the threshold voltage Vth was 20 mV for ten years in the prior art, whereas the shift of the threshold voltage Vth was about 3.4 mV for ten years in this invention.

[Second Embodiment]

A method of manufacturing a FET according to a second invention will now be described with reference to FIGS. 29A–29K.

Figure 29A:
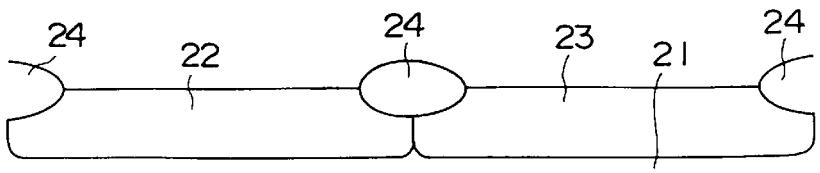
FIGS. 29A–29K are device cross sectional views every respective process steps showing a method of manufacturing a FET according to this invention.

First, as shown in FIG. 29A, e.g., B ions are implanted into a P well formation region of a P-type silicon substrate 21 under the condition of an acceleration voltage of 100 KeV and a dose of $2.0 \times 10^{13} \text{cm}^{-2}$ thereafter to implant, e.g., P ions into an N well formation region under the condition of an acceleration voltage of 160 KeV and a dose of $6.4 \times 10^{12} \text{cm}^{-2}$ thereafter to undergo heat process of 1190° C. and 150 minutes to thereby form a P well region 22 and an N well region 23. Subsequently, a device isolation region 24 is formed by the LOCOS process.

Figure 29B:
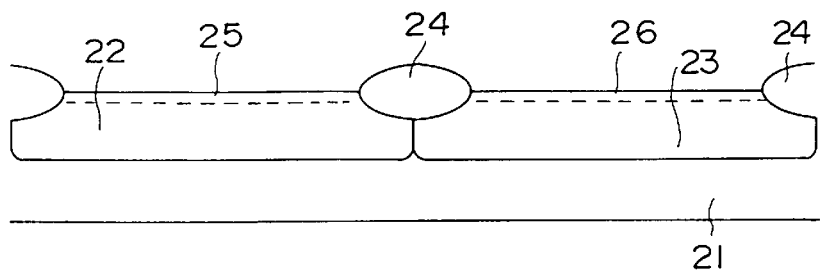

Then, as shown in FIG. 29B, e.g., B ions 25 are first implanted into the P well region 22 under the condition of an acceleration voltage of 15 eV and a dose of $1.0 \times 10^{13} \text{cm}^{-2}$ for the purpose of obtaining a desired threshold voltage to thereby adjust the concentration of the channel surface thereafter to implant, e.g., P ions 26 into the N well region 23 under the condition of an acceleration voltage of 120 KeV and a dose of $1.0 \times 10^{13} \text{cm}^{-2}$ for the purpose of obtaining a desired threshold voltage to subsequently implant As ions 26 under the condition of an acceleration voltage of 40 KeV and a dose of $2.5 \times 10^{13} \text{cm}^{-2}$ to thereby adjust the concentration of the channel surface.

Figure 29C:
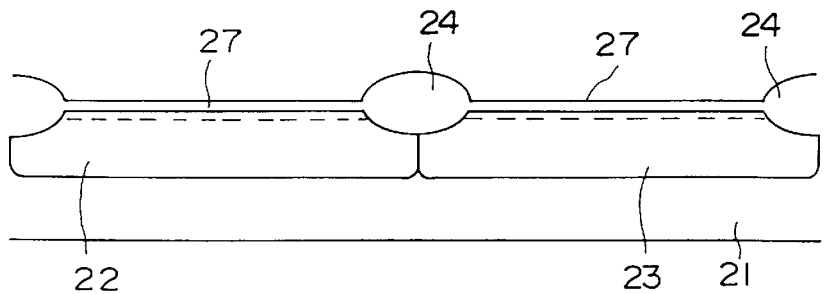

As shown in FIG. 29C, the surface of the silicon substrate 21 is then oxidized, e.g., in the atmosphere of 10% HCl oxygen at 750° C. to thereby form an oxide film 27 having a thickness of 4 nm.

Figure 29D:
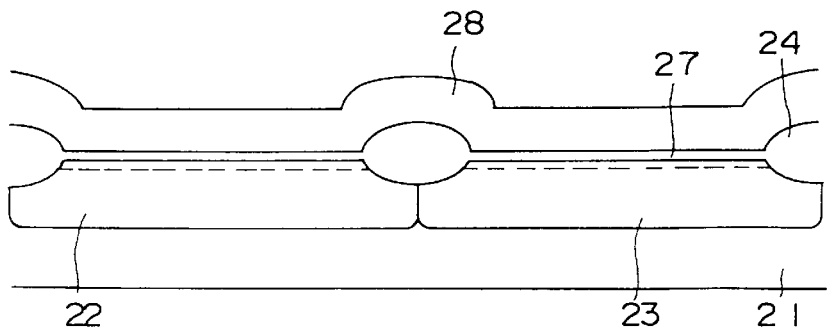

Next, as shown in FIG. 29D, a polysilicon film 28 having a thickness of 200 nm is deposited on the silicon oxide film 27, e.g., by the LPCVD process. Thereafter, e.g., As ions are implanted into the N-channel FET region under the condition of an acceleration voltage of 40 KeV and a dose of $3.0 \times 10^{15} \text{cm}^{-2}$ to implant, e.g., $BF_2$ ions into the P-channel FET region under the condition of an acceleration voltage of 35 KeV and a dose of $1.0 \times 10^{15} \text{cm}^{-2}$.

Figure 29E:
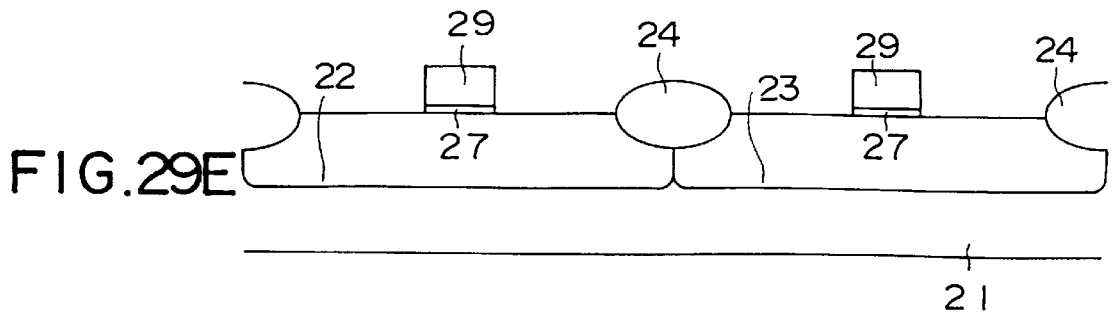

As shown in FIG. 29E, the polysilicon film 28 is then etched, e.g., by the RIE process to form gate electrodes 29.

Figure 29F:
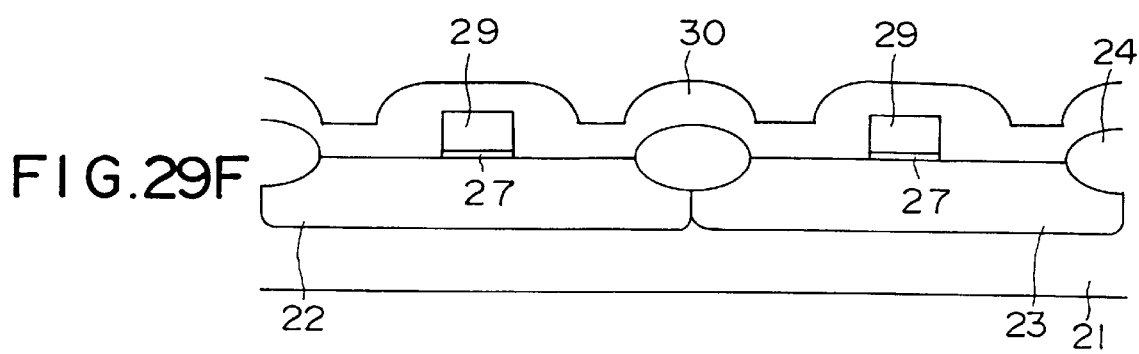

Then as shown in FIG. 29F, a BPSG 30 having a thickness of 100 nm is deposited on the entire surface of the silicon substrate 21, e.g., by the LPCVD process.

Figure 29G:
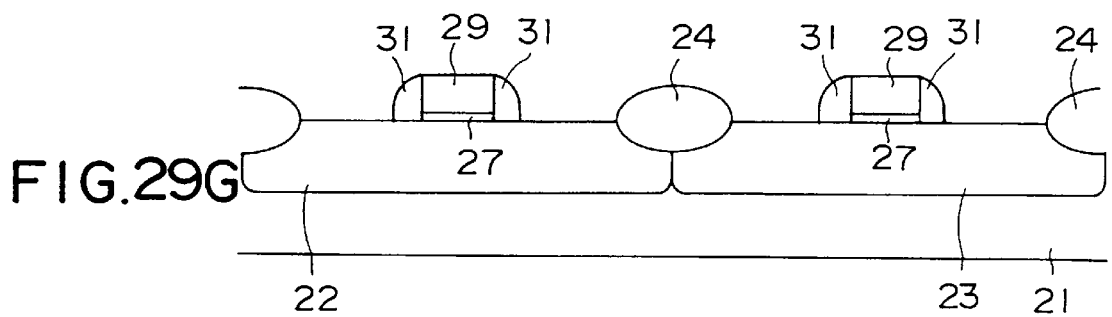

As shown in FIG. 29G, anisotropic etching, e.g., RIE process, etc. is then implemented to thereby form BPSG side walls 31.

Figure 29H:
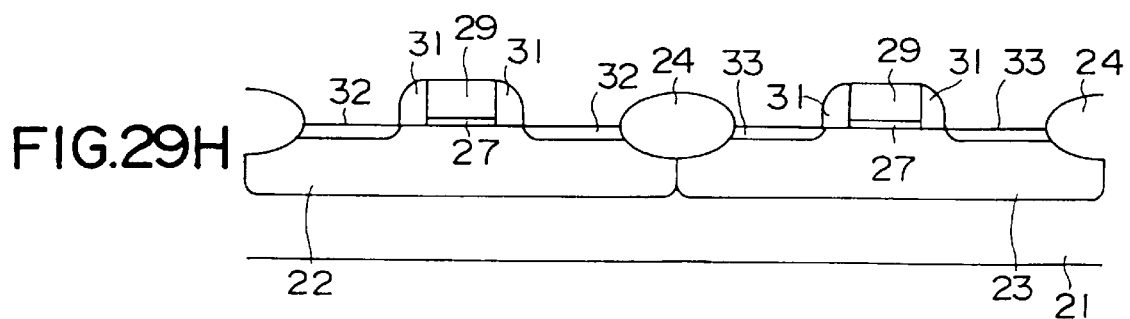

Next, as shown in FIG. 29H, e.g., As ions 32 are implanted into the source and drain formation regions of the N-channel FET under the condition of an acceleration voltage of 50 Kev and a dose of $5.0 \times 10^{15} \text{cm}^{-2}$. Then, e.g., $BF_2$ ions 33 are implanted into the source and drain formation regions of the P-channel FET under the condition of an acceleration voltage of 35 eV and a dose of $3.0 \times 10^{15} \text{cm}^{-2}$.

Figure 29I:
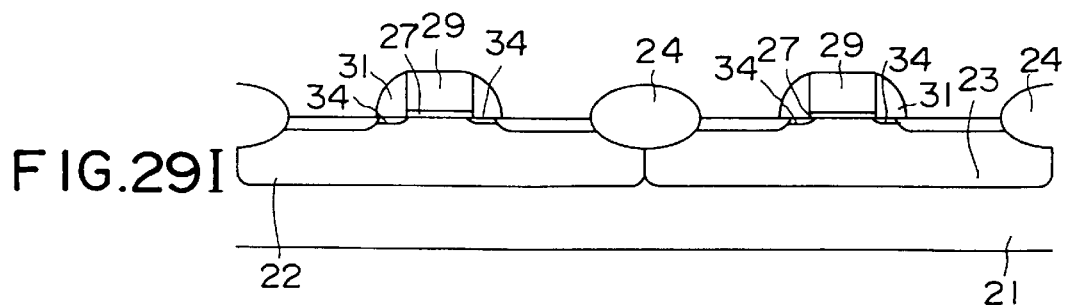

Thereafter, as shown in FIG. 29I, e.g., heat process of 950° C. and 10 seconds is applied to thereby activate the As ions and the $BF_2$ ions implanted in the former process steps, and to allow B ions and P ions 34 to be diffused into the regions below the side walls by the solid phase diffusion. At this time, the concentration of B ions in the BPSG is caused to be higher than the concentration of P ions, whereby the concentration of B ions higher than the concentration of P ions is obtained in the region below the side walls.

Figure 29J:
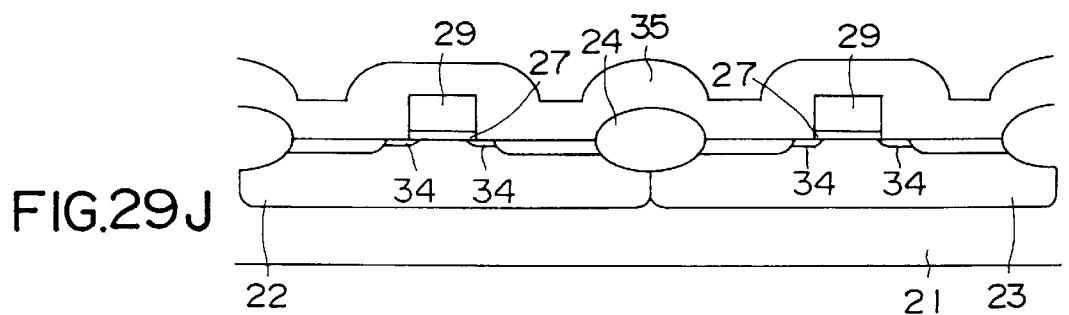

Then, as shown in FIG. 29J, e.g., a treatment of the dilute hydrofluoric acid system is first implemented to thereby peel off the BPSG side walls 31. Thereafter, an oxide silicon 35 having a thickness of 100 nm is deposited on the entire surface of the silicon substrate, e.g., by the LPCVD process.

Figure 29K:
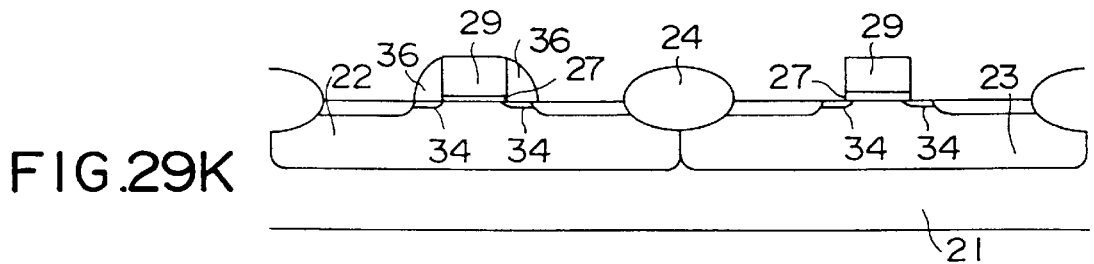

Then, as shown in FIG. 29K, anisotropic etching, e.g., RIE process, etc. is implemented to form oxide silicon side walls 36 only on the n-channel region and a treatment of e.g. dilute hydrofluoric acid system is implemented to thereby peel off the oxide silicon 35 only in the P-channel FET region.

Then, e.g., heat process of 950° C. and 10 seconds is applied. Here, the ratio between the concentration of B and P ions in the silicon oxide side walls 36 of the N-channel FET and the concentration of B and P ions in the substrate is determined by the segregation factor. In the case where two kinds of media A and B exist in a contact manner and a third material C is dissolved in the media A and B, in the thermal equilibrium state, the ratio between the concentration of C on the A side at the boundary surface between A and B and the concentration of C on the B side at the boundary surface between A and B is a constant value. This constant value is called a segregation factor. In accordance with an experiment, the segregation factor of P is about 10, and the segregation factor of B is about 0.3. Accordingly, B ions are drawn out by the heat process at the portions below the oxide silicon side walls 36 of the N-channel FET region, so the concentration of B ions is higher than that of P ions.

At times subsequent thereto, after undergoing an interconnection process, etc. in a manner similar to that of manufacturing of a conventional semiconductor device, a semiconductor device is constituted.

While, in the above-mentioned process, the BPSG side walls of the N-channel FET region and the P-channel FET region are peeled off by the treatment of the dilute hydrofluoric acid system, process steps subsequent thereto may be carried out while the BPSG side walls of the P-channel FET region are left as they are.

In this instance, in carrying out heat process to draw out B ions in the N-channel FET region from the silicon oxide side walls, B ions can be diffused at the same time from the BPSG side walls in the p-channel FET region.

[Third Embodiment]

By a process similar to that of the second embodiment, gate electrodes are formed within the P well formation region and the n well formation region of the silicon substrate 21.

Figure 30A:
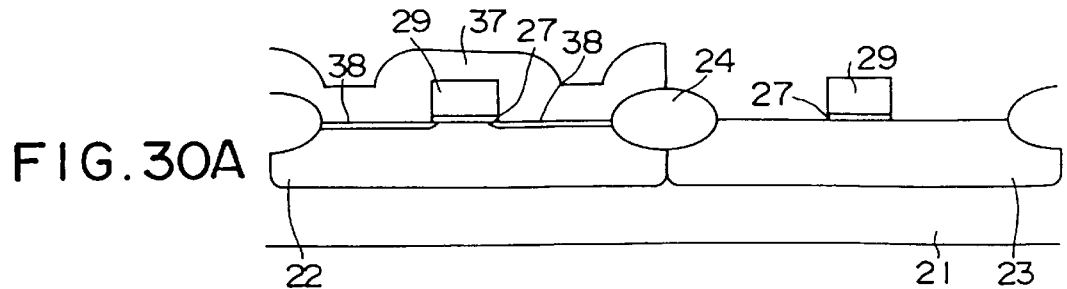
FIGS. 30A–30D are device cross sectional views every respective process steps showing a method of manufacturing a FET according to this invention.

Then, as shown in FIG. 30A, an AsSG film 37 having a thickness of 100 nm is formed, e.g., by the LPCVD process on the silicon substrate 21.

Thereafter, e.g., a treatment of the dilute hydrofluoric acid system is implemented to thereby remove the AsSG film 37 only in the P-channel FET region.

Then, e.g., a heat process of 950° C. and 10 minutes is applied to thereby allow As to be diffused from the AsSG 37 to form diffused regions 38.

Figure 30B:
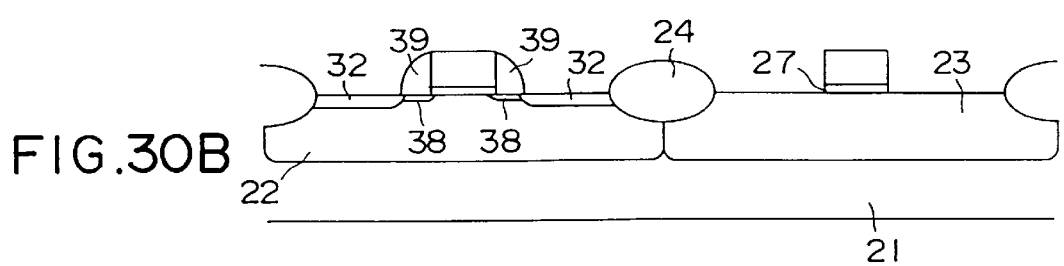

Then, as shown in FIG. 30B, an anisotropic etching, e.g., RIE process, etc. is implemented to the AsSG film 37 to thereby form AsSG side walls 39. Thereafter, e.g., As ions 32 are implanted into the N-channel FET region under the condition of an acceleration voltage of 30 KeV and a dose of $5.0 \times 10^{15} cm^{-2}$.

It is to be noted that similar result may be obtained by forming AsSG side walls thereafter to diffuse As ions into the N-channel FET region.

Figure 30C:
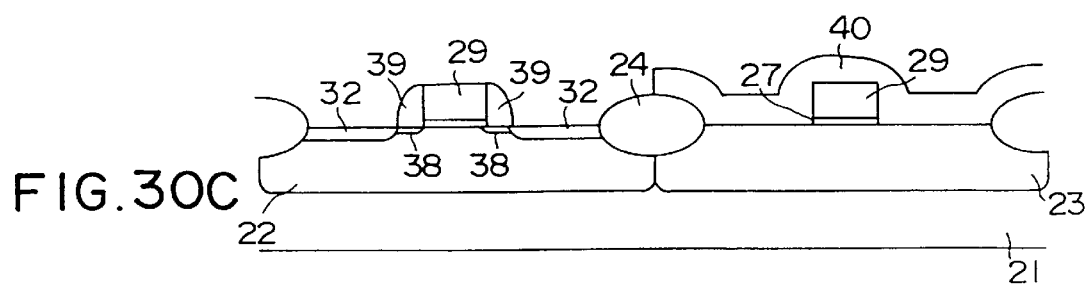

Then, a BSG film 40 having a thickness of 100 nm is formed, e.g., by the LPCVD process on the silicon substrate. Thereafter, e.g., a treatment of the dilute hydrofluoric system is implemented to thereby remove the BSG film 40 only in the N-channel FET region (FIG. 30C).

Figure 30D:
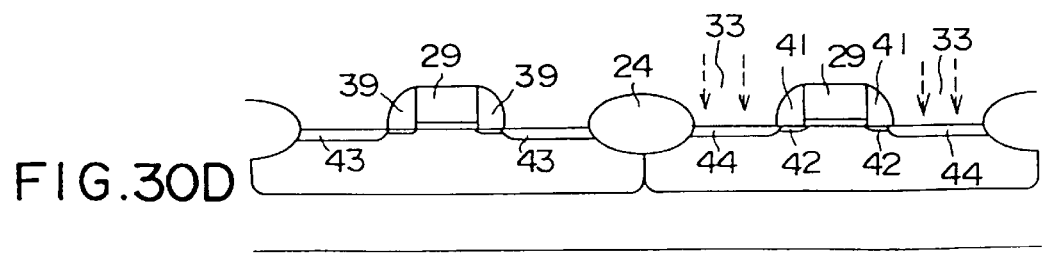

Then, as shown in FIG. 30D, an anisotropic etching, e.g., RIE process, etc. is implemented to the BSG film 40 to thereby form BSG side walls 41. Thereafter, e.g., BF2 ions 33 are implanted into the P-channel FET region under the condition of an acceleration voltage of 35 keV and a dose of $5.0 \times 10^{15} cm^{-2}$. For example, a heat process of 1000° C. and 10 seconds is applied to thereby allow B ions 42 to be diffused from the BSG side walls, and to activate implanted impurity to form N-type diffused layers 43 and P-type diffused layers 44.

At times subsequent thereto, after undergoing an interconnection process, etc. in a manner similar to that of the conventional semiconductor device, a semiconductor device is constituted.

It is to be noted that similar result may be obtained in the case where BSG film 40 in N channel region is not removed.

[Fourth Embodiment]

By a process similar to that of FIGS. 29A–29E of the second embodiment, gate electrodes are formed within the P well formation region and the n well formation region of the silicon substrate 21.

Figure 31A:
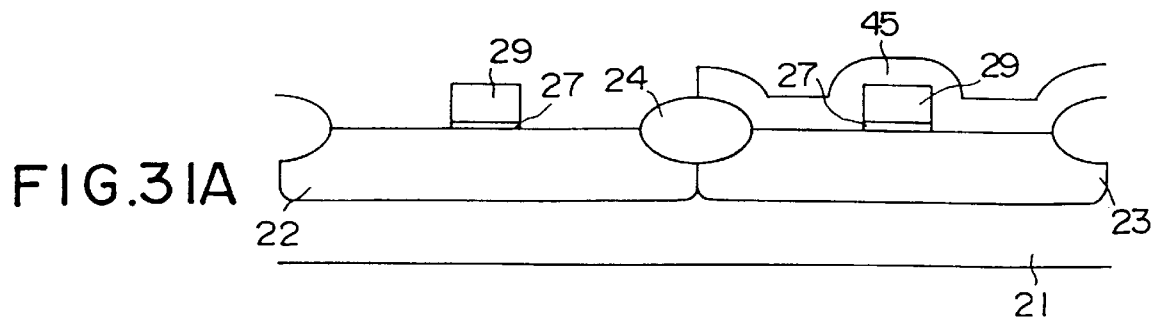
FIGS. 31A–31D are device cross sectional views every respective process steps showing a method of manufacturing a FET according to this invention.

Then, as shown in FIG. 31A, a silicon nitride film 45 having a thickness of 100 nm is formed, e.g., by the LPCVD process on the silicon substrate 21. For example, a hot phosphoric acid treatment is implemented thereto to thereby remove the silicon nitride film 45 only in the N-channel FET region.

Then, an AsSG film 37 having a thickness of 100 nm is formed, e.g., by the LPCVD process on the silicon substrate 21. For example, a treatment of the dilute hydrofluoric acid system is implemented thereto to thereby remove the AsSG film 37 only in the P-channel FET region. Then, e.g., a heat process of 950° C. and 10 minutes is applied to thereby allow As ions 38 to be diffused from AsSG film to form As diffused regions 38.

Then, an anisotropic etching, e.g., RIE process, etc. is implemented to the AsSG film 37 to thereby form AsSG side walls 39.

It is to be noted that similar effect may be obtained by forming AsSG side walls thereafter to diffuse As ions into the N-channel FET region.

Then, e.g., As ions are implanted into the N-channel FET region with the side walls being as a mask under the condition of an acceleration voltage of 30 KeV and a dose of $5.0 \times 10^{15} cm^{-2}$ to form As implanted regions 32.

Figure 31B:
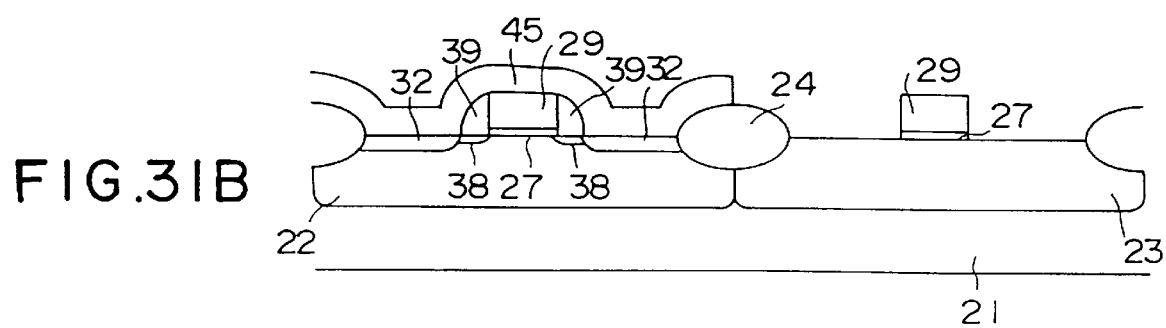
Figure 31C:
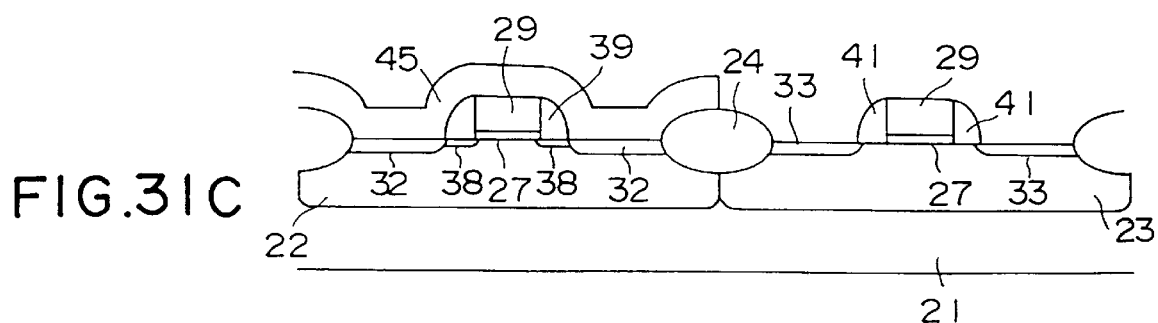

Then, e.g., a hot phosphoric acid treatment is implemented to thereby remove the silicon nitride film 45 on the P-channel FET region. Then, a silicon nitride film 45 having a thickness of 100 nm is formed again, e.g., by the LPCVD process on the silicon substrate to implement, e.g., hot phosphoric acid treatment thereto to thereby remove the silicon nitride film 45 only in the P-channel FET region (FIG. 31B).

Then, a BSG film 40 having a thickness of 100 nm is formed, e.g., by the LPCVD process on the silicon substrate 21. For example, a treatment of the dilute hydrofluoric acid system is implemented to thereby remove the BSG film 40 only in the N-channel FET region.

Thereafter, an anisotropic etching, e.g., RIE process, etc. is implemented to the BSG film 40 to thereby form BSG side walls 41. Then, e.g., $BF_2$ ions are implanted into the P-channel FET region under the condition of an acceleration voltage of 35 KeV and a dose of $5.0 \times 10^{15} cm^{-2}$ to form ion implanted regions.

Figure 31D:
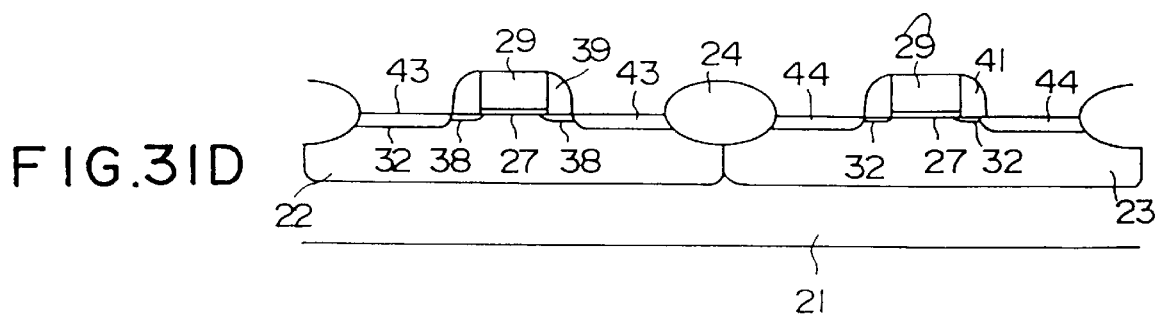

The process step shown in FIG. 31D is then carried out. For example, hot phosphoric acid treatment is implemented to thereby remove the silicon nitride film 45 on the N-channel FET region. Subsequently, e.g., a heat process of 1000° C. and 10 seconds is applied to thereby allow B ions to be diffused from the BSG side walls, and to activate implanted impurity, thus to form N-type diffused layers 43 and P-type diffused layers 44.

At times subsequent thereto, after undergoing an interconnection process step, etc. in a manner similar to manufacturing of a conventional semiconductor device, a semiconductor device is constituted.

While, in the third and fourth embodiments, side walls of the N-channel FET region are formed thereafter to implant impurity into the N-channel FET region thereafter to subsequently form side walls of the P-channel FET region, it is needles to say that similar effect may be provided by forming side walls of the both P and N channel FET transistor regions to respectively implant impurity into the both FET transistor regions.

[Fifth Embodiment]

By a process similar to that of FIGS. 29A–29E of the above-mentioned second embodiment, gate electrodes are formed within the P well formation region and the n well formation region of the silicon substrate 21.

Then, a silicon nitride film 45 having a thickness of 100 nm is formed, e.g., by the LPCVD process on the silicon substrate. For example, hot phosphoric acid treatment is then implemented to thereby remove the silicon nitride film 45 only in the N-channel FET region.

Figure 32A:
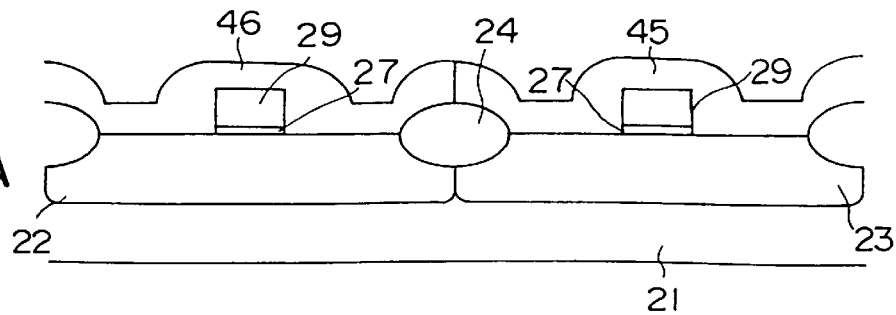
FIGS. 32A–32E are device cross sectional views every respective process steps showing a method of manufacturing a FET according to this invention.

Then, a PSG film 46 having a thickness of 100 nm is formed, e.g., by the LPCVD process on the silicon substrate 21. For example, treatment of the dilute hydrofluoric system is then implemented to thereby remove the PSG film 46 only in the p-channel FET region (FIG. 32A).

Figure 32B:
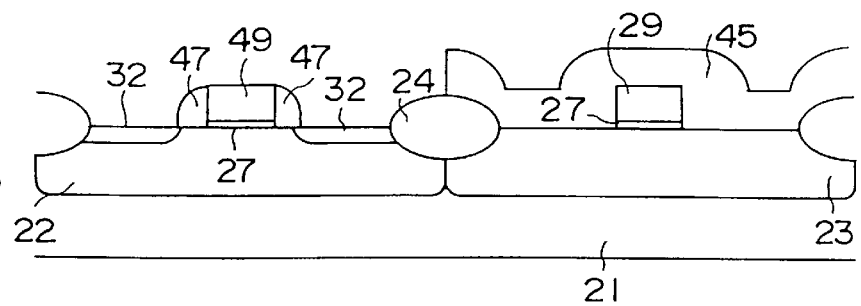

Then, an anisotropic etching, e.g., RIE process, etc. is implemented to the PSG film 46 to thereby form a PSG side walls 47. Thereafter, e.g., As ions are implanted into the N-channel FET region under the condition of an acceleration voltage of 30 KeV and a dose of $5.0 \times 10^{15} cm^{-2}$ (FIG. 32B).

Figure 32C:
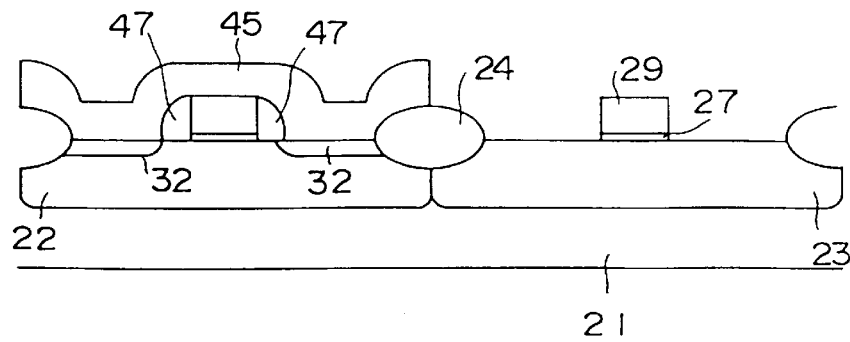

Then, e.g., hot phosphoric acid treatment is implemented to the silicon nitride film 45 on the P-channel FET region to remove it. Subsequently, a silicon nitride film 45 having a thickness of 100 nm is formed, e.g., by the LPCVD process on the substrate. For example, hot phosphoric acid treatment is then implemented to thereby peel off the silicon nitride film 45 only in the P-channel FET region (FIG. 32C).

Figure 32D:
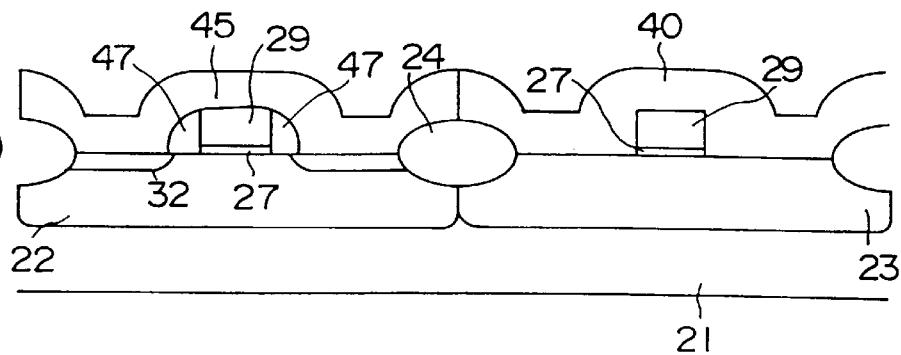

Then, a BSG film 40 having a thickness of 100 nm is formed, e.g., by the LPCVD process on the silicon substrate 21. For example, a treatment of the dilute hydrofluoric acid system is implemented to thereby remove the BSG film 40 only in the N-channel FET region (FIG. 32D).

Figure 32E:
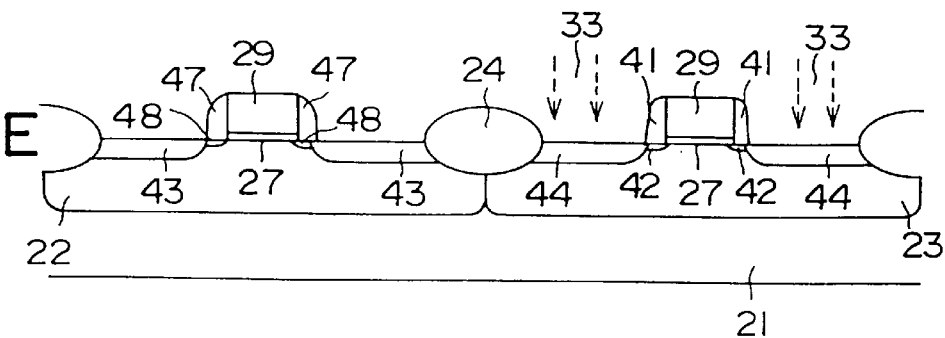

Then, an anisotropic etching, e.g., RIE process, etc. is implemented to the BSG film 40 to thereby form BSG side walls 41. Then, e.g., hot phosphoric acid treatment is implemented to the silicon nitride film 46 on the N-channel FET region to remove it. Thereafter, e.g., $BF_2$ ions 33 are implanted into the P-channel FET region under the condition of an acceleration voltage of 35 KeV and a dose of $5.0 \times 10^{15} cm^{-2}$. For example, heat process of 1000° C. and 10 seconds is applied to thereby allow respective P ions and B ions to be diffused from the PSG side walls 47 and BSG side walls 41 to form P diffused regions 42 and B diffused regions 48, and to activate implanted impurity, thus to form N-type diffused layers 43 and P-type diffused layers 44 (FIG. 32E).

At times subsequent thereto, after undergoing an interconnection process, etc. in a manner similar to that of manufacturing of a conventional semiconductor device, a semiconductor device is constituted.

It is to be noted that while, in the above-mentioned fifth embodiment, side walls of the N-channel FET region are formed thereafter to form side walls of the p-channel FET region, it is needless to say that similar effect may be obtained even if the order of forming side walls is opposite.

[Sixth Embodiment]

By a process similar to that of the fifth embodiment, as shown in FIG. 32A, a PSG film 46 is formed on the N-channel FET region and a silicon nitride film 45 is formed on the P-channel FET region.

Figure 33A:
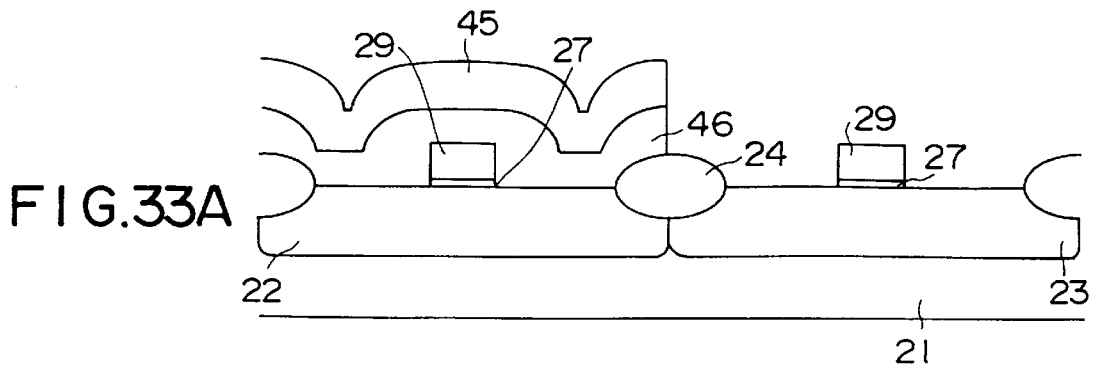
FIGS. 33A–33D are device cross sectional views every respective process steps showing a method of manufacturing a FET according to this invention.

Then, e.g., hot phosphoric acid treatment is implemented to the silicon nitride film 45 on the P--channel FET region to thereby remove it. Subsequently, a silicon nitride film 45 having a thickness of 100 nm is formed, e.g., by the LPCVD process on the substrate. Thereafter, e.g., hot phosphoric acid treatment is implemented to thereby peel off the silicon nitride film 45 only in the P-channel FET region (FIG. 33A).

Figure 33B:
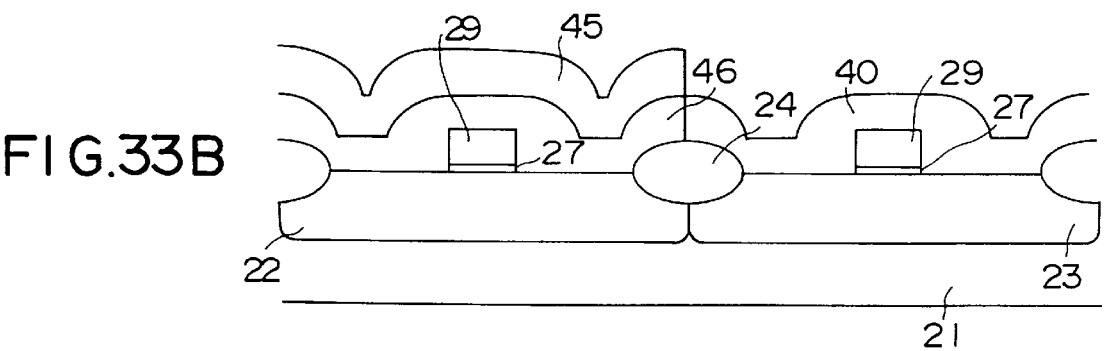
Figure 33C:
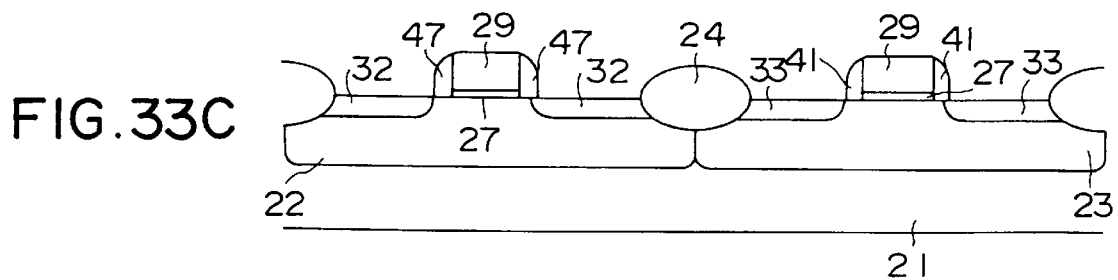

Then, a BSG film 40 having a thickness of 100 nm is formed, e.g., by the LPCVD process on the silicon substrate 21. Thereafter, e.g., a treatment of the dilute hydrofluoric acid system is implemented to thereby remove the BSG film 40 only in the N-channel FET region (FIG. 33B).

Figure 33D:
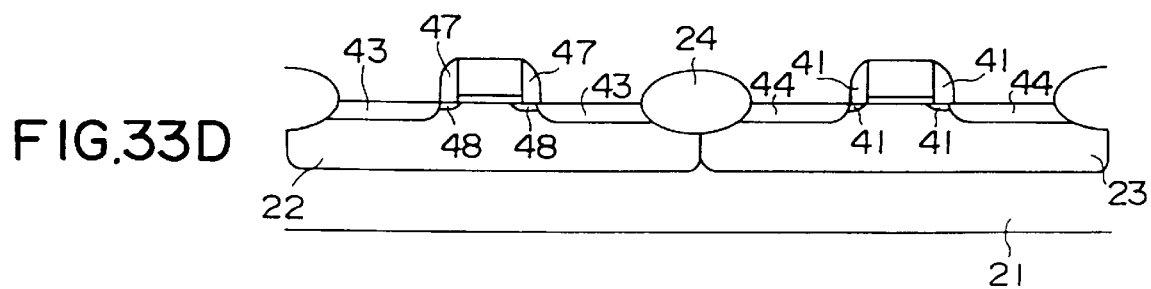

Subsequently, e.g., a hot phosphoric acid treatment is implemented to thereby peel off the silicon nitride film 45 in the N-channel FET region to implement an anisotropic etching, e.g., RIE process, etc. to the PSG film 46 and the BSG film 40 to thereby form respective PSG side walls 47 and BSG side walls 41. Thereafter, e.g., As ions are implanted into the N-channel FET region under the condition of an acceleration voltage of 30 KeV and a dose of $5.0 \times 10^{15} cm^{-2}$ to form ion implanted regions 32. Subsequently, e.g., $BF_2$ ions are implanted into the P-channel FET region under the condition of an acceleration voltage of 35 KeV and a dose of $5.0 \times 10^{15} cm^{-2}$ to form ion implanted regions 33. Then, the process step shown in FIG. 33D is carried out. Namely, e.g., a heat process of 1000° C. and 10 seconds is applied to thereby allow respective P ions 48 and B ions 42 to be diffused from the PSG side walls 47 and the BSG side walls 41, and to activate implanted impurity, thus to form N-type diffused layers 43 and P-type diffused layers 44.

At times subsequent thereto, after undergoing an interconnection process, etc. in a manner similar to manufacturing of a conventional semiconductor device, a semiconductor device is constituted.

While, in the above-described sixth embodiment, a PSG film is first deposited on the N-channel FET region thereafter to deposit a BSG film on the P-channel FET region, it is needless to say that similar effect may be obtained even if deposition is made in a reverse order.

Further, while, in the four embodiments of the third to the sixth embodiments, impurities are respectively implanted into the N-channel FET region and the P-channel FET region at the time of forming gate electrodes to thereby form a dual gate complementary FET, it is also needless to say that similar effect may be provided even if there is employed a method of diffusing respective P and B ions from PSG and BSG into the gate electrodes at the time of heat process for forming diffused layers without implanting impurity into the polysilicon for forming gate electrodes to thereby form a dual gate complementary FET.

In accordance with the above-described second to sixth embodiments, diffused layers of the N-channel FET transistor are formed by diffusion from AsSG, PSG and BPSG, and diffused layers of the P-channel FET are formed by diffusion from BSG and BPSG. Accordingly, diffused layers which are higher in concentration and are shallower in depth than those of a FET by the conventional method.

[Seventh Embodiment]

A seventh embodiment of this invention will now be described with reference to FIGS. 34A to 34F.

The invention in this embodiment is characterized in that one of N/P channel transistors of the CMOSFET is formed by a method including the solid-phase diffusion process, and the other is formed by using an ion implantation process, thereby making it possible to form a shallow diffused layer without increasing the number of steps.

First, e.g., B ions are implanted into a P-well formation region of a P type silicon substrate 71 under the condition of an acceleration voltage of 100 KeV and a dose of 6.4×$10^{12}$cm$^{-2}$ thereafter to implant, e.g., P ions into the N well formation region under the condition of an acceleration voltage of 16 KeV and a dose of 6.4×$10^{12}$cm$^{-2}$ thereafter to undergo a heat process of 1190° C. and 15 minutes to thereby form an N well region 72 and a P well region 73.

Subsequently, a device isolation region 74 is formed by the LOCOS process.

Then, a silicon oxide film 75 is formed on the silicon substrate 71 so that its thickness is equal to 4 nm to further form a polysilicon film 76 thereon so that its thickness is equal to 200 nm.

Then, the polysilicon film 76 and the silicon oxide film 75 are etched, e.g., by the RIE process to form gate electrodes.

Figure 34A:
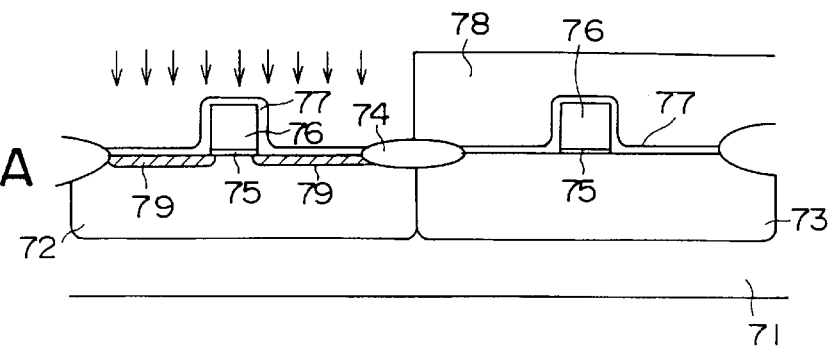
FIGS. 34A–34F are device cross sectional views every respective process steps showing a method of manufacturing a FET according to this invention.

Then, the entirety of the substrate is oxidized to form an oxide film 77 having a thickness of about 100 angstroms on the entire surface of the substrate. Thereafter, a resist layer 78 is formed on the P-channel FET region to implant As$^+$ ions into the N-channel FET region under the condition of an acceleration voltage of 20 KeV and a dose of 2×$10^{14}$cm$^{-2}$ with the resist layer 78 being as a mask to thereby form shallow source/drain diffused layers 79 (FIG. 34A).

Figure 34B:
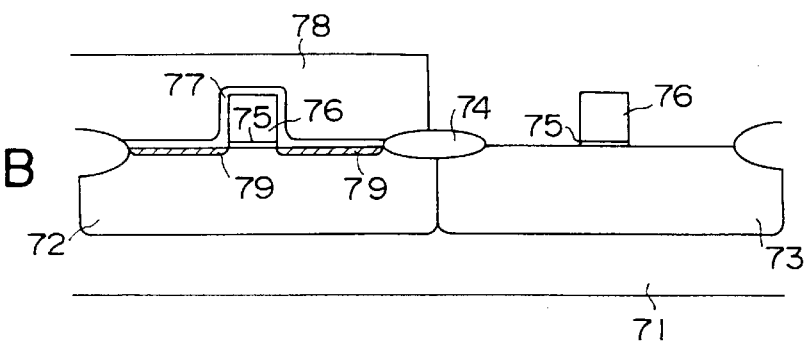

Then, a resist layer 78 is formed on the N-channel FET region to selectively peel off the oxide film 77 on the P-channel FET region (FIG. 34B).

Then, the resist layer 78 on the N-channel FET region is peeled off thereafter to form BSG films 81 having a concentration of about 5×$10^{21}$cm$^{-3}$ on the entire surface of the substrate so that its thickness is equal to about 1000 angstroms to carry out an anisotropic etching such as RIE process, etc. to thereby form BSG side walls 81 on the both sides of the gate electrode.

Figure 34C:
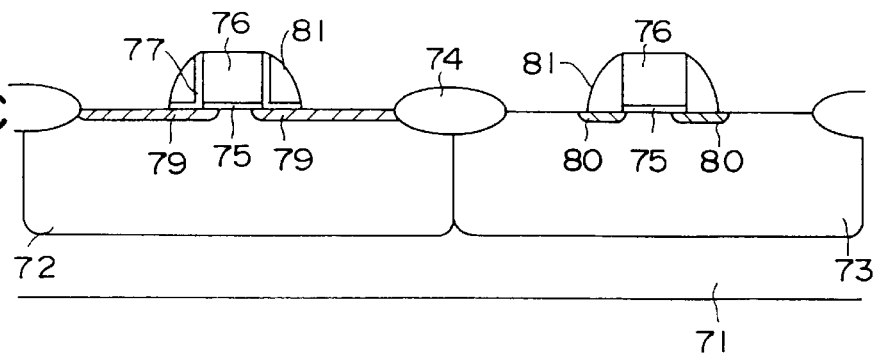

Then, a heat treatment is carried out under the condition of 1000° C. and 15 seconds to thereby allow boron to be diffused from the BSG side walls to the Si substrate only in the P-channel FET region. At this time, the oxide film serves as a stopper on the N-channel FET region so that no boron is diffused (FIG. 34C).

Figure 34D:
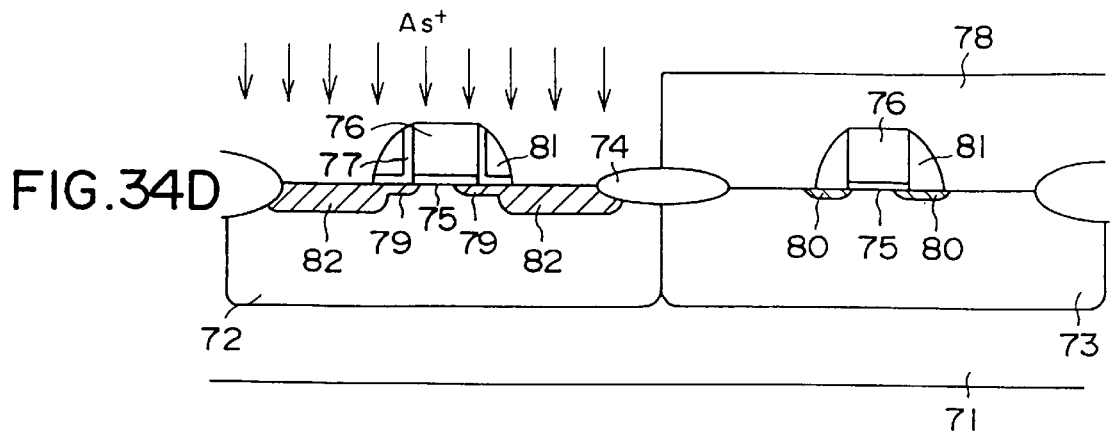

Subsequently, a resist layer 78 is formed on the P-channel FET region to implant As ions only into the N-channel FET region with the resist layer 78 being as a mask to form deep source/drain diffused layers 82 (FIG. 34D).

Figure 34E:
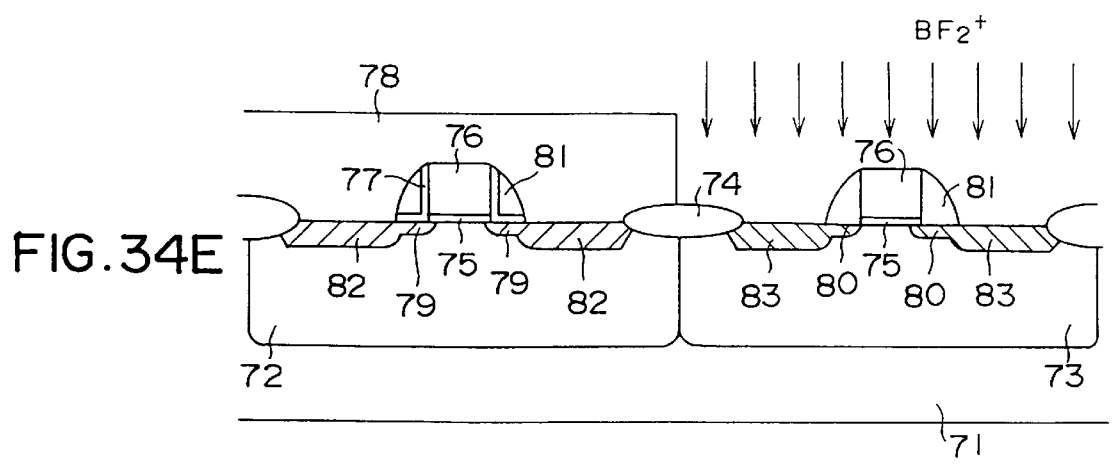

Then, a resist layer 78 is formed on the N-channel FET region to implant BF$_2$ ions only into the P-channel FET region with the resist layer 78 being as a mask to thereby deep source/drain diffused layers 83 (FIG. 34E).

Figure 34F:
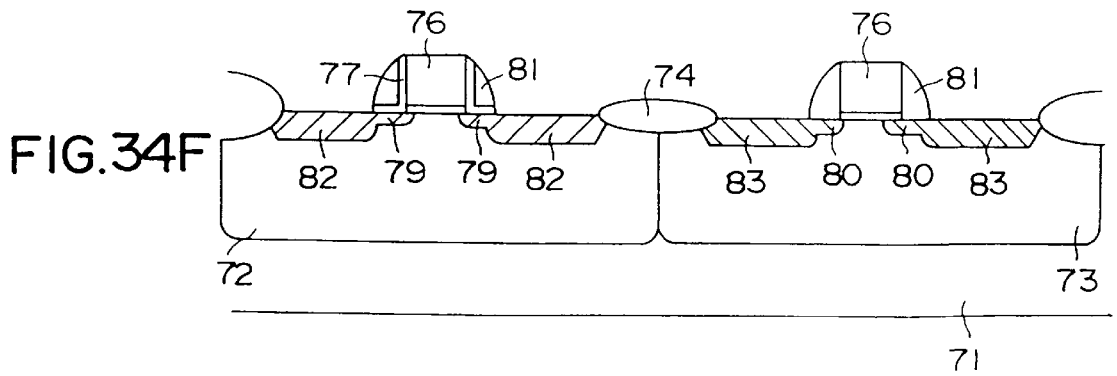

Finally, after peeling off the resist layer 78, ion implanted impurity is activated by conducting heat treatment of 1000° C. 20 seconds (FIG. 34F).

It is to be noted that while, in the above-mentioned process, the thermal oxide film is used as a stopper film in the solid phase diffusion, a deposited film such as a silicon oxide film or a silicon nitride film, etc. may be used in place of the thermal oxide film.

Further, while, in the above-mentioned process, by a high temperature and short time heat treatment of 1000° C. and 15 seconds, solid phase diffusion from the BSG side walls into the Si substrate in the P-channel FET region is carried out, solid phase diffusion of B from the BSG side walls into the Si substrate may be carried out by heat treatment of activation of the source/drain regions.

Furthermore, though in N channel region the oxide film 77 as a stopper for solid phase diffusion is formed in the above-mentioned processes, the oxide film 77 may not be formed as shown in FIGS. 36A–36F. This is because relatively shallow and high concentration diffusion layer can be formed using As ion implantation compared to B ion.

Therefore, if As ion implantation is performed to form diffused region of much higher As concentration than B concentration from the BSG film, B ions diffused in solid phase is cancelled.

Hitherto, because the diffusion factor of boron is great, it was difficult to form a shallow diffused layer. However, in this embodiment, because the solid phase diffusion is used, it is possible to form a shallow diffused layer. In addition, since the solid phase diffusion is used only in connection with the P-channel FET, an increase of the number of steps is no problem.

It is to be noted that while, in this embodiment, the solid phase diffusion from BSG film is carried out on the P-channel side, there may be instead employed a method in which the solid phase diffusion from PSG, AsSG, etc. is carried out on the N-channel side, and diffusion by ion implantation is carried out on the P-channel side.

[Eighth Embodiment]

An eighth embodiment of this invention will now be described in detail with reference to FIGS. 35A to 35F.

This invention contemplates providing a shallow and high concentration impurity profile which was difficult in the prior art.

First, a device region 84 is formed by the LOCOS process on an n-type silicon substrate 71.

Then, the device region is oxidized to form a gate oxide film 85 so that its thickness is equal to 40 angstroms to form a boron doped polysilicon 86 thereon so that its thickness is equal to 200 angstroms.

Then, a resist 87 is coated on the entire surface to apply patterning thereto so that a pattern greater than the gate electrode is formed. The boron doped polysilicon 86 and the gate oxidize film 85 are etched with the resist pattern 87 being as a mask to remove the resist pattern.

Then, boron doped polysilicon film 86 is deposited on the entire surface of the silicon substrate 71 so that its thickness is 2000 angstroms.

Figure 35A:
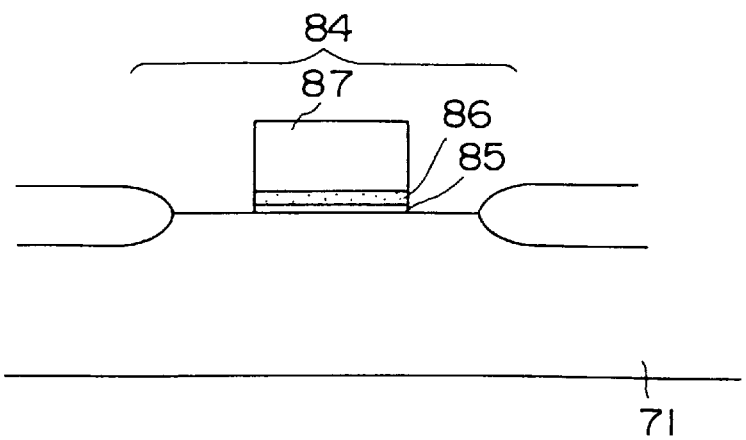
FIGS. 35A–35F are device cross sectional views every respective process steps showing a method of manufacturing a FET according to this invention.
Figure 35B:
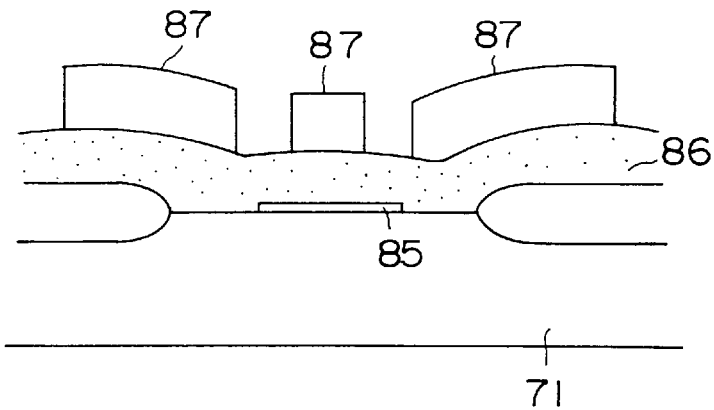

Subsequently, resist 78 is coated on the entire surface to form, by patterning, resist patterns 87 on a gate electrode formation region and source/drain lead-out electrode formation region (FIG. 35B).

Then, the boron doped polysilicon is etched with the resist pattern 87 being as a mask to form a gate electrode 88 and source/drain lead-out electrodes 89 to peel off the resist pattern 87.

Figure 35C:
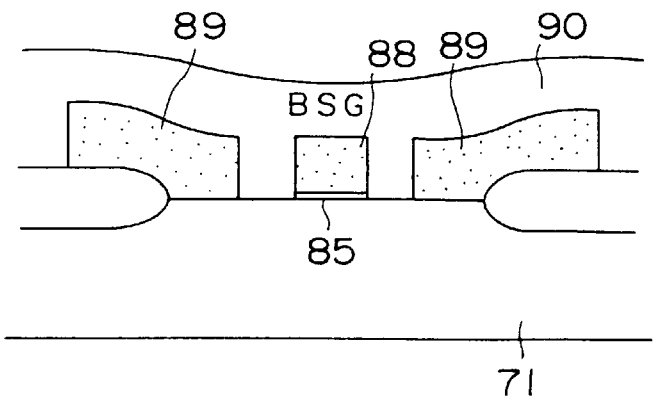

Subsequently, silicate glass (BSG) layers 90 including boron of high concentration are deposited on the entire surface so that its thickness is equal to 3000 angstroms (FIG. 35C).

Then, etch back process is implemented to the entire surface to thereby allow BSG 90 to be buried into grooves between the gate electrode 88 and the source/drain lead-out electrodes 89 to carry out heat treatment under condition of 1000° C. and 15 seconds to allow boron to be diffused from the BSG 90 and the boron doped polysilicon 89 into the source/drain regions.

At this time, since the diffusion rate of boron in the boron-doped polysilicon is higher than that in the BSG, shallow diffused layers 91 and deep diffused layers 92 are formed on the inside and on the outside, respectively.

Figure 35D:
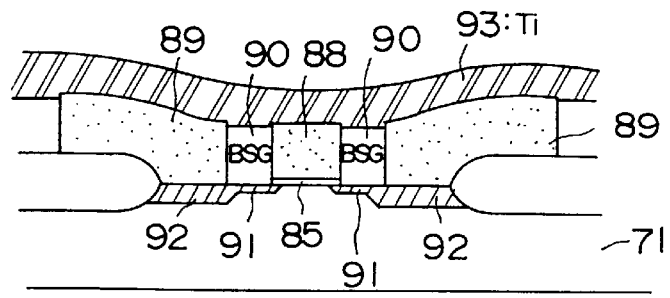

Then, a Ti 93 is deposited on the entire surface of the substrate so that its thickness is equal to 800 angstroms (FIG. 35D).

Then, a heat treatment of 800° C. is carried out to thereby allow the Ti 93 and the boron doped polysilicon 88, 89 to react with each other to form a Ti silicide 94. Subsequently, Ti which has not yet reacted is removed by a mixed solution of sulfuric acid and hydrogen peroxide solution.

Figure 35E:
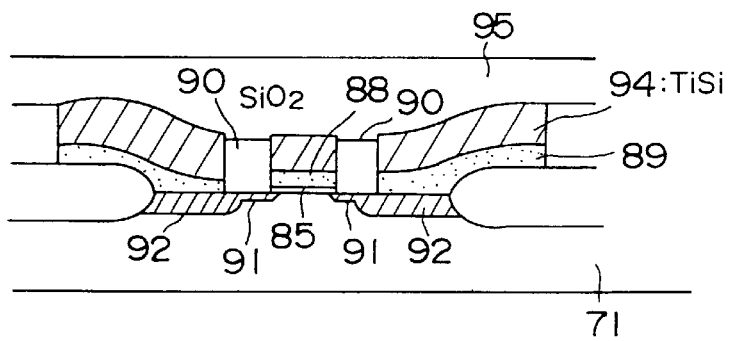

Then, a SiO$_2$ film 95 is deposited on the entire surface so that its thickness is equal to 5000 angstroms (FIG. 35E).

Figure 35F:
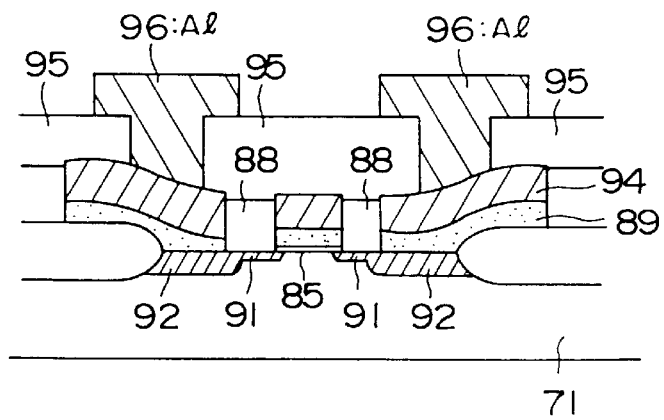
Figure 36A:
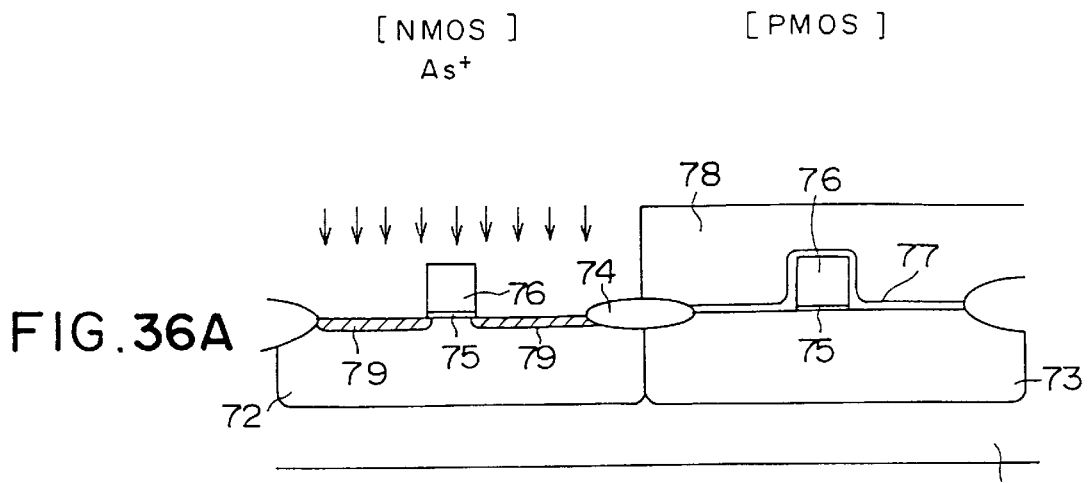
FIGS. 36A–36F are device cross sectional views every respective process steps showing a method of manufacturing a FET without using stopper film according to this invention.
Figure 36B:
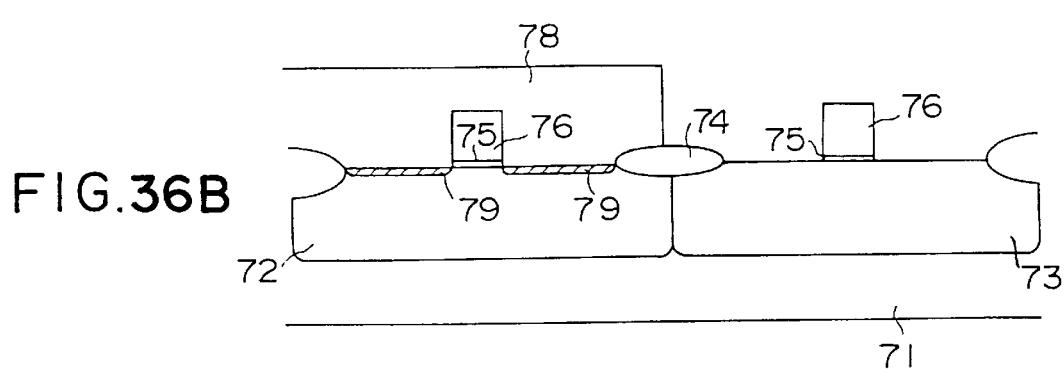
Figure 36C:
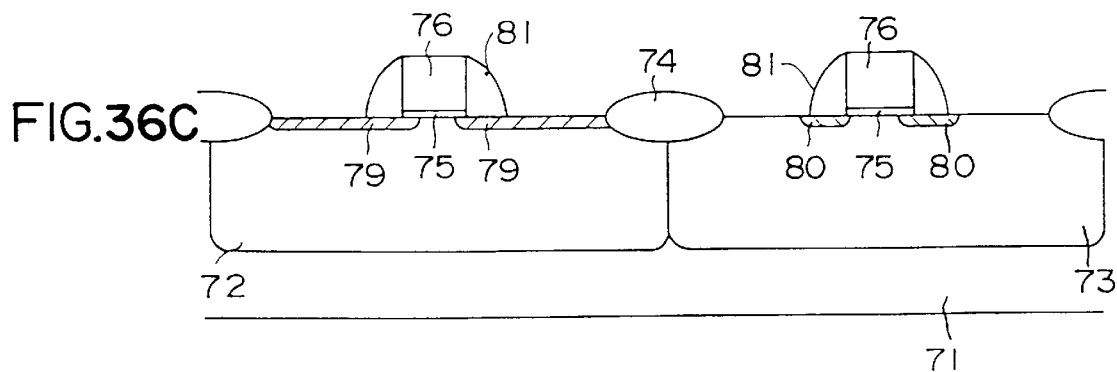
Figure 36D:
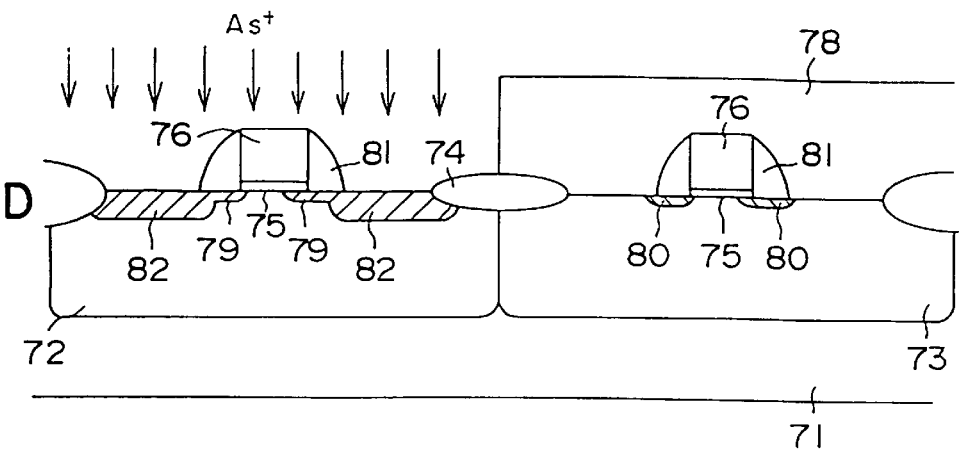
Figure 36E:
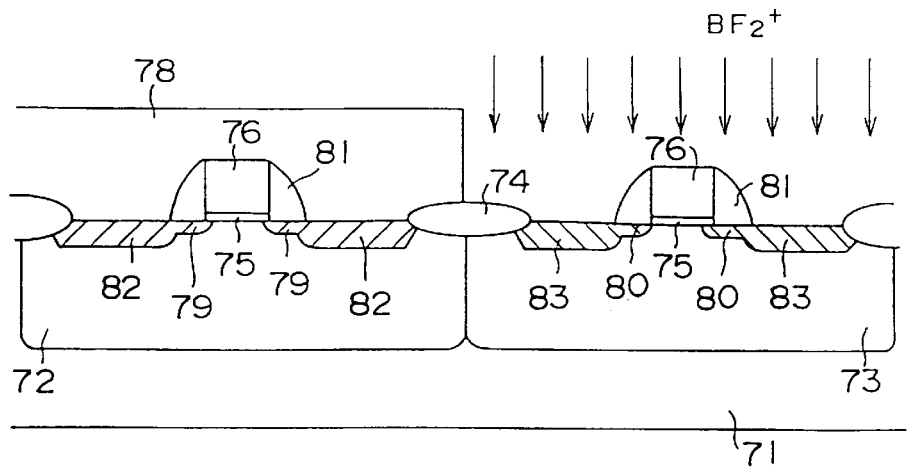
Figure 36F:
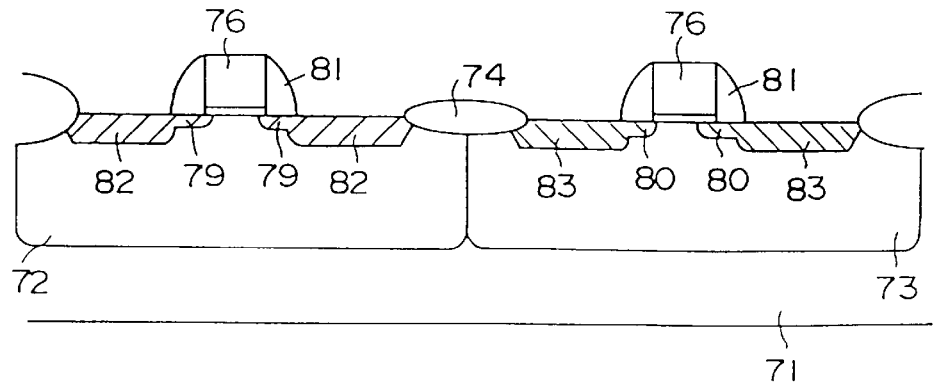

Finally, electrode lead-out contact holes are opened in the SiO$_2$ film 95 to form Al interconnections 96 (FIG. 35F).

As has been explained above, in accordance with this embodiment, by using solid phase diffusion from the gate side walls of a silicon glass including impurity of high concentration, very shallow source/drain diffused layers having high concentration can be formed. Thus; a miniaturized and high drivability MOSFET can be manufactured. In addition, in the manufacturing of CMOSFET, an approach is employed such that solid phase diffusion is used only for one MOSFET and a diffusion prevention layer of the solid phase diffusion is formed with respect to the type in which no solid phase diffusion is carried out, thereby making it possible to provide a miniaturized and high performance CMOSFETs without increasing the number of process steps.

As described in detail, in accordance with this invention, the source and the drain have a first diffused layer including impurity of a second conductivity type positioned on the field oxidize film side and a second diffused layer including the impurity of the second conductivity type positioned on the channel formation region in such a manner that they are relative to each other, and the second diffused layers on the both sides of the gate are formed shallow so that it has a high concentration. Thus, the parasitic resistance can be reduced while suppressing the short-channel effect in a miniaturized MOS device. Accordingly, it is possible to obtain a large drain current, and to set the first diffused layer deep to such an extent that the contact resistance is low, the leakage current is suppressed and resistance is low in carrying out formation of electrode by the salicide process into the first diffused layer.

Figure 37:
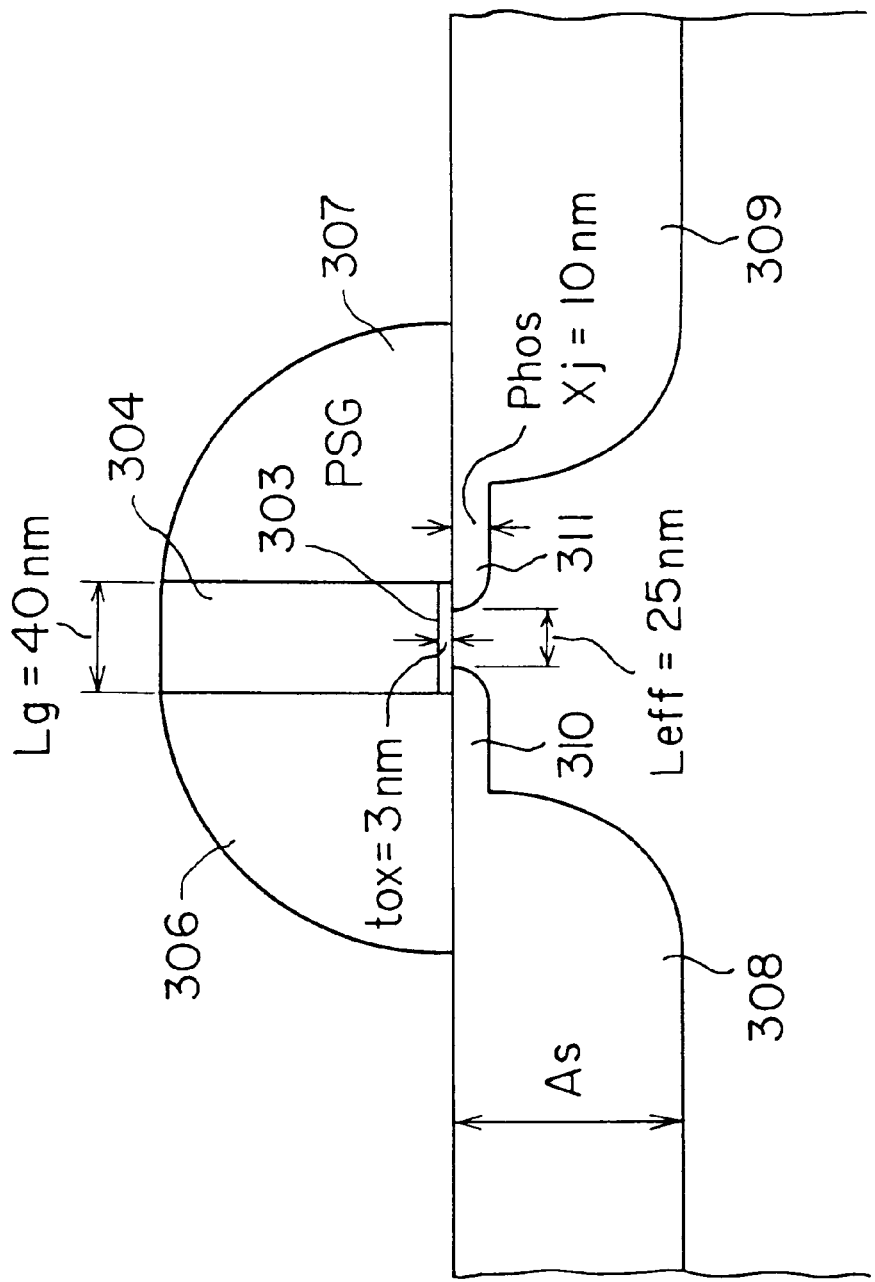
FIG. 37 is a cross-sectional view showing a typical device structure of the N-channel MOSFET according to the present invention.

FIG. 37 shows a typical device structure of the N-channel MOSFET of the present invention. In FIG. 37, a PSG film 306, 307 with width of 190 nm are formed on the both sides of the gate. Further, source and drain diffusion layer regions each composed of arsenic ion diffused regions 308, 309 with a deep junction depth of 70 nm and phosphorus ion diffused regions 310, 311 with a shallow junction depth of 10 nm are formed on both sides of the gate in such a way that the shallow phosphorus ion diffused regions are formed inside the deep arsenic ion diffused regions, respectively. The gate length, Lg, is 40 nm, and the thickness, tox, of the gate insulating film is 3 nm. Further, the effective channel length, Leff, is 25 nm, the channel width is 10 $\mu$m, the threshold voltage Vth is 0.42 V (Vd=1.5 V), the drain current is 581 mA/mm (Vd=1.5 V), $g_m$ is 428 mS/mm (Vg=1.5 V), respectively.

The manufacturing process of such structure of N-channel MOSFET according to the present invention will be described with reference to FIGS. 18A to 18D again.

First, as shown in FIG. 18A, the surface of a P-type silicon substrate 301 is selectively oxidized to form a field oxide film 302 to isolate an element region from other regions. After that, all over the surface of the element region enclosed by the field oxide film 302 on the surface of the substrate 301 is thermal-oxidized to form a silicon oxide film 303. Further, on the silicon oxide film 303, a poly crystalline silicon film 304 as a gate electrode material having a thickness of 200 mn is deposited by an LPCVD method, for instance. Further, on the formed poly crystalline silicon film 304, a silicon oxide film 305 is formed using a CVD under atmospheric pressure, for instance.

Further, on the poly crystalline silicon film as the gate electrode material, a photoresist mask (not shown) is formed using photolithography. Further, the two silicon oxide layer films and the intermediate poly crystal silicon film are patterned at the same time in accordance with RIE method to form a gate electrode composed of a gate oxide film 303, a poly crystal silicon film 304, and a silicon oxide film 305.

Figure 38A:
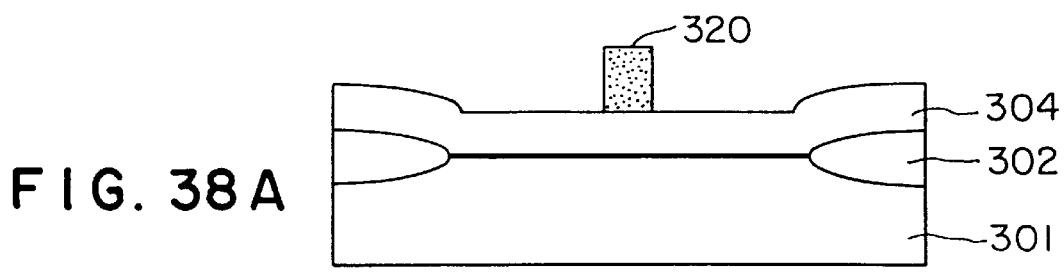
FIGS. 38A to 38E are cross-sectional views showing the process of forming a resist pattern for forming a gate of the embodiment of the device according to the present invention.
Figure 38B:
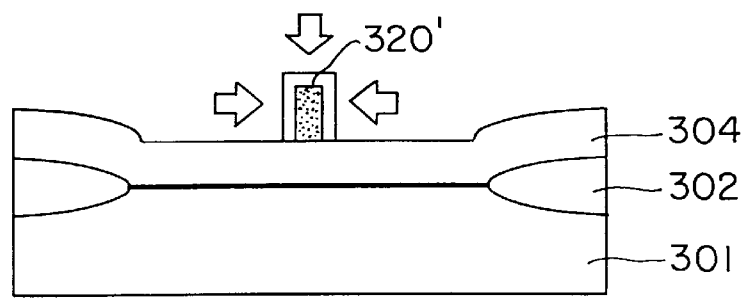
Figure 38C:
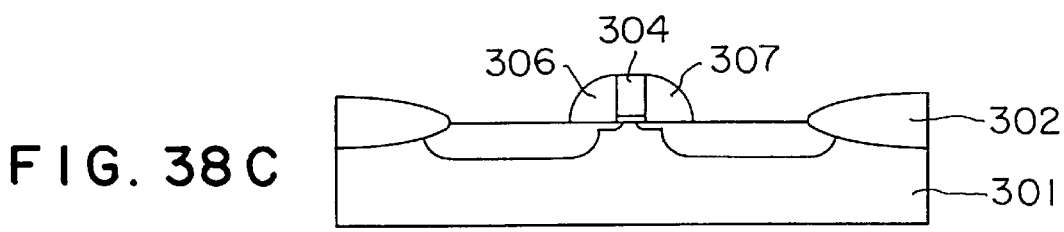
Figure 38D:
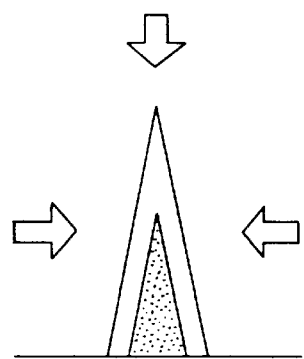
Figure 38E:
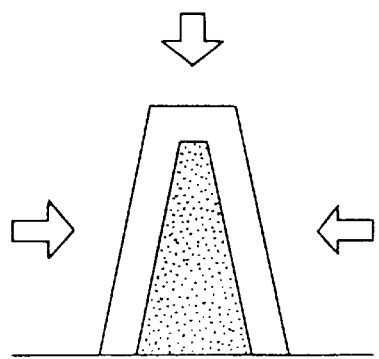

Here, as shown in FIGS. 38A to 38C, after the resist mask 320 has been formed, the resist mask is narrowed by oxygen plasma ashing or etching. When the two silicon oxide layer films and the intermediate poly crystal silicon film are etched by RIE process with the use of this narrowed resist mask 320', it is possible to form a miniaturized gate pattern. Further, as shown in FIG. 38D and 38E, when the resist mask is exposed or ashed in such a way that the cross section of the resist mask becomes a triangular shape (FIG. 38D) or trapezoidal shape (FIG. 38E), it is possible to prevent the resist mask from falling down which tends to occur in the case of the miniaturized pattern.

Further, as shown in FIG. 18B, a PSG film (phosphorus concentration: 1.5 mol %, for instance) is deposited all over the surface of the substrate 301 using the LPCVD method. The deposited PSG film is etched back using the RIE method to form PSG film side walls 306 and 307 on both side walls of the gate electrode.

Further, as shown in FIG. 18C, arsenic ions (impurities) are implanted at a dose rate of $5\times10^{15}\text{cm}^{-2}$ and at an acceleration energy of 30 keV all over the surface of the substrate 301 with the use of the gate electrode and the PSG film side walls 306 and 307 as masks, so that two deep source and drain diffusion layer regions 308 and 309 can be formed. Further, the device is heat treated by RTA (rapid thermal annealing) at 1000° C. for 10 sec to activate the implanted impurities.

During this RTA heat treatment, since the impurities in the PSG film side walls 306 and 307 are diffused into the substrate 301, it is possible to form two shallow diffusion layer regions 310 and 311 under the PSG film side walls 306 and 307. As a result, it is possible to form both the deep diffusion layer regions 308 and 309 used as the source and drain diffusion layer regions and the shallow diffusion layer regions 310 and 311 on the channel sides of the two deep diffusion layer regions 308 and 309. The distribution of carrier concentration of these shallow diffusion layers 20 and 21 in the depth direction is $1\times10^{18}\text{cm}^{-3}$ at the depth of 12 nm from the surface of the substrate 11 and $1\times10^{21}\text{cm}^{-3}$ at the maximum. In other words, the phosphorus concentration is reduced from the maximum value to the minimum value more than 3 figures (ciphers).

Further, without being limited to only arsenic ion implantation, the deep diffusion layer regions 308 and 309 can be formed by implanting N-type impurities other than arsenic. Further, ions can be diffused within gaseous phase.

Next, as shown in FIG. 18D, a titanium film with a thickness of 30 nm is deposited all over the surface of the substrate 301 in accordance with sputtering method, and further heat treated by RTA to selectively form titanium silicide films 312 and 313 only on the deep diffusion layer regions 308 and 309 which become the source and drain regions. After that, non-reacted titanium is removed by etching using a mixed liquid of ammonia, hydrogen peroxide and water or a mixed liquid of sulfuric acid and hydrogen peroxide. By this etching process, it is possible to from electrodes at the source and the drain diffusion regions in self alignment manner. Here, since the carrier concentration at the interface is about $1\times10^{20}\text{cm}^{-3}$, the contact resistance can be sufficiently lowered.

In the N-channel MOSFET manufactured as described above, since the shallow diffusion layer regions 310 and 311 can be formed in the vicinity of the channel and in addition since the deep diffusion layer regions 308 and 309 can be formed outside the shallow diffusion layer regions 310 and 311 respectively, it is possible to increase the carrier concentration in the shallow diffusion layer regions 310 and 311 sufficiently, being different from the conventional LDD structure. Therefore, even if the shallow diffusion layer regions 310 and 311 are formed, the resistance between the source and the drain is not increased, with the result that the short channel effect in the MOSFET can be suppressed and further the current drive capability can be improved.

Figure 39:
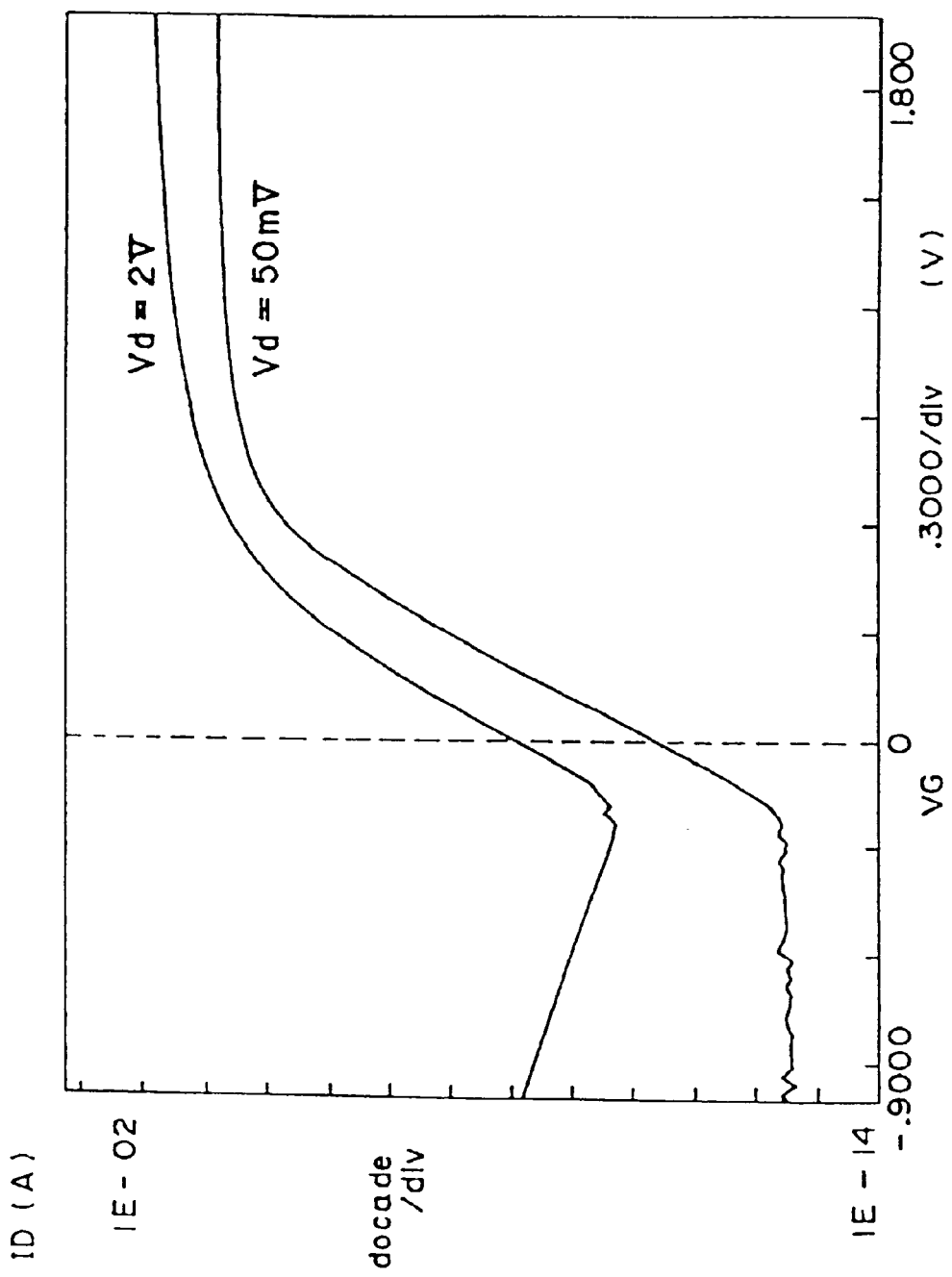
FIG. 39 is a characteristic graph showing the relationship between the gate voltage Vg and the drain current Id of a MOSFET having a gate length of 40 nm related to the device according to the present invention.

FIG. 39 shows the characteristics between the gate voltage Vg and the drain current Id at room temperature of the MOSFET having a gate length of 40 nm according to the present invention. FIG. 39 indicates that punch through due to the short channel effect does not occur and therefore the transistor operation is excellent. Further, in the conventional LDD structure, although a large leakage current appears on the off side (negative gate voltage area), the leakage current is extremely small in the case of the structure according to the present invention. This is because since the overlap length between the gate and each of the source and drain diffusion regions is long in the LDD structure, the tunneling current between bands increases.

Figure 40:
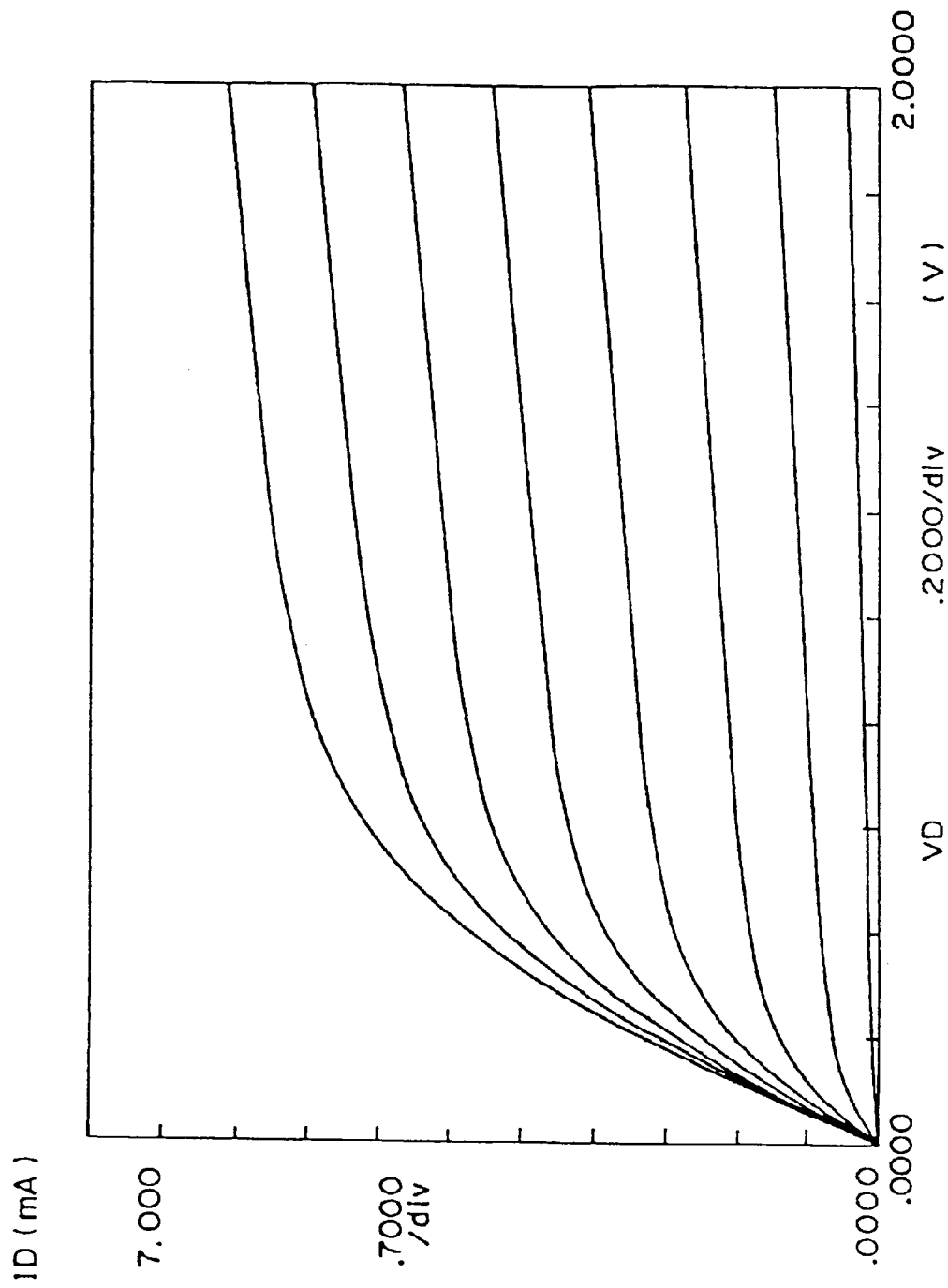
FIG. 40 is a characteristic graph showing the relationship between the drain voltage Vd and the drain current Id of a MOSFET having a gate length of 40 nm related to the device according to the present invention.

FIG. 40 shows the characteristics between the drain voltage Vd and the drain current Id at room temperature of the MOSFET having a gate length of 40 nm according to the present invention. FIG. 40 indicates that the transistor operation is excellent.

Figure 41A:
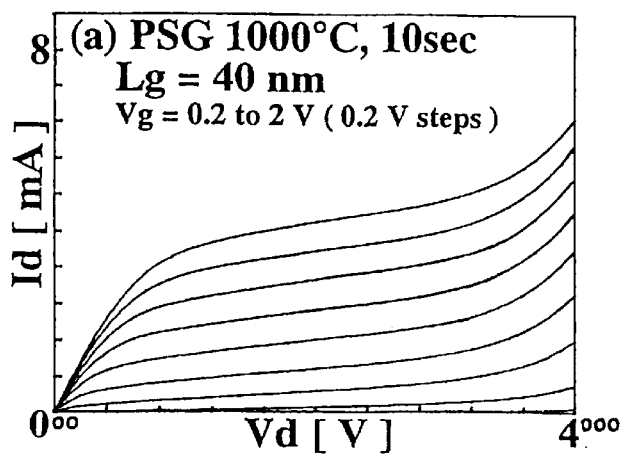
FIGS. 41A to 41C are drain breakdown characteristic graphs showing the relationship between the drain current and the drain voltage.
Figure 41B:
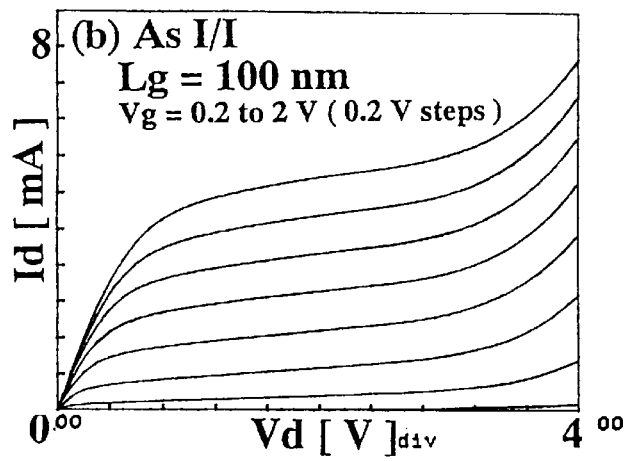
Figure 41C:
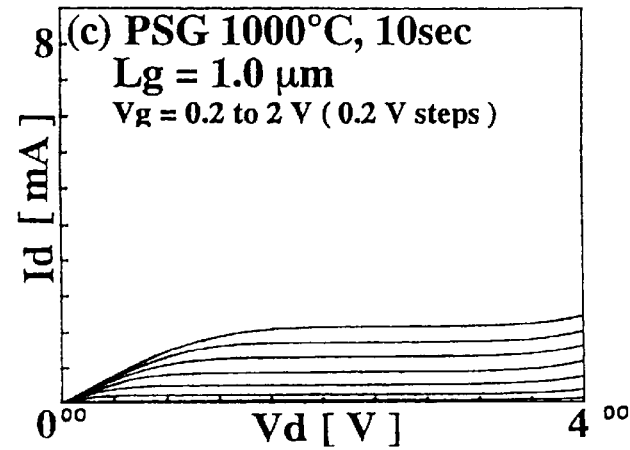

FIGS. 41A to 41C show the drain breakdown characteristics between the drain current and the drain voltage. FIGS. 41A to 41C indicate that the breakdown voltage is equivalent to the long channel elements or the conventional elements.

Figures 42A, 42B, 42C:
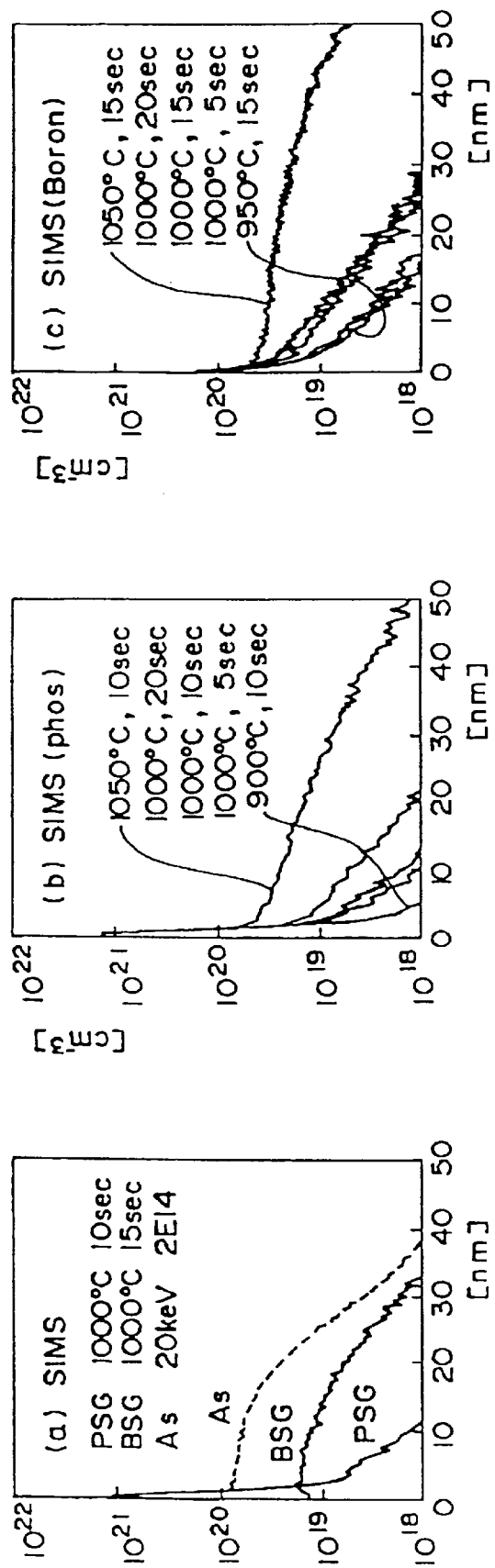
FIGS. 42A to 42C are characteristic graphs showing the distributions of P and B in the substrate from PSG by solid phase diffusion.

FIGS. 42A to 42C show the concentration distributions of phosphorus (P) and boron (B) in the substrate from the PSG by solid phase diffusion. FIG. 42A indicates that when P and B are diffused by solid phase diffusion, P can be doped at a high concentration in the shallow region, as compared with B. This indicates that P is effective to form a high concentration shallow diffusion layer.

When the diffusion conditions are changed, FIG. 42B indicates that P can be doped at a high concentration to a relatively deep position at 1050° C. but to a relatively shallow position at temperatures other than 1050° C. Further, FIG. 42C indicates that under the same conditions, B can be doped to a relatively deep position, as compared with P. Therefore, it is possible to understand that in order to from a shallow diffusion layer of high concentration, it is effective to use P as the impurities.

Figure 43A:
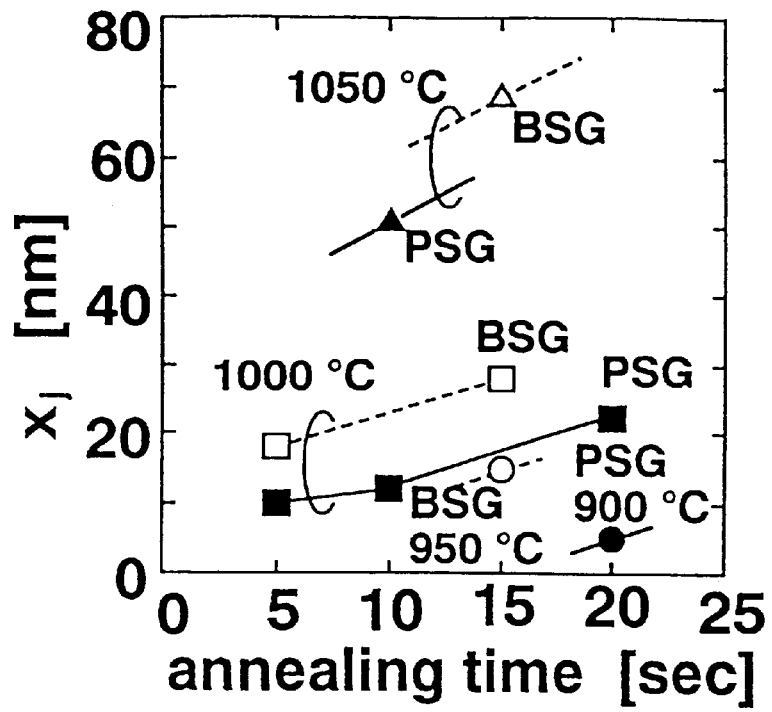
FIGS. 43A and 43B are characteristic graphs showing the relationship between the junction depth ($x_j$), the sheet resistance (ps) and the diffusion heat treatment time.
Figure 43B:
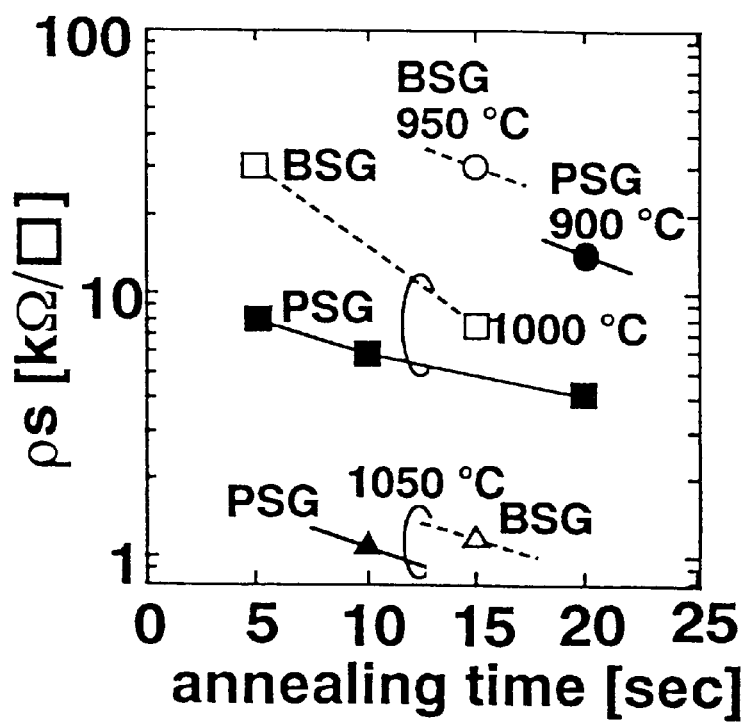

FIGS. 43A and 43B show the characteristics between the heat treatment time and the junction depth ($x_j$), the sheet resistance (ps). Here, the heat treatment temperature is between 950° C. and 1050° C., and the heat treatment time is 20 sec or shorter. Further, the junction depth is defined as a depth at which the impurity concentration becomes $1 \times 10^{18} \text{cm}^{-3}$.

The reason that the above-mentioned differences occur can be explained by the segregation coefficient of impurities at the interface between the silicon and the silicon oxide film. In the case where a substance C is contained in both substances A and B in contact each other, a ratio γ of a concentration α of C in A to a concentration β of C in B under thermal equilibrium conditions becomes a constant value determined by only A, B and C and the temperature, irrespective of the concentrations α and β. This constant value γ is referred to as a segregation coefficient of C.

That is, in the interface between the silicon and the silicon oxide film, the segregation coefficient of P is more than 1, but that of B is less than 1. Therefore, as shown in FIGS. 42A to 42C, in the interface between the silicon and the silicon oxide film, the concentration of P is high on the silicon side, but that of B is high on the silicon oxide film side. As a result, when the source and drain diffusion layer regions are formed by solid phase diffusion, as far as P is used as the diffused impurity, a shallow diffusion layer of extremely high concentration can be formed, so that it is possible to form a miniaturized MOSFET of extremely high current drive capability.

Further, under the conditions from 1000° C. and 20 sec or shorter (in the direction to lower temperature and shorter time) to 950° C. and 5 sec or longer, it is possible to determine the P concentration to be $10^{20} \text{cm}^{-3}$ or more on the substrate surface and $10^{18} \text{cm}^{-3}$ or less at the depth of 22 nm from the substrate surface. Therefore, it is possible to reduce the sheet resistance (10 kΩ/□ or less) low enough to obtain a sufficiently high current drive capability in the diffusion region and further to increase the depth of the diffusion layer shallow enough to suppress the short channel effect. In addition, when the P concentration is determined to be $10^{21} \text{cm}^{-3}$ or more on the substrate surface and $10^{18} \text{cm}^{-3}$ or less at the depth of 12 nm from the substrate surface, it is possible to form a more shallower diffusion layer of more higher concentration, which is more desirable.

FIG. 44 shows the characteristics of the dependency of the saturated current value Id upon the gate length Lg and FIG. 45 shows the characteristics of the dependency of the mutual conductance gm upon the gate length Lg. FIGS. 44 and 45 indicate that when the heat treatment temperature for solid phase diffusion is 950° C. or less, even if the gate length is shortened, the saturated current and further the mutual conductance cannot be both increased, so that it is impossible to improve the current drive capability. However, when the heat treatment temperature for solid phase diffusion exceeds 950° C., an increase in the saturated current and the mutual conductance can be both recognized. In particular, when 970° C. or higher, an increase in the saturated current and the mutual conductance can be both securely recognized.

Figure 46:
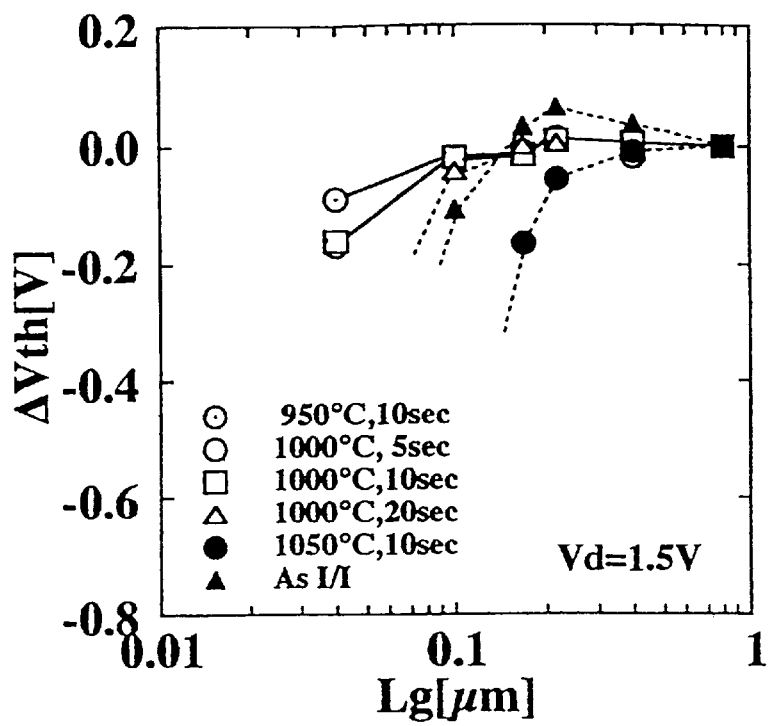
FIG. 46 is a characteristic graph showing the dependency of the threshold voltage ΔVth upon the gate length.
Figure 47:
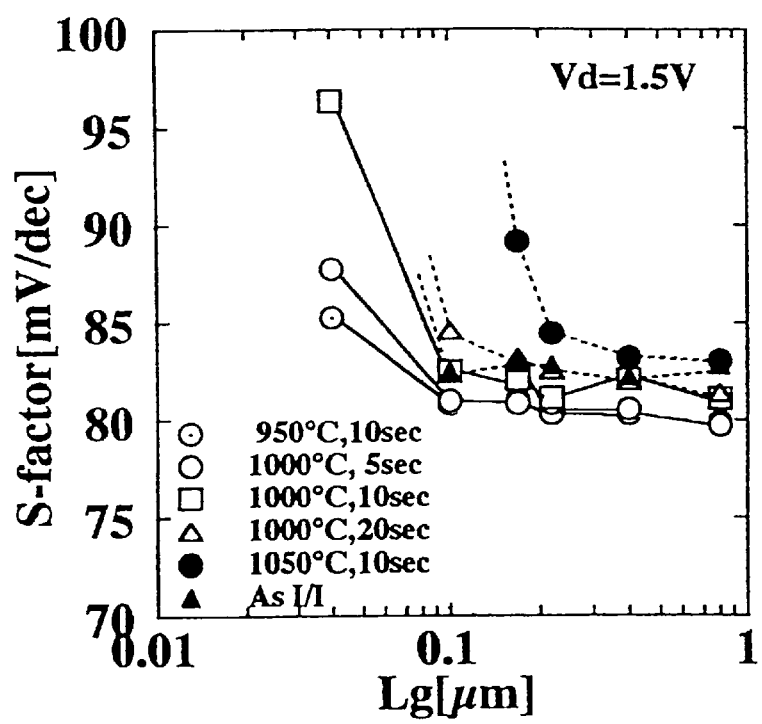
FIG. 47 is a characteristic graph showing the dependency of the S factor upon the gate length.

FIG. 46 shows the characteristics of the dependency of the threshold value ΔVth upon the gate length, and FIG. 47 shows the characteristics of the dependency of the S factor upon the gate length. FIGS. 46 and 47 indicate that when the gate length is 0.1 μm or less, the transistor operation cannot be obtained due to punch through at the heat treatment temperature 1050° C. or more. Further, when the heat treatment temperature of the solid phase diffusion is lower than 1050° C., the transistor operation can be recognized to some extent. However, when the heat treatment temperature is 1020° C. or lower, the transistor operation can be recognized securely.

When the solid phase diffusion is made under the above-mentioned conditions, the short channel effect can be suppressed effectively. As a result, as understood with reference to FIGS. 48A to 48D, the dispersion of the threshold voltage Vth can be reduced, as compared with the conventional elements of LDD structure.

As shown in FIGS. 44 to 47, in order to realize a miniaturized N-channel MOSFET of gate length 0.1 μm or less and of high current drive capability, it is necessary that the heat treatment temperature for solid phase diffusion lies in a range between 950° C. and 1050° C., and more preferably in a range from 970° C. to 1020° C. Further, when the heat treatment for solid phase diffusion is effected within the above-mentioned temperature range, when the heat treatment time is 20 sec or shorter in particular, it is possible to obtain an N-channel MOSFET excellent both in the short channel depression and the high current drive capability.

Figures 49, 50:
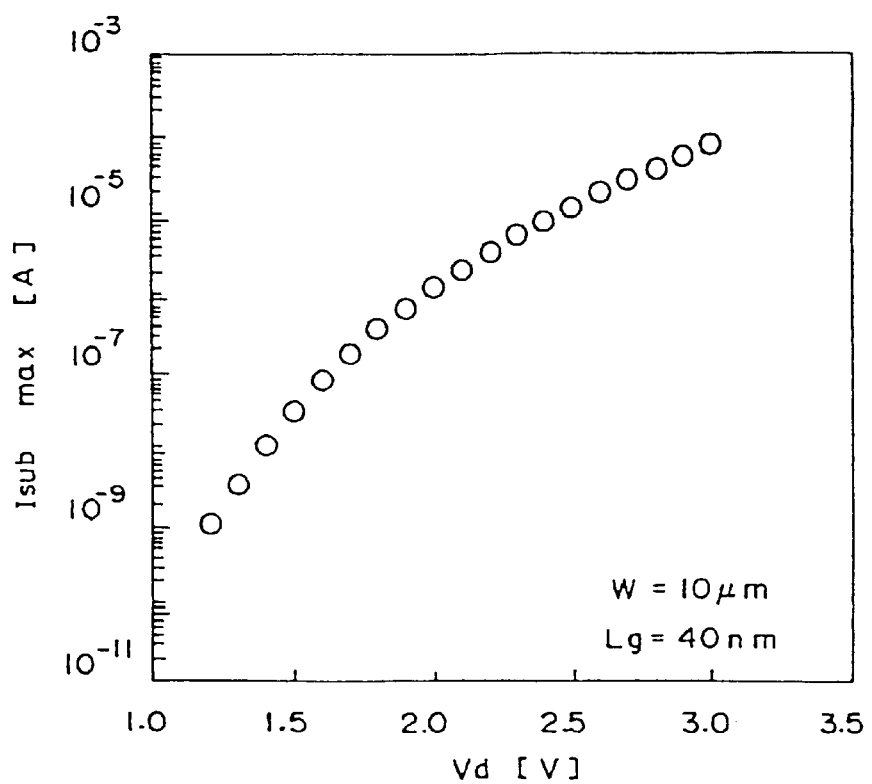
FIG. 49 is a characteristic table showing the dependency of the junction depth $x_j$ and the effective channel length $L_{eff}$ upon the heat treatment conditions.
FIG. 50 is a characteristic graph showing the dependency of the substrate current upon the drain voltage.

FIG. 49 shows a table representative of the dependency of the junction depth $x_j$ and the effective channel length $L_{eff}$ upon the heat treatment conditions. Under due consideration of the combination of $x_j$ and $L_{eff}$ shown in FIG. 49 and further the characteristics shown in FIGS. 46 and 47, the relationship between the combination of $x_j$ and $L_{eff}$ and thee transistor operation has been examined and the following results have been obtained to obtain operative transistors:

Operative combinations:
$x_j$=10 nm, $L_{eff}$=25 nm
$x_j$=10 nm, $L_{eff}$=85 nm
$x_j$=12 nm, $L_{eff}$=23 nm
$x_j$=12 nm, $L_{eff}$=83 nm
$x_j$=22 nm, $L_{eff}$=69 nm
$x_j$=45 nm, $L_{eff}$=37 nm
Inoperative combinations:
$x_j$=20 nm, $L_{eff}$=9 nm
$x_j$=51 nm, $L_{eff}$=29 nm As a result, the operative transistor conditions must be determined within a range which satisfies the following relationship:

$$L_{eff} > 0.69\ x_j - 6.17$$

Further, the elements can be further miniaturized, by reducing the junction depth $x_j$ to suppress the short channel effect and by sufficiently shortening the effective channel length $L_{eff}$ within the range which can satisfy the above-mentioned formula.

Figure 51:
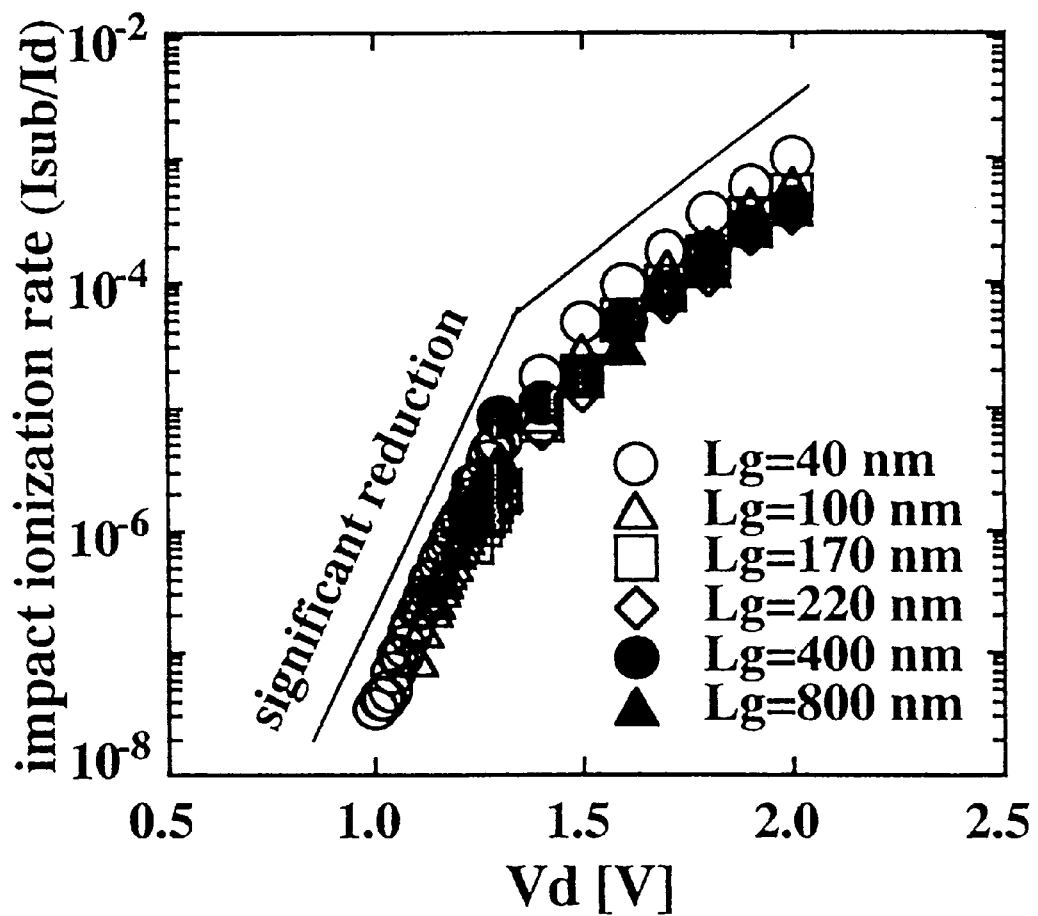
FIG. 51 is a characteristic graph showing the relationship between the impact ionization rate and the drain voltage.

FIG. 50 shows the characteristics of the dependency of the substrate current upon the drain voltage. FIG. 50 indicates that in the MOSFET shown in FIG. 37, when a voltage less than 3 V is applied between the source and the drain, the substrate current can be reduced as small as to be negligible at the drain voltage 1.5 V or lower. This can be applied to the impact ionization rate shown in FIG. 51. Further, as shown in FIG. 52, the generation of hot carriers is not increased violently even if the gate length decreases. In other words, it is possible to reduce the generation of hot carriers to such an extent as to be negligible. For instance, in the case of the MOSFET with a gate length of 40 nm, when the supply voltage is set to 1.5 V or less, even if current is kept passed at the gate voltage at which the substrate current becomes maximum, it is possible to suppress the deterioration rate of the drain current less than 10% in 10 years.

FIG. 53 shows the characteristics of the dependency of the drain current deterioration rate upon the stress time. FIG. 53 indicates that the deterioration due to stress decreases with decreasing drain voltage.

FIG. 54 shows the characteristics of the dependency of the drain current deterioration rate upon the substrate current. FIG. 54 indicates that the deterioration decreases with decreasing substrate current.

As already explained, FIG. 54 indicates that when the supply voltage is determined to 1.5 V or lower as already explained, the deterioration of the element can be extremely reduced.

Further, the present invention is not limited to only the above-mentioned embodiments. For instance, in the above-mentioned embodiment, the PSG film is formed on the gate side walls for solid phase diffusion. Without being limited to only the PSG film, any insulating film containing phosphorus can be used. Further, without being limited to only phosphorus, any insulating film containing elements of III group can be used in the case of PMOS, and any insulating film containing elements of V group can be used in the case of NMOS.

Further, the heat treatment temperature for solid phase diffusion is not limited to only 1000° C., any temperature is determined appropriately within the range between 950° C. and 1050° C. Further, the present invention can be of course applied to the MIS structure formed with another gate insulating film, instead of gate oxide film. Further, various modifications can be made without departing from the spirit of the scope of the gist of the present invention.

As described above, in the semiconductor device according to the present invention, the source and drain diffusion layer regions of a MOS transistor can be formed by diffusing phosphorus by solid phase diffusion. In addition, owing the optimization of the sheet resistance of the diffusion layer regions, the optimization of the relationship between the junction depth $x_j$ of the source and drain diffusion layer regions and the effective channel length $L_{eff}$ and the optimization of the heat treatment temperature for solid phase diffusion, it is possible to realize semiconductor devices which can suppress the short channel effect in the MOSFET and further can improve the current drive capability.

What is claimed is:

1. A MOS type semiconductor device having a gate on a semiconductor substrate and source and drain diffusion layers in the semiconductor substrate, and a solid phase diffusion source layer for forming a part of the source and drain diffusion layers, said solid phase diffusion source layer being provided at side walls of the gate, respectively, wherein a gate length is within a range of 23 to 170 nm, and a relationship between a junction depth ($x_j$) nm of the source and drain diffusion layers in the vicinity of a channel and an effective channel length $L_{eff}$ nm is determined as $$L_{eff} > 0.69\ x_j - 6.17.$$

2. The MOS type semiconductor device according to claim 1, wherein said solid phase diffusion source layer is an oxide film doped with diffusion source ions.

3. The MOS type semiconductor device according to claim 1, wherein a concentration of impurities in the source and drain region layers on a surface of said substrate is $10^{20}$ cm$^{-3}$ or more.

4. A MOS type semiconductor device having a gate via a gate insulating film on a semiconductor substrate and having source and drain diffusion layers in the semiconductor substrate, and a solid phase diffusion source layer for forming a part of the source and drain diffusion layers, said solid phase diffusion source layer being provided at side walls of the gate, respectively, wherein a gate length is within a range between 23 to 70 nm, a gate insulating film thickness is 2.5 nm or more, and a junction depth of the source and drain diffusion layers in the vicinity of a channel is within a range between 10 to 22 nm.

5. The MOS type semiconductor device according to claim 4, wherein said solid phase diffusion source layer is an oxide film doped with diffusion source ions.

6. The MOS type semiconductor device according to claim 4, wherein a concentration of impurities in the source and drain region layers on a surface of said substrate is $10^{20}$ cm$^{-3}$ or more.

7. A MOS type semiconductor device having a gate via a gate insulating film on a semiconductor substrate, and having source and drain diffusion layers in the semiconductor substrate, and a solid phase diffusion source layer for forming a part of the source and drain diffusion layers, said solid phase diffusion source layer being provided at side walls of the gate, respectively, wherein a gate length is within a range between 23 to 70 nm, and means for supplying a voltage of 1.5 V or less across the source and the drain is provided.

8. The MOS type semiconductor device according to claim 7, wherein said solid phase diffusion source layer is an oxide film doped with diffusion source ions.

9. The MOS type semiconductor device according to claim 7, wherein a concentration of impurities in the source and drain region layers on a surface of said substrate is $10^{20}$ cm$^{-3}$ or more.

* * * * *